United States Patent
Maekawa

(10) Patent No.: US 7,223,641 B2
(45) Date of Patent: May 29, 2007

(54) SEMICONDUCTOR DEVICE, METHOD FOR MANUFACTURING THE SAME, LIQUID CRYSTAL TELEVISION AND EL TELEVISION

(75) Inventor: Shinji Maekawa, Kanagawa (JP)

(73) Assignee: Semiconductor Energy Laboratory Co., Ltd., Kangawa-ken (JP)

( * ) Notice: Subject to any disclaimer, the term of this patent is extended or adjusted under 35 U.S.C. 154(b) by 49 days.

(21) Appl. No.: 11/074,671

(22) Filed: Mar. 9, 2005

(65) Prior Publication Data

US 2005/0214983 A1   Sep. 29, 2005

(30) Foreign Application Priority Data

Mar. 26, 2004   (JP)   ............................ 2004-0912230

(51) Int. Cl.
| | |
|---|---|
| H01L 21/84 | (2006.01) |
| H01L 21/00 | (2006.01) |
| H01L 21/8242 | (2006.01) |
| H01L 21/8238 | (2006.01) |
| H01L 21/425 | (2006.01) |

(52) U.S. Cl. .................. 438/149; 438/253; 438/45; 438/200; 438/158; 438/527; 257/410; 257/411; 257/412; 257/415; 257/324; 257/E21.13; 257/E21.178; 349/46; 349/120; 349/140; 349/150

(58) Field of Classification Search ............. 438/149, 438/253, 45, 200, 158, 527; 257/410–412, 257/415, 324; 349/46, 120, 140, 150
See application file for complete search history.

(56) References Cited

U.S. PATENT DOCUMENTS

| | | | | |
|---|---|---|---|---|
| 5,883,682 | A * | 3/1999 | Kim et al. | ................ 349/43 |
| 6,416,583 | B1 | 7/2002 | Kitano et al. | |
| 6,426,595 | B1 | 7/2002 | Odake et al. | |
| 6,555,420 | B1 | 4/2003 | Yamazaki | |
| 6,587,165 | B2 | 7/2003 | Hashimoto et al. | |
| 6,627,263 | B2 | 9/2003 | Kitano et al. | |
| 6,630,274 | B1 | 10/2003 | Kiguchi et al. | |
| 6,787,407 | B2 | 9/2004 | Nakamura et al. | |
| 6,821,827 | B2 | 11/2004 | Nakamura et al. | |
| 6,891,236 | B1 * | 5/2005 | Yamazaki | ................ 257/410 |
| 6,908,796 | B2 | 6/2005 | Furusawa | |

(Continued)

FOREIGN PATENT DOCUMENTS

EP   1 061 383 A1   12/2000

(Continued)

*Primary Examiner*—Michael Lebentritt
*Assistant Examiner*—Mohsen Ahmadi
(74) *Attorney, Agent, or Firm*—Nixon Peabody LLP; Jeffrey L. Costellia

(57) ABSTRACT

A method for manufacturing a semiconductor device by a small number of processes and by a means with high usability of materials to have high-definition and a gate insulating with a high step coverage property is disclosed. According to the present invention, a method for manufacturing a semiconductor device comprises the steps of forming a plurality of first conductive layers over a substrate; forming a first insulating layer to fill the gaps of the plurality of the first conductive layers; forming a second insulating layer over the first insulating layer and the plurality of the first conductive layers; and forming a semiconductor region and a second conductive layer over the second insulating layer.

12 Claims, 39 Drawing Sheets

U.S. PATENT DOCUMENTS

| | | |
|---|---|---|
| 6,911,675 B2 * | 6/2005 | Kato et al. .................. 257/86 |
| 6,952,036 B2 | 10/2005 | Suzuki et al. |
| 6,994,414 B2 | 2/2006 | Hashimoto et al. |
| 2001/0034088 A1 | 10/2001 | Nakamura et al. |
| 2002/0053881 A1 | 5/2002 | Odake et al. |
| 2002/0089616 A1 | 7/2002 | Hashimoto et al. |
| 2002/0136829 A1 | 9/2002 | Kitano et al. |
| 2003/0083203 A1 | 5/2003 | Hashimoto et al. |
| 2003/0143794 A1 | 7/2003 | Nakamura et al. |
| 2003/0219934 A1 * | 11/2003 | Furusawa .................. 438/158 |
| 2004/0038138 A1 | 2/2004 | Kiguchi et al. |
| 2004/0113161 A1 | 6/2004 | Suzuki et al. |
| 2005/0054181 A1 | 3/2005 | Nakamura et al. |
| 2005/0250262 A1 | 11/2005 | Suzuki et al. |

FOREIGN PATENT DOCUMENTS

| | | |
|---|---|---|
| EP | 1 180 716 A2 | 2/2002 |
| EP | 1 369 928 A1 | 12/2003 |
| JP | 03-085530 | 4/1991 |
| JP | 03-159174 | 7/1991 |
| JP | 06-163584 | 6/1994 |
| JP | 07-333648 | 12/1995 |
| JP | 10-056193 | 2/1998 |
| JP | 10-170960 | 6/1998 |
| JP | 10-209463 | 8/1998 |
| JP | 11-251259 | 9/1999 |
| JP | 11-326951 | 11/1999 |
| JP | 2000-150906 | 5/2000 |
| JP | 2003-133691 | 5/2003 |
| JP | 2003-317945 | 11/2003 |
| JP | 2003-318193 | 11/2003 |
| JP | 2003-318401 | 11/2003 |

\* cited by examiner

SEMICONDUCTOR DEVICE, METHOD FOR MANUFACTURING THE SAME, LIQUID CRYSTAL TELEVISION AND EL TELEVISION

BACKGROUND OF THE INVENTION

1. Field of the Invention

The present invention relates to a semiconductor device formed by droplet discharging as typified by an ink jetting method, and a method for manufacturing the semiconductor device.

2. Related Art

Conventionally, a so-called active matrix driving display panel or a semiconductor integrated circuit, each of which is composed of a semiconductor element as typified by a thin film transistor (hereinafter, TFT) over a glass substrate, is manufactured by patterning a various kinds of thin films by a light exposure process using a photomask (hereinafter, photolithography process).

By the photolithography process, resist is coated allover the surface of a substrate to be pre-baked, and an ultraviolet ray or the like is emitted thereto via a photomask, then, a resist pattern is formed by developing. Thereafter, a thin film (that is formed by a semiconductor material, an insulating material, or a conducting material) presented in a portion to be a film pattern is etched off by using the resist pattern as a mask pattern, and the thin film is patterned to form a film pattern, then, a semiconductor element is formed.

On the other hand, a bottom gate TFT is used as a driver element of a pixel of a liquid crystal display. In the bottom gate TFT, a gate electrode has a tapered portion at its edge portion to prevent electric field concentration at the vicinity of the edge portion of the gate electrode in a gate insulating film that overlaps with the gate electrode. Further, a tapered portion is provided to the gate electrode to improve step coverage of the gate insulating film provided over the gate electrode (Unexamined Patent Publication No. 10-170960).

However, in order to form a gate electrode having a tapered portion, processes of etching, cleaning, and drying are required to be repeated at plurality of times in addition to the photolithography process. Therefore, there have been problems that most materials for the gate electrode and the resist are wasted, and throughput becomes deteriorated since a large number of processes for forming the resist mask pattern and the gate electrode is required in a manufacturing process of a semiconductor device.

It is difficult for an exposure device used for the photolithography process to perform exposure processing of a large substrate at once. Therefore, a manufacturing method of a semiconductor device using a large substrate has problems that exposure processing is required to be performed at a plurality of times and manufacturing yields are deteriorated due to a mismatch between adjacent patterns.

SUMMARY OF THE INVENTION

In view of the foregoing, it is an object of the present invention to provide a method for manufacturing a semiconductor device by a small number of processes and by a means by which high usability of materials is realized.

It is another object of the present invention to provide a method for manufacturing a semiconductor device with high resist pressure that has a gate insulating film with high step coverage, moreover, to provide a liquid crystal television, and an EL television, each of which has the foregoing semiconductor device.

According to one aspect of the present invention, a plurality of conductive layers is formed over a substrate, and an insulating layer is formed to fill the gaps of the conductive layers.

According to another aspect of the present invention, a plurality of conductive layers is formed over a substrate, a first insulating layer is formed to fill the gaps of the conductive layers, and a second insulating layer is formed over the plurality of the conductive layers and the first insulating layer that fills the gaps of the conductive layers.

According to further another aspect of the present invention, a plurality of conductive layers is formed over a substrate, a first insulating layer is formed to fill the gaps of the conductive layers, and a second insulating layer is formed over a part of the plurality of the conductive layers and a part of the first insulating layer adjacent to the conductive layers.

According to the present invention, a method for manufacturing a semiconductor device comprises the steps of forming a plurality of first conductive layers over a substrate; forming a first insulating layer to fill the gaps of the plurality of the first conductive layers; forming a second insulating layer over the first insulating layer and the plurality of the first conductive layers; and forming a semiconductor region and a second conductive layer over the second insulating layer.

According to the present invention, a method for manufacturing a semiconductor device comprises the steps of forming a plurality of first conductive layers over a substrate; forming first insulating layer to cover a side of the plurality of the first conductive layers; forming a second insulating layer over the first insulating layer and the plurality of the first conductive layers; and forming a semiconductor region and a second conductive layer over the second insulating layer.

According to the present invention, a method for manufacturing a semiconductor device comprises the steps of forming a plurality of first conductive layers over a substrate; forming a first insulating layer by discharging an insulating material between the plurality of the first conductive layers; forming a second insulating layer over the first insulating layer and the plurality of the first conductive layers; and forming a semiconductor region and a second conductive layer over the second insulating layer.

A so-called bottom gate TFT in which the first conductive layers serve as gate electrodes, the second insulating layer serves as a gate insulating film, and the second conductive layer serves as a source electrode and a drain electrode is formed. A source region and a drain region may be formed between the semiconductor region and the second conductive layer.

A so-called top gate TFT in which the first conductive layers serve as a source electrode and a drain electrode, the second insulating layer serves as a gate insulating film, and the second conductive layer serves as a gate electrode is formed. A source region and a drain region may be formed between the second conductive layer and the semiconductor region.

According to the present invention, a method for manufacturing a semiconductor device comprises the steps of forming a plurality of first conductive layers over a substrate; forming a first insulating layer by discharging an insulating material between the plurality of the first conductive layers; forming a second insulating layer over a part of the first insulating layer and a part of the plurality of the first conductive layers; and forming a semiconductor region over the second insulating layer and the first conductive layer.

A so-called bottom gate coplanar TFT in which the first conductive layers serve as a gate electrode, a source electrode, and a drain electrode; and the second insulating layer serves as a gate insulating film is formed. A source region and a drain region may be formed between a semiconductor region and the source and the drain electrode.

According to the present invention, a semiconductor device comprises a plurality of first conductive layers formed over an insulating surface; a first insulating layer formed between the plurality of the first conductive layers; a second insulating layer formed on a surface of the plurality of the first conductive layers and the first insulating layer; a semiconductor region formed over the second insulating layer; and a second conductive layer provided over the semiconductor region; wherein the semiconductor region has a first region that overlaps with the first conductive layers, first insulating layer, and the second insulating layer; and a second region that overlaps with the first conductive layers and the second insulating layer.

In the case that thicknesses of the first conductive layers are larger than that of the first insulating layer, a ratio b/a (b<a) between a thickness b of the first insulating layer and thicknesses a of the first conductive layers is 0.7 or more and 1 or less.

In the case that the thicknesses of the first conductive layers are smaller than that of the first insulating layer, the difference in a thickness b–a between the first insulating layer and the first conductive layers is smaller than that of the thickness c of the second insulating layer, that is, the relation of 0<b–a<c (b<a) is satisfied.

The first insulating layer may be swelled along with the side of the first conductive layers. That is, the first insulating layer is formed to be a concave shape with respect to the insulating surface.

On the other hand, a region of the first insulating layer that is in contact with the first conductive layers may have a dent with the side of the first conductive layer. That is, the first insulating layer is formed to be a convex shape with respect to the insulating surface.

Further, a contact angle of the first conductive layer against the insulating surface is 70° or more and 135 or less.

In the present invention, as a semiconductor device, an integrated circuit, a display device, a wireless tag, an IC tag, and the like, each of which is composed of a semiconductor element can be nominated. As the display device, a liquid crystal display device, a light-emitting display device, a DMD (Digital Micromirror Device), a PDP (Plasma Display Panel), an FED (Field Emission Display), and an electrophoretic display device (electronic paper), and the like can be typically nominated. The TFT is a forward staggered TFT, a reverse staggered TFT (channel etch TFT or channel protective TFT), a coplanar TFT of a bottom gate TFT, or the like.

As used herein, the term "display device" refers to a device using a display element, that is, an image display device. Further, a module attached with a connector such as FPC (Flexible Printed Circuit), TAB (Tape Automated Bonding), or TCP (Tape Carrier Package); a module having the TAB or the TCP mounted with a printed wiring board on its tip; and a module installed directly with IC (Integrated Circuit) by COG (Chip On Glass) are all included in the display device.

According to the present invention, a liquid crystal television or an EL television, each of which is composed of the foregoing semiconductor device, is provided.

According to the present invention, filling the gaps of a plurality of the conductive layers by the insulating layer can reduce irregularities of the gate insulating film formed over the insulating layer, and so step coverage can be improved. Therefore, step cut over conductive edges can be prevented, and manufacturing yields of the semiconductor device having the conducive layer and the gate insulating film can be improved.

Since the semiconductor device according to the present invention can increase the uniformity of the thickness of the gate insulating layer, the resistance to pressure of the gate insulating film can be improved and the reliability of the semiconductor device can also be improved.

The gate insulating film having high step coverage and high resistance to pressure can be formed without forming a gate electrode having a tapered portion, the way of which can be applied to various kinds of processes.

By forming the insulating film that fills the gaps of a plurality of the conductive layers by droplet discharging, droplets can be dropped to a predetermined place by varying the relative positions of a substrate and a nozzle that is a discharge opening of the droplets containing a material of these films. The relative relationship among a nozzle diameter, a discharge rate of a droplet, and movement speed of the nozzle and the substrate discharged with the droplets can adjust the thickness or the width of a pattern to be formed. Therefore, an insulating film can be formed by discharging with high accuracy at a desired place even when a large substrate with a side of 1 to 2 m or more is used. Further, the number of manufacturing processes can be reduced, the throughput can be increased, and the cost can be reduced since the insulating layer can be formed at a predetermined place without using a photolithography process.

Moreover, a liquid crystal television and an EL television having the semiconductor device manufactured by the foregoing processes can be manufactured at low costs with high throughput and high manufacturing yields.

These and other objects, features and advantages of the present invention will become more apparent upon reading of the following detailed description along with the accompanied drawings.

DESCRIPTION OF THE INVENTION

Embodiment 1

In this embodiment, a semiconductor device, which includes an insulating layer for filling between a plurality of conductive layers, and which has lower height than that of the conductive layers, and a manufacturing process of the semiconductor device are explained with reference to FIGS. 1A to 1E, 4A, 4B, 7A, and 39A. In this embodiment, a channel etch TFT is used in a bottom gate TFT as a semiconductor device.

Figure 1A:
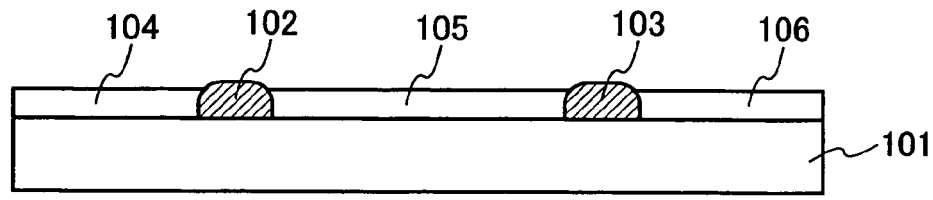
FIGS. 1A to 1E are explanatory cross-sectional views for showing a manufacturing process of a semiconductor device according to the present invention.

As illustrated in FIG. 1A, a plurality of first conductive layers 102, 103 is formed over a substrate 101, and first insulating layers 104 to 106 are formed to fill between the plurality of the first conductive layers 102, 103.

As the substrate 101, a substrate made from an insulating substance such as glass, quartz, or alumina; a plastic substrate having heat resistance that can resist processing temperature in the following process; a silicon wafer, a metal plate, or the like can be used. In this instance, an insulating film for preventing impurities from dispersing from the substrate is preferably provided such as silicon oxide (SiOx), silicon nitride (SiNx), silicon oxynitride (SiOxNy) (x>y), or silicon nitride oxide (SiNxOy) (x>y). Alternatively, a substrate that is prepared by forming an insulating film such as silicon oxide or silicon nitride over the surface of a metal substrate such as stainless or a semiconductor substrate can be used. In the case that the substrate 101 is a glass substrate, a large substrate of 320×400 mm, 370×470 mm, 550×650 mm, 600×720 mm, 680×880 mm, 1000×1200 mm, 1100×1250 mm, or 1150×1300 mm can be used. In this instance, a glass substrate is used as the substrate 101.

In the case that a plastic substrate is used as the substrate 101, PC (polycarbonate), PES (poly(ether sulfone)), PET (poly(ethylene terephthalate)), or PEN (poly(ethylene naphthalate)), each of which has a comparative high glass transition point, is used.

As a material for the first conducive layers 102, 103, a material having a conducting property is used. The first conducive layers 102, 103 are formed by droplet discharging, printing, electroplating, PVD (physical vapor deposition), CVD (chemical vapor deposition), vapor deposition, or the like. In the case of using the PVD, the CVD, vapor deposition, or the like, the first conducive layers 102, 103 are etched in a desired shape after depositing by the foregoing methods.

As the material having a conducting property, metal such as Ag, Au, Cu, Ni, Pt, Pd, Ir, Rh, W, Al, Ta, Mo, Cd, Zn, Fe, Ti, Si, Ge, Zr, or Ba; indium tin oxide (ITO), zinc oxide (ZnO), indium zinc oxide (IZO), zinc oxide doped with gallium (GZO), indium tin oxide containing silicon oxide, organic indium, organic tin, each of which is used as a transparent conductive film; titanium nitride (TiN); or the like is appropriately used. Alternatively, a conductive layer made from these materials may be stacked as the first conducive layers 102, 103.

In the case that the first conductive layer is formed by droplet discharging, a conductor dissolved or dispersed in solvent is used as a composite for discharging from a discharge opening. As the conductor, metal of the foregoing material having a conducting property, silver halide fine particles, or dispersing nanoparticles can be used.

As the composition discharged from a discharge opening, any one of gold, silver, and copper dissolved or dispersed in solvent in consideration of a specific resistance value is preferably used. Further preferably, silver or copper which is low resistant and inexpensive is used. In the case of using copper, a barrier film may be additionally provided to prevent contamination due to impurities. As the solvent, organic solvent, for example, esters such as butyl acetate and ethyl acetate, alcohols such as isopropyl alcohol and ethyl alcohol, methyl ethyl ketone, or acetone may be used.

As the barrier film in the case of using copper as a wiring, an insulating or conductive material containing nitrogen such as silicon nitride, silicon oxynitride, aluminum nitride, titanium nitride, or tantalum nitride may be preferably used to be formed by droplet discharging.

The composition used for droplet discharging has preferably viscosity of from 5 to 20 mPa·s since the composition can be prevented from drying and the composition can be smoothly discharged from a discharge opening. Further, the composition has preferably the surface tension of 40 mN/m or less. The viscosity and the like of the composition may be appropriately adjusted in accordance with solvent or purposes. As an example, a composition prepared by dissolving or dispersing ITO, ZnO, IZO, GZO, indium tin oxide containing silicon oxide, organic indium, or organic tin in solvent has viscosity of from 5 to 50 mPa·s, a composition prepared by dissolving or dispersing silver in solvent has viscosity of from 5 to 20 mPa·s, and a composition prepared by dissolving or dispersing gold in solvent has viscosity of from 10 to 20 mPa·s.

The diameter of a particle of the conductor is preferably as small as possible, for example, 0.1 μm or less, for the purpose of preventing a nozzle from clogging and manufacturing a high-definition pattern, although it depends on the diameter of each nozzle, a desired shape of a pattern, and the like. The composition is formed by a known method such as an electrolyzing method, an atomizing method, or a wet reducing method to have generally a particle size of approximately from 0.5 to 10 μm. Note that, in the case of forming the composition by a gas evaporation method, the nanoparticles protected by dispersant have fine grain diameters of approximately 7 nm. In addition, in the case that the nanoparticles are each protected by a cladding material, the nanoparticles are dispersed stably at room temperature without aggregation in solution and behave similarly to liquid. Therefore, the cladding material is preferably used.

The process of discharging a composition may be performed under reduced pressure since the solvent of the composition is evaporated during a period during which the composition is discharged to land on a subject. Accordingly, later processes of drying and baking can be omitted or shortened. After discharging the solution, either or both processes of drying and baking is/are performed at normal pressure or under reduced pressure depending on the material of the solution by laser light irradiation, rapid thermal annealing, a heating furnace, or the like. Each process of drying and baking is a process of heat treatment. For example, a drying process is performed for three minutes at 100° C., whereas a baking process is performed for from 15 to 120 minutes at temperature of from 200 to 350° C., each of which has a different purpose, temperature, and period. In order to perform favorably the processes of drying and baking, the substrate may be heated to from 100 to 800° C. (preferably, from 200 to 350° C.) though it depends on the material of the substrate. According to the process, fusion and welding are accelerated by evaporating the solvent in the solution, or chemically removing the dispersant to yield hardening and shrinking of a peripheral resin. The processes are performed in the presence of oxygen or nitrogen, or an atmospheric air. The processes are preferably performed in the presence of oxygen where the solvent dissolved or dispersed with metal elements is easily removed. A binder made from an organic matter is left in the conductive layer depending on heating temperature, atmosphere, and time.

In this embodiment, a conductive layer containing silver as its main component is formed by selectively discharging solution dispersed with silver particles of several nm (hereinafter, Ag paste) to be dried and baked as the first conductive layers 102, 103. The first conductive layer is formed by overlapping conductive fine particles irregularly in three-dimension. That is, the first conductive layer is formed by three-dimensional aggregate particles. Therefore, the surface thereof has microscopic irregularities. Due to the temperature and the heating time of the Ag paste, the fine particles are melted to be aggregation formed by the fine particles. The size of the aggregation is increased by the temperature and the heating time of the Ag paste, and so the difference in height of the surface is large. A region where the fine particles are melted may become a polycrystalline structure.

As the first insulating layers 104 to 106, an insulating material is formed to fill the gaps of the plurality of the first conductive layers 102, 103 by droplet discharging, ink jetting, spin coating, roll coating, slot coating, or the like. In the case of using the droplet discharging, the ink jetting, or the like, a material for the first insulating layer is discharged to the predetermined position. In the case of using the spin coating, the roll coating, the slot coating, or the like, the first insulating layer is formed to expose a part of (an upper part of) the first conductive layer by appropriately adjusting the viscosity, the surface tension, or the like of the first material.

As typical examples of a material for the first insulating layers 104 to 106, polyimide, acrylic, novolac resin, melamine resin, phenol resin, epoxy resin, silicon resin, furan resin, and diallyl phthalate resin can be nominated. Alternatively, solution dispersed with fine particles of inorganic oxide, PSG (phosphorous glass), BPSG (boron phosphorous silicon glass), a film, silicate SOG (spin on glass), alkoxysilicate SOG polysilazane SOG, SiO$_2$ having the bond of Si—CH$_3$ as typified by polymethyl siloxane can be used.

Figure 7A:
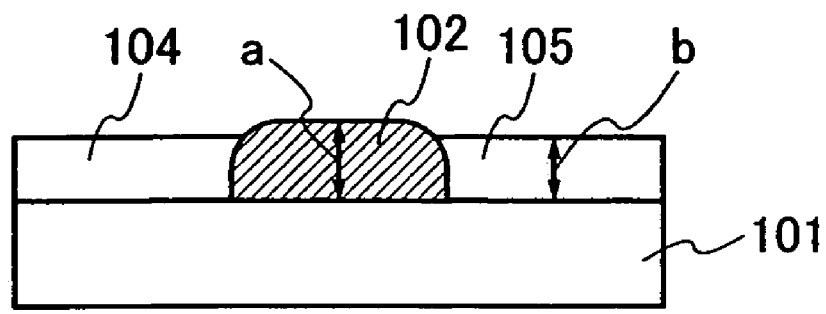
FIGS. 7A and 7B are explanatory cross-sectional views for showing a structure of a semiconductor device according to the present invention.

Here, the shapes of the first insulating layers 104 to 106 are explained with reference to FIGS. 4A, 4B, and 7A. As illustrated in FIG. 7A, the first insulating layers 104 and 105 have thinner thicknesses b than a thickness a of the first conductive layer 102. Typically, ratio of b/a (b<a), that is, the ratio of the thickness b of the first insulating layers 104, 105 to the thickness a of the first conductive layer 102 is preferably 0.7 or more to 1 or less. In the case that the ratio of the thickness b of the first insulating layers 104, 105 to the thickness a of the first conductive layer 102 is within the foregoing range, a second insulating layer can be formed with a few irregularities, uniformity of a film thickness is improved, and step coverage is improved. Therefore, a semiconductor device that has high resist pressure and hardly leakage current can be manufactured with good yields.

The shapes of the insulting layers 104, 105 being in contact with the first conductive layer 102 are explained with reference to FIGS. 4A and 4B. The first insulating layers 104, 105 in FIGS. 1A to 1E are denoted by reference numeral 401, 402, respectively in FIG. 4A; and 411, 412, respectively in FIG. 4B.

Figure 4A:
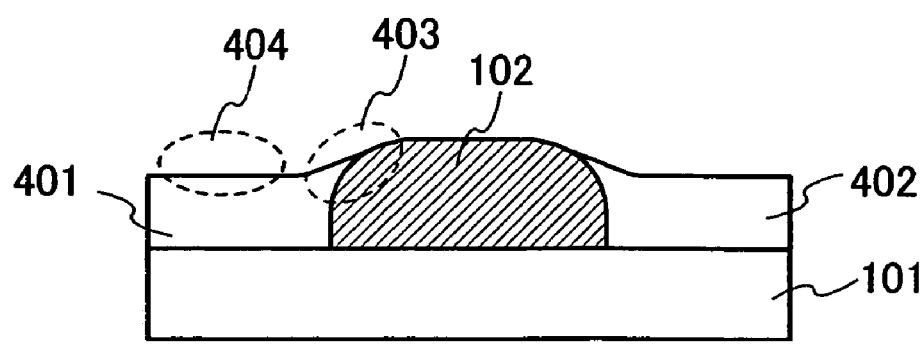
FIGS. 4A and 4B are explanatory cross-sectional views for showing a structure of a first insulating layer of a semiconductor device according to the present invention.

As illustrated in FIG. 4A, the first insulating layers 401, 402 may be swelled along with the side of the first conductive layer 102. That is, a first region 403 of the first insulating layer that is in contact with the first conductive layer 102 is swelled higher than a second region 404 of the first insulating layer that is not in contact with the first conductive layer 102. In other words, the first insulating layers 401, 402 form a concave shape with respect to the surface of the substrate 101. The insulating layers 401, 402 having such the shape can be formed by using an insulating material having comparative low viscosity.

Figure 4B:
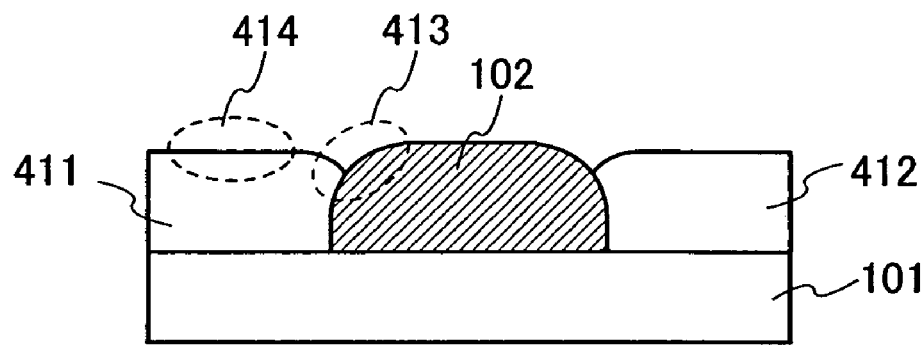

On the other hand, as illustrated in FIG. 4B, a region of the first insulating layers 411, 412 may be depressed at a region being in contact with the first conductive layer 102. That is, a first region 413 of the first insulating layer that is in contact with the first conductive layer 102 is depressed lower than a second region 413 of the first insulating layer that is not in contact with the first conductive layer 102. In other words, the first insulating layers 411, 412 form a convex shape with respect to the substrate 101. The insulating layers 411, 412 having such the shape can be formed by using an insulating material having comparative high viscosity.

Figure 1B:
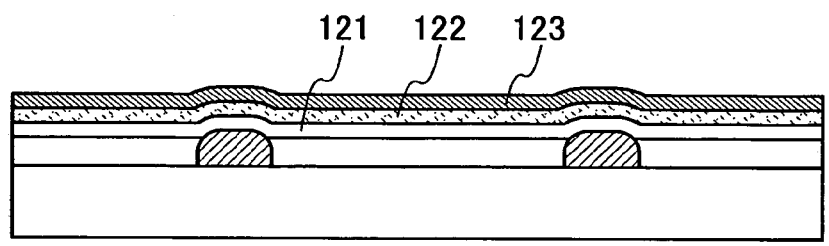

As illustrated in FIG. 1B, a second insulating layer 121 serving as a gate insulating film, a first semiconductor film 122, and a second semiconductor film 123 having a conducting property are formed over the first conductive layers 102, 103, and the first insulating layers 104 to 106.

The second insulating layer 121 is formed by a thin film formation method such as plasma CVD or sputtering to have a single layered or a laminated layered structure including silicon nitride, silicon oxide, or another silicon. Further, the second insulating layer is preferably formed to have a laminated layered structure by stacking a silicon nitride film (silicon nitride oxide film), silicon oxide film, and silicon nitride film (silicon nitride oxide film) from the side being in contact with a gate electrode. The gate electrode is in contact with the silicon nitride film in the structure whereby deterioration due to oxidization can be prevented.

Further, the second insulating layer 121 can be formed by using solution having an insulating property by droplet discharging, coating, sol-gel, or the like. As typical examples of the solution having an insulating property, solution dispersed with fine particles of inorganic oxide, polyimide, polyamide, polyester, acrylic, PSG (phosphorous glass), BPSG (boron phosphorous silicon glass), a film, silicate SOG (spin on glass), alkoxysilicate SOG polysilazane SOG, SiO$_2$ having the bond of Si—CH$_3$ as typified by polymethyl siloxane can be appropriately used.

The first semiconductor film 122 can be formed by a film having a state selected from the group consisting of an amorphous semiconductor, a semiamorphous semiconductor (that may be referred to as SAS) formed by mixing an amorphous state and a crystalline state, a microcrystalline semiconductor in which a crystal grain of 0.5 to 20 nm can be observed in an amorphous semiconductor, and a crystalline semiconductor. The microcrystalline semiconductor in which a crystal grain of 0.5 to 20 nm can be observed is referred to as a microcrystal (μc). As a film containing silicon, silicon germanium (SiGe), or the like as its main components, a semiconductor film with a thickness of 10 to 60 nm can be used.

The SAS has an intermediate structure between an amorphous structure and a crystalline structure (including single crystals and poly crystals). The SAS has a stable third state with respect to free energy, and a crystalline region having a short-range order and lattice distortion. At least a part of the film includes crystal region of 0.5 to 20 nm. In case that SAS includes silicon as its main component, Raman spectrum is shifted to a lower wave number than 520 cm$^{-1}$. By X-ray diffraction, diffraction peaks (111), (220) that may be derived from a silicon crystalline lattice are observed. Hydrogen or halogen of 1 atomic % or more is contained in the SAS as neutralizer for dangling bond.

The SAS can be obtained by glow discharge decomposition of a silicide gas. As a typical example of the silicide gas, SiH$_4$ is nominated. Alternatively, Si$_2$H$_6$, SiH$_2$Cl$_2$, SiHCl$_3$, SiCl$_4$, SiF$_4$, or the like can be used. The SAS can be formed easily by diluting the silicide gas by hydrogen or fluorine; or the hydrogen or fluorine and one or a plurality of rare gas elements selected from the group consisting of helium, argon, krypton, and neon. The silicide gas is preferably diluted with the dilution rate is in the range of from 10 to 1000 times. Alternatively, the SAS can be formed by using Si$_2$H$_6$ and GeF$_4$ to be diluted by a helium gas. The production of a film by reaction by glow discharge decomposition is preferably performed at reduced pressure. An applied voltage is in the range of from 0.1 to 133 Pa. Power for producing glow discharge decomposition may be supplied with high frequency power in the range of from 1 to 120 MHz, preferably, 13 to 60 MHz. A heat temperature for a substrate is 300° C. or less, preferably, 100 to 250° C.

A crystalline semiconductor film can be formed by crystallization of an amorphous semiconductor film or SAS by heating or laser irradiation. Alternatively, the crystalline semiconductor film can be directly formed. In this instance, the crystalline semiconductor film can be directly formed by utilizing heat or plasma with a fluoride gas such as GeF$_4$ or F$_2$; or a silane gas such as SiH$_4$ or Si$_2$H$_6$.

The second semiconductor film 123 has a conducting property. In the case of forming an n-channel type TFT, an element belonging 15 group in the periodic table, typically, phosphorus or arsenic is doped. In the case of forming a p-channel type TFT, an element belonging 13 group in the periodic table, typically, boron is doped. The second semiconductor film 123 is formed by plasma CVD using a silicide gas including a gas that includes an element belonging 13 or 15 group in the periodic table such as boron, phosphorus, or arsenic. Further, a second semiconductor film having a conducting property can be formed by coating solution including an element belonging 13 or 15 group in the periodic table over a semiconductor film to be irradiated with laser light after forming the semiconductor film. As the laser beam, laser beam emitted from a known pulse or continuous oscillation laser is appropriately used.

Figure 1C:
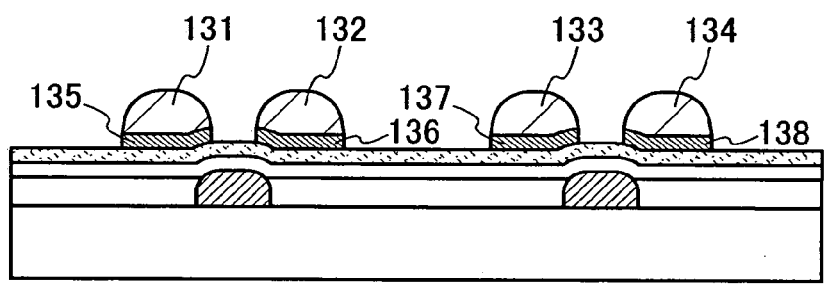

As illustrated in FIG. 1C, first mask patterns 131 to 134 are formed over the semiconductor film 123. The first mask patterns are preferably formed by droplet discharging of a heat resistant high molecular material, which includes an aromatic ring or a cyclic ring as a principle chain, and which includes a high polarity hetero atomic weight with a few aliphatic groups. As typical examples of such the high molecular material, polyimide or polybenzimidazole can be nominated. In the case of using the polyimide, the first mask patterns 131 to 134 can be formed by discharging solution containing polyimide from a discharge opening over the second semiconductor film 123 and baking at 200° C. for 30 minutes.

Further, the first mask patterns can be formed by providing preliminarily a mask pattern having a liquid-shedding surface and coating or discharging a high molecular material to the region that is not covered by the liquid-shedding surface.

Then, second semiconductor film 123 is etched by using the first mask patterns 131 to 134 to form first semiconductor regions (also referred to as a source or drain region, or contact layer) 135 to 138. Thereafter, the first mask patterns are removed.

The second semiconductor film can be etched by using a chloride gas as typified by $Cl_2$, $BCl_3$, $SiCl_4$, or $CCl_4$; a fluoride gas such as $CF_4$, $SF_6$, $NF_3$, or $CHF_3$; or $O_2$.

Figure 1D:
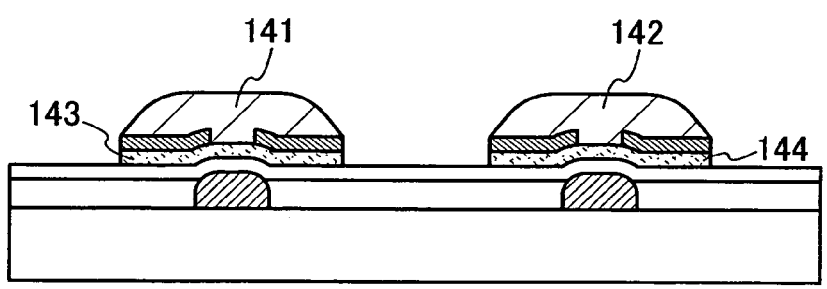

Then, as illustrated in FIG. 1D, second mask patterns 141, 142 are formed over the substrate. The second mask patterns can be formed by using the same material as that of the first mask patterns.

And then, second semiconductor regions (channel formation regions) 143, 144 are formed by etching the first semiconductor film 122 using the second mask patterns 141, 142 as masks. As the etching condition for the first semiconductor film, the etching condition of the second semiconductor film can be used. Thereafter, the second mask patterns are removed by processing using stripper, ashing using oxygen, or the like.

Figure 39A:
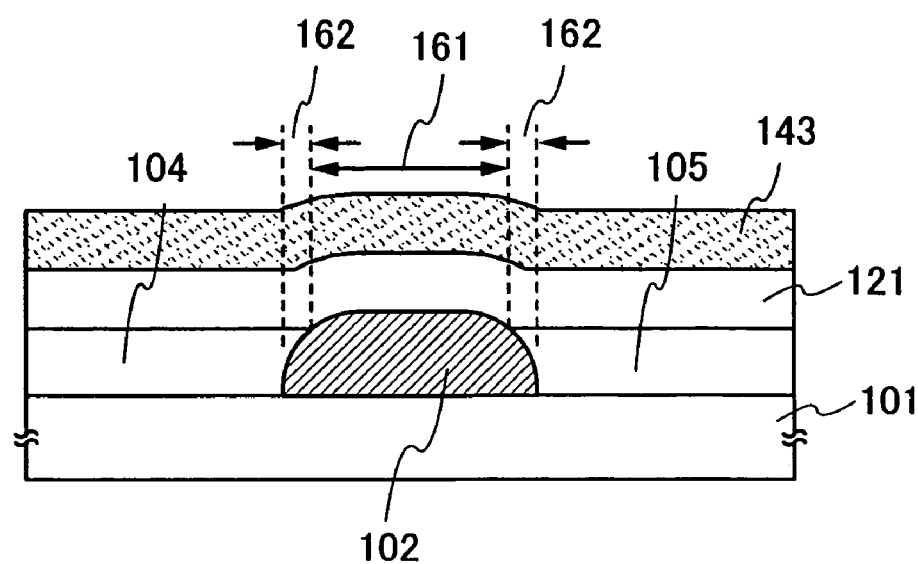
FIGS. 39A and 39B are explanatory cross-sectional views for showing a structure of a semiconductor device according to the present invention.

FIG. 39A is an enlarged view of the vicinity of the second semiconductor region 143 and the first conductive layer 102.

FIG. 39A illustrates a region provided with the first conductive layer 102, the first insulating layers 104, 105 that fill the outside of the first conductive layer 102, the second insulating layer 121, and the second semiconductor region 143. The second semiconductor region 143 includes a region 161 overlapped with the first conductive layer 102 and the second insulating layer 121, and a region 162 that overlaps with the first conductive layer 102, the first insulating layers 104 and 105, and the second insulating layer 121.

That is, the gate insulating film of a TFT according to the present invention includes a region formed by a single layered insulating film and a region formed by a two-layered insulating film.

As illustrated in FIG. 1D, the second semiconductor regions 143, 144 can be formed using an organic semiconductor material by printing, spraying, droplet discharging, or the like. In this instance, the number of processes can be reduced since the foregoing etching process is not required. As the organic semiconductor material used in the present invention, a π-conjugated system high molecular material including a conjugated double bond is preferably used. Typically, a soluble high molecular material such as polythiophene, poly(3-alkylthiophene), polythiophene derivatives, or pentacene can be used.

As another organic semiconductor material that can be used in the present invention, a material that can form a first semiconductor region by being processed after forming a soluble precursor can be used. As the organic material through the precursor, polythienylenevinylene, poly(2,5-thienylenevinylene), polyacetylene, polyacetylene derivatives, polyarylenevinylene, or the like can be used.

When the precursor is converted into an organic semiconductor, not only heat treatment is performed, but also a catalyst such as a hydrochloric gas is doped. As typical solvent that dissolves these soluble organic semiconductor material, toluene, xylene, chlorobenzene, dichlorobenzene, anisole, chloroform, dichloromethane, γ-butyl lactone, butyl cellosolve, cyclohexane, N-methyl-2-pyrrolidone (NMP), cyclohexanone, 2-butanone, dioxane, dimethylformamide (DMF), tetrahydrofuran (THF), or the like can be used.

In the case that an organic semiconductor is used for the second semiconductor regions 143, 144, a conductive layer made from an organic conductive material such as polyacetylene, polyaniline, PEDOT (poly-ethylenedioxythiophene), or PSS (poly-styrenesulfonate) can be formed instead of forming the first semiconductor regions 135 to 138. The conductive layer serves as a contact layer, or source and drain regions.

Instead of the first semiconductor regions 135 to 138, a conductive layer made from a metal element can be used. In this instance, since many organic semiconductor materials are p-type semiconductors which transport holes as a carrier, metal having a high work function is preferably used to make an ohmic contact to the semiconductor layer.

Specifically, metal, alloy, or the like of gold, platinum, chromium, palladium, aluminum, indium, molybdenum, nickel, or the like is desirably used. The conductive layer can be formed by a conductive paste using these metal or alloy materials by printing, roll coating or droplet discharging.

Furthermore, the second semiconductor region made from an organic semiconductor material, a conductive layer made from an organic conductive material and a conductive layer made from a metal element may be stacked.

In the case that the second semiconductor region is made from a SAS, in addition to a structure in which a gate electrode is covered by source and drain regions as in this embodiment, a so-called self-aligning structure in which the edge portions of source and drain regions and the edge portion of a gate electrode are aligned can be formed. Furthermore, a structure in which the gate electrode is not covered by the source and drain regions, and the source and drain regions are separated from each other with a certain distance can be formed. In the case of forming this structure, contrast can be enhanced when the TFT is used for a switching element of a display device since OFF current can be reduced. Moreover, the TFT can be formed to have a multigate structure in which the second semiconductor region covers a plurality of the gate electrodes. In this instance, OFF current can also be reduced.

Figure 1E:
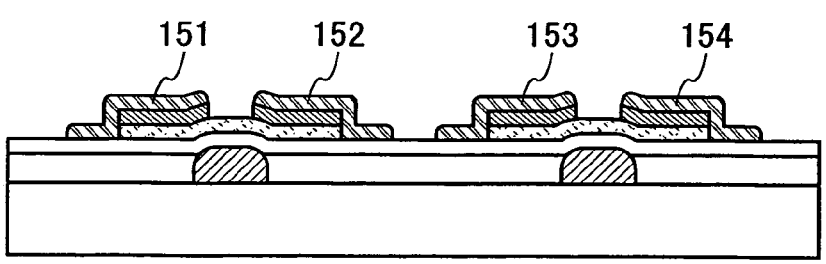

Next, as shown in FIG. 1E, source and drain electrodes 151 to 154 are formed over the first semiconductor regions 135 to 138 using a conductive material. The source and drain electrodes 151 to 154 are formed by the same material and the same method as those of the first conductive layer. In this instance, the source and drain electrodes 151 to 154 are formed by discharging selectively solution of Ag paste dispersed with silver particles having a grain size of several nm and drying.

Then, a passivation film is preferably formed over the source and drain electrodes 151 to 154. The passivation film can be formed by a thin film formation method such as plasma CVD or sputtering using silicon nitride, silicon oxide, silicon nitride oxide, silicon oxynitride, aluminum oxynitride, aluminum oxide, diamond like carbon (DLC), carbon nitride (CN), or other insulating materials.

According to the foregoing processes, a channel etch TFT having high resist pressure and reduced leak current can be manufactured with high manufacturing yields.

Embodiment 2

In this embodiment, a process for manufacturing a semiconductor device in Embodiment 1 in which a first insulating layer has a larger thickness than that of a first conductive layer is explained with reference to FIGS. 2A, 2B, 7B, and 39B. In this embodiment, a channel etch TFT in a bottom gate TFT is explained as the semiconductor device.

Figure 2A:
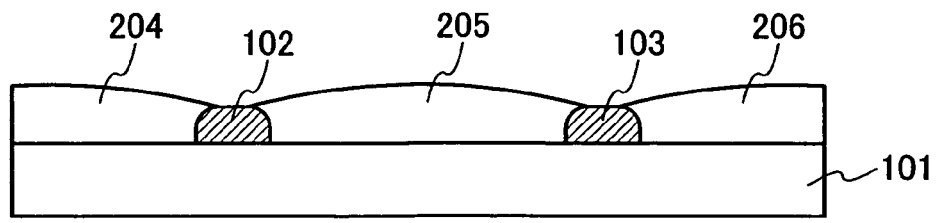
FIGS. 2A to 2E are explanatory cross-sectional views for showing a manufacturing process of a semiconductor device according to the present invention.

As illustrated in FIG. 2A, first conductive layers 102, 103 are formed over a substrate 101 as is the case with Embodiment 1. Then, first insulating layers 204 to 206 are formed. The first insulating layers 204 to 206 have larger thicknesses than those of the first conductive layers 102, 103 and cover a part of the side and top of the first conductive layers 102, 103.

The first insulating layers 204 to 206 can be formed by the same material and the same method as those of the first insulating layers 104 to 106 in Embodiment 1.

Figure 2B:
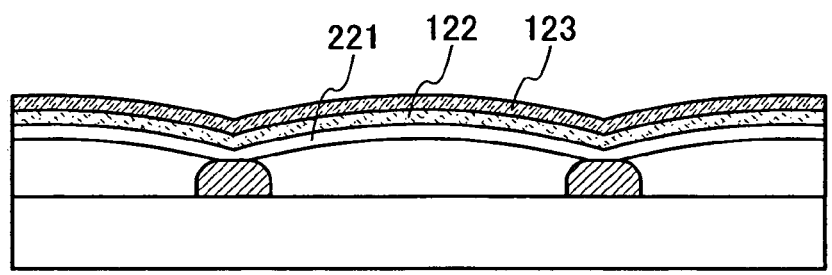

As illustrated in FIG. 2B, a second insulating layer 221, a first semiconductor film 122, and a second semiconductor film 123 having a conducting property are sequentially formed as is the case with Embodiment 1. Further, the second insulating layer 221 can be formed by the same material and the same method as those of the second insulating layer 121 in Embodiment 1.

Figure 7B:
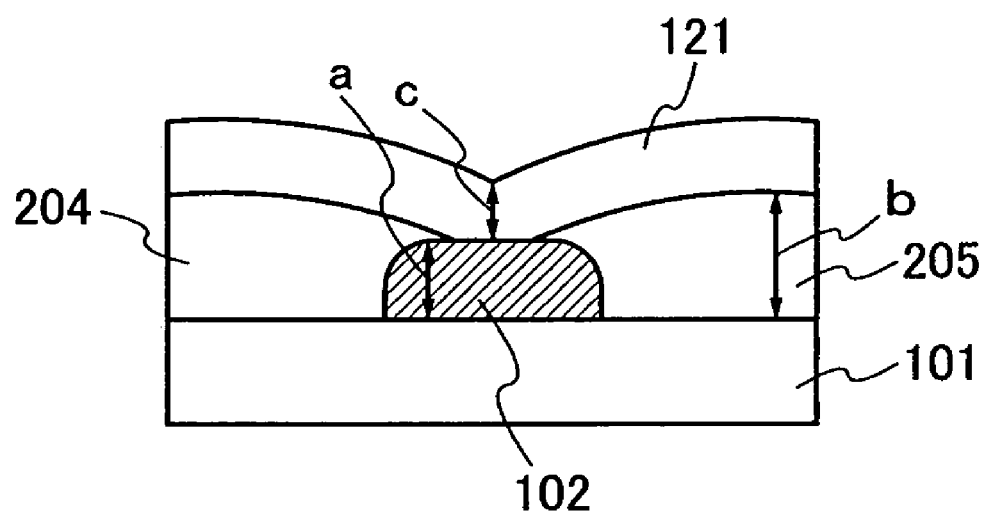

The thicknesses of the first insulating layers 204 to 206 and the second insulating layer 221 are explained with reference to FIG. 7B. As illustrated in FIG. 7B, the thickness b of the first insulating layer is larger than the thickness a of the first conductive layer. Accordingly, the first insulating layer covers a part of the side and top of the first conductive layer. The difference in a thickness b–a between the first insulating layer and the first conductive layer is preferably smaller than that of the thickness c of the second insulating layer. Therefore, it is preferably to satisfy the relation of 0<thickness difference (b–a)<c<(b>a). In the case that the thicknesses of the first insulating layers 204 to 206, the first conductive layer, and the second insulating layer are within the foregoing range, the second insulating layer can be formed to have a few irregularities, the uniformity of the thickness is improved, and step coverage is also improved. Therefore, a semiconductor device that has high resist pressure and hardly leakage current can be manufactured with good yields.

Figure 2C:
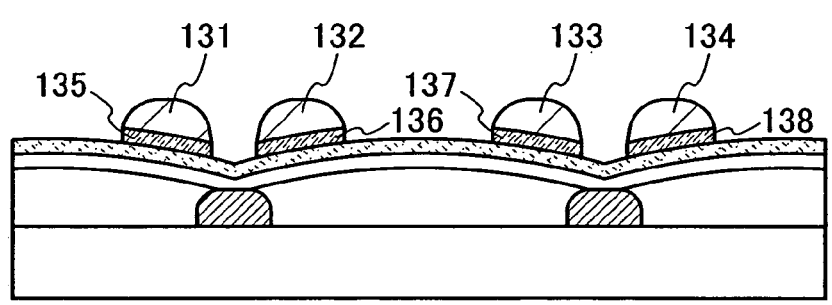
Figure 2D:
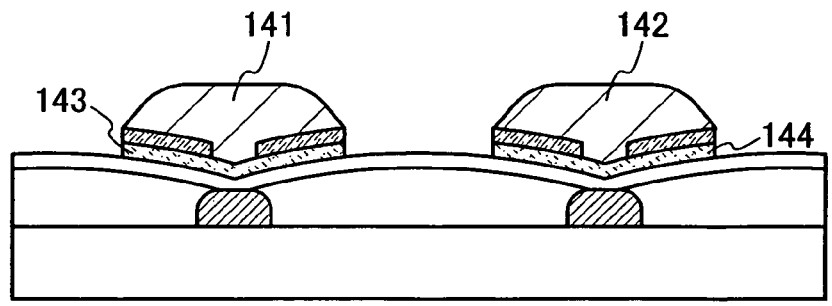
Figure 2E:
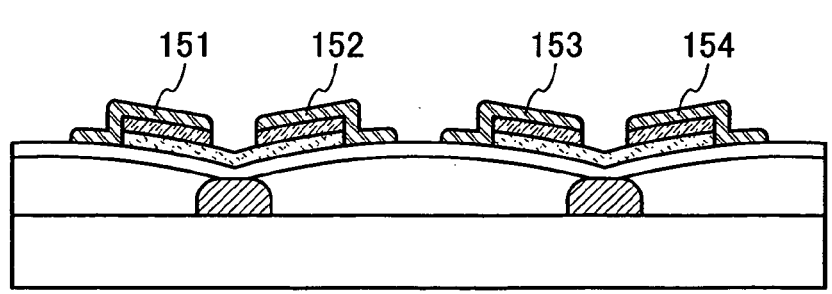

Thereafter, as illustrated in FIGS. 2C to 2E, first semiconductor regions 135 to 138 serving as a source region and a drain region, second semiconductor regions 143, 144 serving as a channel formation region, source and drain electrodes 151 to 154 can be formed in accordance with the same process described in Embodiment 1.

Figure 39B:
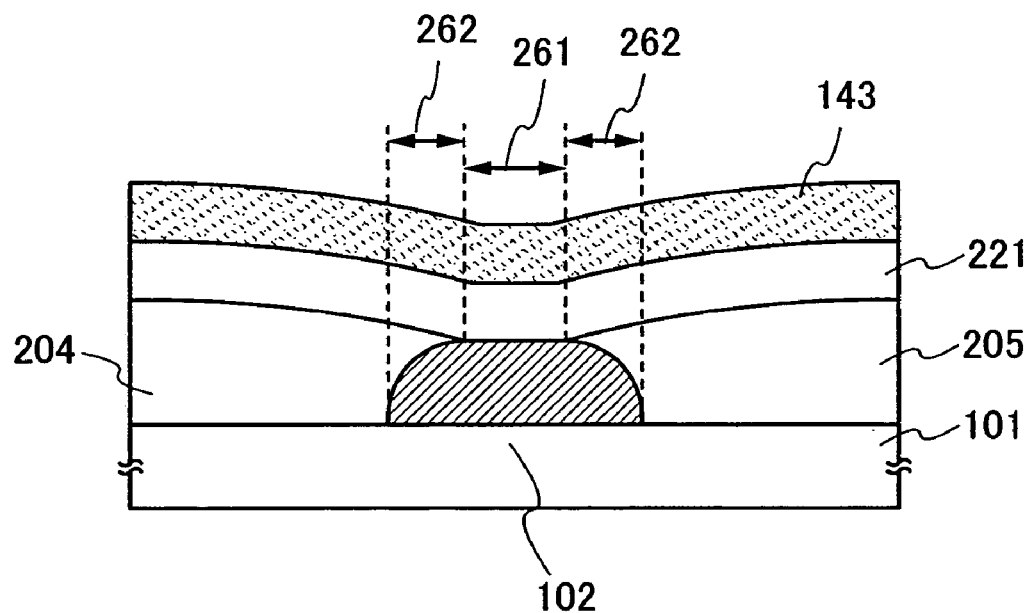

FIG. 39B is an enlarged view of the vicinity of the second semiconductor region 143 and the first conductive layer 102.

FIG. 39B illustrates that the first conductive layer 102; and first insulating layers 204, 205 that fill the outside of the first conductive layer 102, a second insulating layer 221, and a second semiconductor region 143, are formed. The second semiconductor region 143 has a region 261 that overlaps with the first conductive layer 102 and the second insulating layer 221; and a region 262 that overlaps with the first conductive layer 102, the first insulating layers 204, 205, and the second insulating layer 221.

Therefore, the gate insulating film of a TFT according to the present invention has a region formed by a single layered insulating film and a region formed by a two-layered insulating film. Further, the second semiconductor region (channel formation region) of the TFT according to this embodiment is formed to have a concave shape with respect to the substrate surface.

By the foregoing process, a channel etch TFT having high resist pressure and reduced leak current can be manufactured with high manufacturing yields.

Embodiment 3

The shapes of first conductive layers 102, 103 that can be applied to the present invention in Embodiment 1 or 2 are explained with reference to FIGS. 3A to 3E. This embodiment gives an explanation with Embodiment 2. Further, Embodiment 1 can also be appropriately used.

Figure 3A:
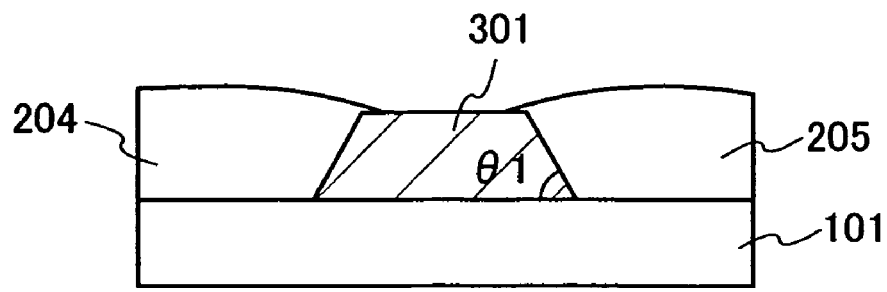
FIGS. 3A to 3E are explanatory cross-sectional views for showing a structure of a first conductive layer of a semiconductor device according to the present invention.

As illustrated in FIG. 3A, a conductive film having a tapered portion with a contact angle $\theta_1$ of 70 to 90° against a substrate 101 at an edge portion, that is, a conductive layer 301 is formed to have a cross-section in a trapezoidal shape, and first insulating layers 204, 205 are formed. Conventionally, there have been problems that a step coverage property of a film is deteriorated and stepped cut is produced with the increase of a contact angle in the case of the film is formed over a film pattern having a contact angle $\theta_1$ of 70° or more. However, the stepped cut of a film formed afterwards can be prevented and the uniformity of a film thickness can be improved by forming the first insulating layers 204, 205. The conductive layer 301 having such a shape can be formed by dry etching of a film using a mask pattern formed by a known photolithography process.

Figure 3B:
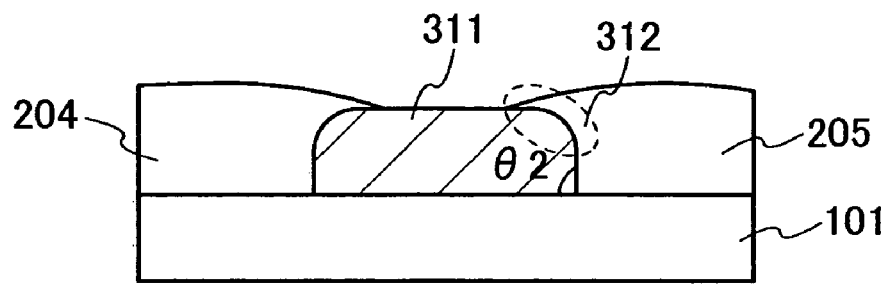

As illustrated in FIG. 3B, a conductive layer 311 having a contact angle $\theta_2$ of 90° against the substrate 101 at a lower edge portion and having a slope portion or a radius of curvature portion 312 at an upper edge portion is formed. Then, first insulating layers 204, 205 are formed. FIG. 3B illustrates a conductive layer having the radius of curvature portion 312. Conventionally, there have been problems that a step coverage property of a film is deteriorated and stepped cut is produced in the case of the film is formed over a film pattern having a contact angle $\theta$ of 90°. However, the stepped cut of a film formed afterwards can be prevented and the uniformity of a film thickness can be improved by forming the first insulating layers 204, 205. The conductive layer having such a shape can be formed by discharging drops by droplet discharging, ink jetting, or the like and drying and baking.

Figure 3C:
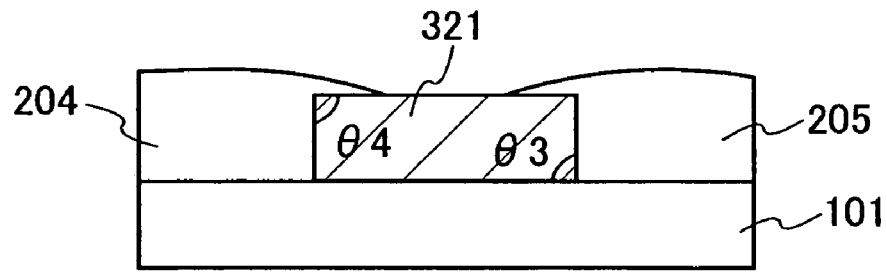

As illustrated in FIG. 3C, a conductive layer 321 having a contact angle $\theta_3$ of 90° against the substrate 101 at a lower edge portion and having a contact angle $\theta_4$ of 90° against the substrate 101 at an upper edge portion, that is, having a cross section in a rectangular shape, is formed. Then, first insulating layers 204, 205 are formed. Conventionally, there have been problems that a step coverage property of a film is deteriorated and stepped cut is produced in the case of forming the film over a film pattern in a rectangular shape. However, the stepped cut of a film formed afterwards can be prevented and the uniformity of a film thickness can be improved by forming the first insulating layers 204, 205. The conductive layer 321 having such a shape can be formed by dry etching of a film using a mask pattern formed by a known photolithography process. Alternatively, printing, electroplating, or the like can be used.

Figure 3D:
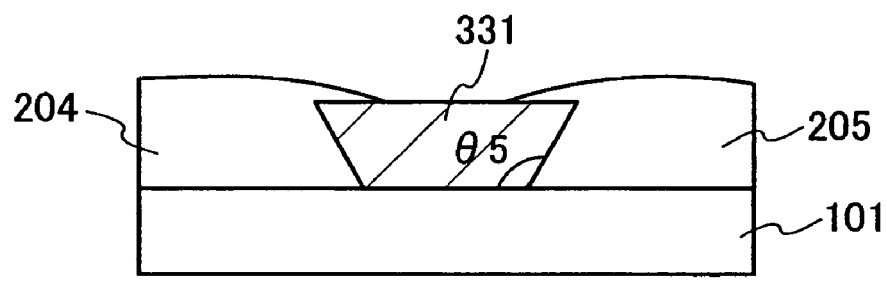

As illustrated in FIG. 3D, a conductive layer 331 having a contact angle $\theta_5$ of 90° or more and 135° or less against a substrate 101, that is, having a reverse tapered portion is formed. Then, first insulating layers 204, 205 are formed. Conventionally, there have been problems that it is difficult to form a film at the vicinity of a lower edge portion that is covered by an upper edge portion, thereby a step coverage property of a film is deteriorated, and stepped cut is produced in the case of forming the film over a film pattern having a contact angle $\theta$ of 90° or more. However, the stepped cut of a film formed afterwards can be prevented and the uniformity of a film thickness can be improved by forming the first insulating layers 204, 205.

Figure 3E:
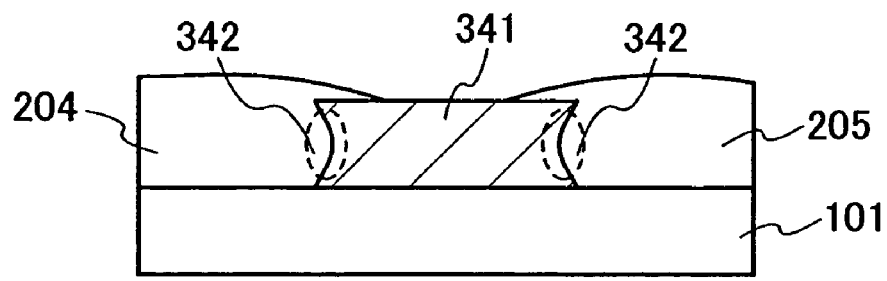

As illustrated in FIG. 3E, a conductive layer 341 having concave portions 342 at the side of the conductive layer 341 is formed. Then, first insulating layers 204, 205 are formed. Conventionally, there have been problems that a film pattern has markedly irregularities, a step coverage property of a film is deteriorated, and stepped cut is produced in the case that the film is formed over the film pattern having a concave portion. However, the stepped cut of a film formed afterwards can be prevented and the uniformity of a film thickness can be improved by forming the first insulating layers 204, 205. The conductive layer 341 having such a shape can be formed by wet etching of a film using a mask pattern formed by a known photolithography process.

The present invention can form a TFT using a conductive film in various shapes as noted above, and so an applicable range of the manufacturing method can be expanded.

Embodiment 4

In this embodiment, a manufacturing process of a channel protective type TFT in a bottom gate TFT according to the present invention is explained. A first insulating layer is formed by using, but not exclusively, Embodiment 1. Embodiment 2 can also be used. Further, the first conductive layer explained in Embodiment 3 can be appropriately used as a first conductive layer in this embodiment.

Figure 5A:
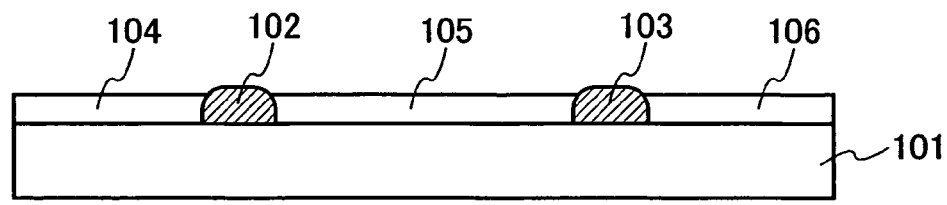
FIGS. 5A to 5D are explanatory cross-sectional views for showing a manufacturing process of a semiconductor device according to the present invention.

As illustrated in FIG. 5A, first conductive layers 102, 103 are formed over a substrate 101 using Embodiment 1. First insulating layers 104 to 106 are formed to fill between the first conductive layers 102, 103.

Figure 5B:
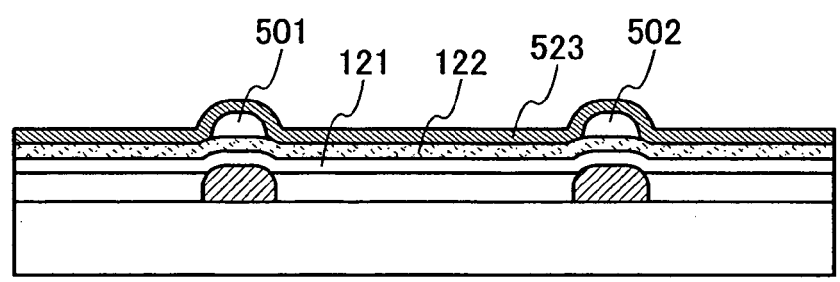

As illustrated in FIG. 5B, a second insulating layer 121 which serves as a gate insulating film, and a first semiconductor film 122 are formed over the first conductive layers 102, 103 and the first insulating layers 104 to 106. Then, protective films 501, 502 are formed over regions, which are over the first semiconductor film 122, and which overlap with the first conductive layers 102, 103, respectively. The protective films 501, 502 are formed by the same material and the same method as those of the first mask patterns 131 to 134 as shown in the first embodiment.

Then, a second semiconductor film (semiconductor film having a conducting property) 523 is formed. Further, the second semiconductor film 523 can be formed by the same material and the same method as those of the second semiconductor film 123 described in Embodiment 1.

Figure 5C:
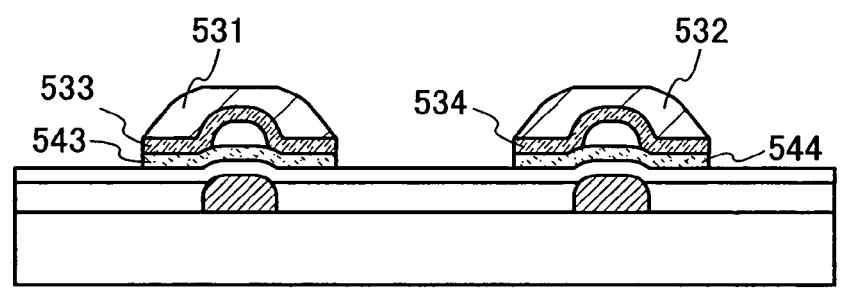

As illustrated in FIG. 5C, first mask patterns 531, 532 are formed. The first mask patterns 531, 532 can be formed by the same material and the same method as those of the second mask patterns 141, 142 described in Embodiment 1.

The first semiconductor film and the second semiconductor film are etched by using the first mask patterns to form first semiconductor regions 533, 534, and second semiconductor regions 543, 544. Thereafter, the first mask patterns are removed.

Figure 5D:
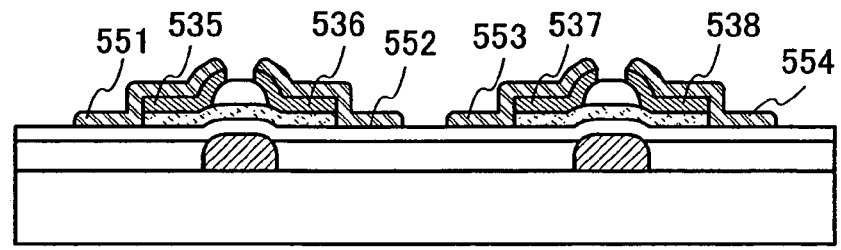

As illustrated in FIG. 5D, source electrodes and drain electrode 551 to 554 are formed over the first semiconductor regions 533, 534.

The exposed portion of the first semiconductor regions 533, 534 are etched and divided by using the source electrodes and drain electrode 551 to 554 as masks to form source regions and drain regions 535 to 538. By this process, the protective films 501, 502 are exposed.

As a method for forming the source regions and drain regions 535 to 538, not only this embodiment but also a manufacturing process of the first semiconductor region explained in Embodiment 1 can be used. The forming process of the source regions and drain regions according to this embodiment can be applied to Embodiment 1.

By the foregoing process, a channel protective TFT having high resist pressure and reduced leak current can be manufactured with high manufacturing yields.

Embodiment 5

A process for manufacturing a forward staggered TFT among top gate TFTs according to the present invention is explained with reference to FIGS. 6A to 6D. A first insulating layer is formed by, but not exclusively, Embodiment 1. Embodiment 2 can also be used. Further, the first conductive layer explained in Embodiment 3 can be appropriately used as a first conductive layer in this embodiment.

Figure 6A:
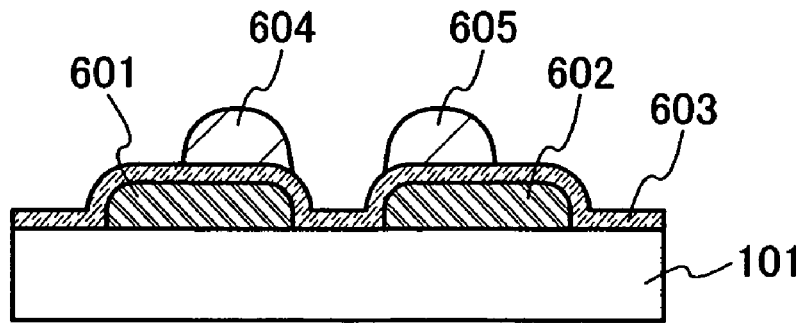
FIGS. 6A to 6D are explanatory cross-sectional views for showing a manufacturing process of a semiconductor device according to the present invention.

As illustrated in FIG. 6A, first conductive layers 601, 602 serving as a source electrode and a drain electrode are formed over a substrate 101. The first conductive layers 601, 602 are formed by appropriately using the same material and the same method as those of the first conductive layers 102, 103 in Embodiment 1. Then, a first semiconductor film 603 having a conducting property is formed over the first conductive layers 601, 602. The first semiconductor film 603 is formed by the same material and the same method as those of the second semiconductor film in Embodiment 1. And then, first mask patterns 604, 605 are formed over the first semiconductor film 603. Since the first mask patterns are used as masks for forming a source region and a drain region, the first mask patterns are formed by the same material and the same method as those of the first mask patterns 131 to 134 in Embodiment 1.

Figure 6B:
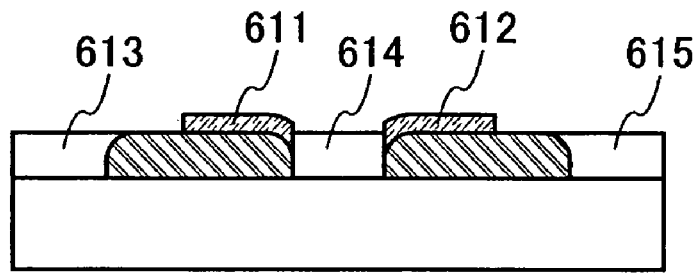

As illustrated in FIG. 6B, the first semiconductor film is etched by using the first mask patterns to form first semiconductor regions 611, 612. The first semiconductor regions 611, 612 serve as a source region and a drain region. Further, the first semiconductor regions 611, 612 are formed by using appropriately the same material and the same method as those of the first semiconductor regions 135 to 138 in Embodiment 1.

First insulating layers 613 to 615 are formed between the stacked first conductive layers 601, 602, and the first semiconductor regions. The first insulating layers 613 to 615 are formed by the same material and the same manufacturing process as those of the first insulating layers 104 to 106 in Embodiment 1.

Figure 6C:
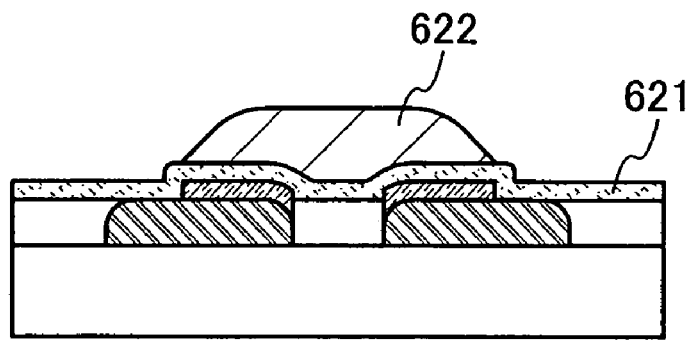

As illustrated in FIG. 6C, a second semiconductor film 621 is formed over the first insulating layers 613 to 615, the first conductive layers 601, 602, and the first semiconductor regions 611, 612. The second semiconductor film 621 is formed by using appropriately the same material and the same manufacturing method as those of the first semiconductor film 122 in Embodiment 1.

Then, a second film pattern 622 is formed over the second semiconductor film 621. The second film pattern is a mask for forming a channel formation region and is formed by using appropriately the same method and the same manufacturing process as those of the second mask patterns 141, 142 in Embodiment 1.

Figure 6D:
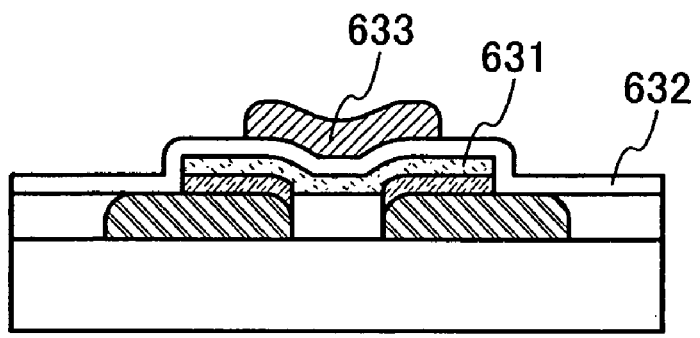

And then, as illustrated in FIG. 6D, a second semiconductor region 631 is formed by etching the second semiconductor film 621 using the second film pattern 622. The second semiconductor region serves as a channel formation region.

A second insulating layer 632 and a second conductive layer 633 are formed. Since the second insulating layer 632 serves as a gate insulating film, the second insulating layer 632 is formed by the same method and the same manufacturing process as those of the second insulating layer 121 in Embodiment 1. Further, since the second conductive layer 633 serves as a gate electrode, the second conductive layer 633 is formed by the same material and the same manufacturing process as those of the first conductive layers 102, 103 in Embodiment 1.

By the foregoing process, a forward staggered TFT having high resist pressure and reduced leak current can be manufactured with high manufacturing yields.

Embodiment 6

In this embodiment, a method for forming a contact hole of a TFT is explained with reference to FIGS. 38A to 38E.

Figure 38A:
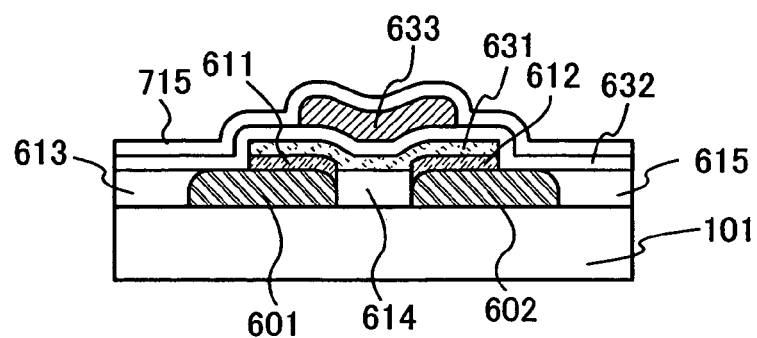
FIGS. 38A to 38E are explanatory surface views for showing a structure of a semiconductor device according to the present invention.

According to Embodiment 5, a forward staggered TFT as illustrated in FIG. 38A is formed. Here, first conductive layers 601, 602, first insulating layers 613 to 615, first semiconductor regions 611, 612 having a conducting property, a second semiconductor region 631, a second insulating layer 632, and a second conductive layer 633 are formed over a substrate 101. Thereafter, a protective film 715 is formed to cover the TFT. Further, the first semiconductor regions serve as a source region and a drain region, whereas the second semiconductor region serves as a channel formation region.

Figure 38B:
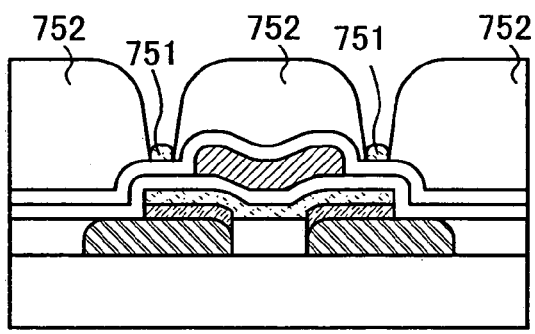

First mask patterns 751 are formed by discharging solution for forming a liquid-shedding surface over regions where the first conductive layers 601, 602, the second insulating layer 632, the protective layer 715 and the first and second semiconductor regions are overlapped with each other as illustrated in FIG. 38B.

A region having a liquid-shedding surface is a region that has a large contact angle of the surface of the region against liquid. On the surface, liquid is shed to be formed into a hemispheroid. On the other hand, a region having a liquid-lyophilic surface is the region that has a small contact angle of the surface of the region against liquid. Liquid is penetrated into and spread on the surface.

Therefore, in the case that two regions having different contact angles are adjacent to each other, a region having a relative large contact angle is a region having a liquid-shedding surface, whereas a region having a relative small contact angle is a liquid-lyophilic surface. In the case that solution is coated or discharged to the two regions, the solution is penetrated into and spread over the surface of the region having the liquid-lyophilic surface and shed at an interface between the region having the liquid-lyophilic surface and the region having the liquid-shedding surface to be formed into a hemispheroid.

In the case that the surface has irregularities, the contact angle of the region having the liquid-shedding surface becomes further increased, that is, a liquid-shedding property is enhanced. On the other hand, the contact angle of the region having the liquid-lyophilic surface becomes further decreased, that is, a liquid-lyophilic property is enhanced. Therefore, a layer can be formed to have each of the liquid-lyophilic region and the liquid-shedding region with a uniform edge portion by coating or discharging solution that has a composite over each surface having irregularities.

Here, a region having a liquid-shedding surface is formed by coating or discharging a material for forming a liquid-shedding surface. As an example of the material of solution for forming a liquid-shedding surface, a silane coupling agent as represented by a chemical formula $Rn-Si-X_{(4-n)}$ (n=1, 2, 3) is used. In the formula, R includes a comparative inactive group such as an alkyl group, and X is formed by a hydrolysis group such as halogen, a methoxy group, an ethoxy group, or an acetoxy group that is capable of bonding by condensation with a hydroxyl group or adsorption water over a substrate surface.

A liquid-shedding property can be further enhanced by using fluorite silane coupling agent (fluoroalkylsilane (FAS)) having a fluoroalkyl group as R, which is a typical example of the silane-coupling agent. The fluoroalkyl group R of FAS has a structure of $(CF_3)(CF_2)_x(CH_2)_y$, wherein x is an integer from 0 or more to 10 or less and y is an integer from 0 or more to 4 or less. When a plurality of R or X is coupled to Si, R or X may be the same or different. As a typical example of the FAS, such as heptadefluorotetrahydrodecyltriethoxysilane, heptadecafluorotetrahydrodecyltrichlorosilane, tridecafluorotetrahydrooctyltrichlorosilane, and trifluoropropyltrimethoxysilane can be nominated.

As solvent of solution for forming a liquid-shedding surface, hydrocarbon-based solvent such as n-pentane, n-hexane, n-heptane, n-octane, n-decane, dicyclopentane, benzene, toluene, xylene, durene, indene, tetrahydronaphthalene, decahydronaphthalene, and squalene; or tetrahydrofuran can be used.

As an example of solution for forming the liquid-shedding surface, a material having a fluorocarbon chain (fluorinated resin) can be used. As the fluorinated resin, polytetrafluoroethylene (PTFE; 4-fluorinated ethylene resin), perfluoroalkoxy alkane (PFA; 4-fluorinated ethylene perfluoroalkylvinylether copolymer resin), perfluoroethylenepropene copolymer (PFEP; 4-fluorinated ethylene 6-fluorinated propylene copolymer resin), ethylene-tetrafluoroethylene copolymer (ETFE; 4-fluorinated ethylene-ethylene copolymer resin), polyvinylidene fluoride (PVDF; fluorinated vinylidene resin), polychlorotrifluoroethylene (PCTFE; 3-fluorinated ethylene chloride resin), ethylene-chlorotrifluoroethylene copolymer (ECTFE; 3-fluorinated ethylene chloride-ethylene copolymer resin), polytetrafluoroethylene-perfluorodioxole copolymer (TFE/PDD), polyvinyl fluoride (PVF; fluorinated vinyl resin), or the like can be used.

Then, the surface attached with solution for forming a liquid-shedding surface is cleaned by ethanol, and then, an extreme thin liquid-shedding surface can be formed.

Alternatively, an organic matter that does not form a liquid-shedding surface (that is, the organic matter forms a liquid-lyophilic surface) is used as a mask pattern, and treatment by $CF_4$ plasma or the like is carried out, then, a liquid-shedding surface can be formed. For example, a material prepared by mixing water-soluble resin such as polyvinyl alcohol (PVA) into solvent such as $H_2O$ can be used as the organic matter. Alternatively, the PVA and another water-soluble resin can be combined. Moreover, a liquid-shedding property can be further improved by performing the plasma treatment even when the mask pattern has a liquid-shedding surface.

Further, an electrode provided with a dielectric material is prepared, and plasma treatment can be performed by producing plasma so that the dielectric material is exposed to the air or the plasma using oxygen or nitrogen. In this instance, the dielectric material is not required to cover entirely the surface of the electrode. As the dielectric material, fluoride resin can be used. In the case of using fluoride resin, surface modification is carried out to have a liquid-shedding property by forming $CF_4$ bonding over a subject surface. In addition, plasma treatment is carried out.

Then, a second mask pattern 752 is formed by discharging solution that forms a liquid-lyophilic surface. As a typical example of solution having a liquid-lyophilic property, organic resin such as acrylic resin, polyimide resin, melamine resin, polyester resin, polycarbonate resin, phenol resin, epoxy resin, polyacetal, polyether, polyurethane, polyamide (nylon), furan resin, or diallyl phthalate resin; siloxane; or polysilazane can be nominated. Further, solution using polar solvent such as water, alcohols, ethers, dimethylformamide, dimethylacetamide, dimethylsulfoxide, N-methylpyrrolidone, hexamethylphosphamide, chloroform, or methylene chloride can be used. As a method for forming the second mask pattern, droplet discharging, an ink jetting method, a spin coating method, a roll coating method, a slot coating method, or the like can be employed.

Since the first mask patterns 751 have liquid-shedding surfaces, the second mask pattern 752 is formed in the outer edges of the first mask patterns, that is, a region that is not provided with the first mask patterns.

Instead of the foregoing processes, the second mask patterns may be formed by coating the second solution after drying solvent of the first mask patterns. By these processes, an extreme thin liquid-shedding surface can be formed.

Figure 38C:
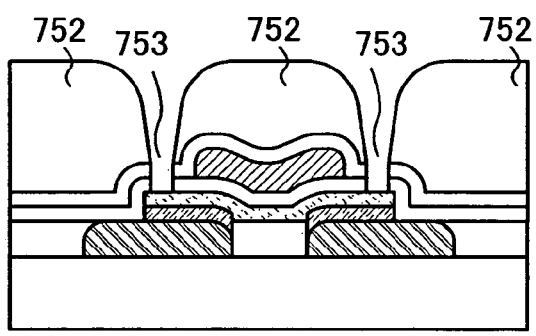

As shown in FIG. 38C, the first mask patterns 751, the protective film 715, and the second insulating layer 632 are etched by using the second mask pattern 752 as a mask to expose a part of the second semiconductor region 631.

Figure 38D:
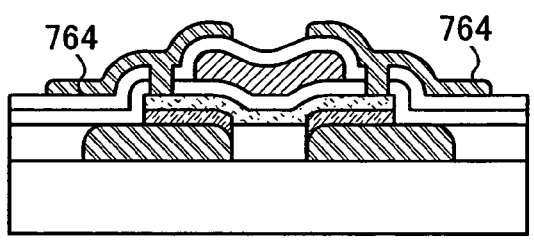

As shown in FIG. 38D, a third conductive layers 764 are formed after the second mask pattern 752 is removed. The third conductive layers 764 serve as a source wiring layer and a drain wiring layer.

Figure 38E:
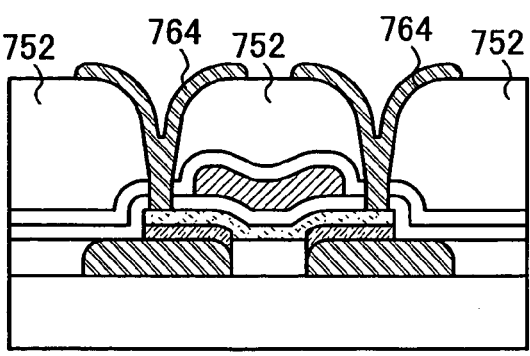

As shown in FIG. 38E, it is possible that the second mask pattern 752 is not removed to be used as an interlayer insulating film, and a third conductive layer 764 is formed.

By the foregoing processes, a contact hole can be formed without using a photomask.

Embodiment 7

Figure 8:
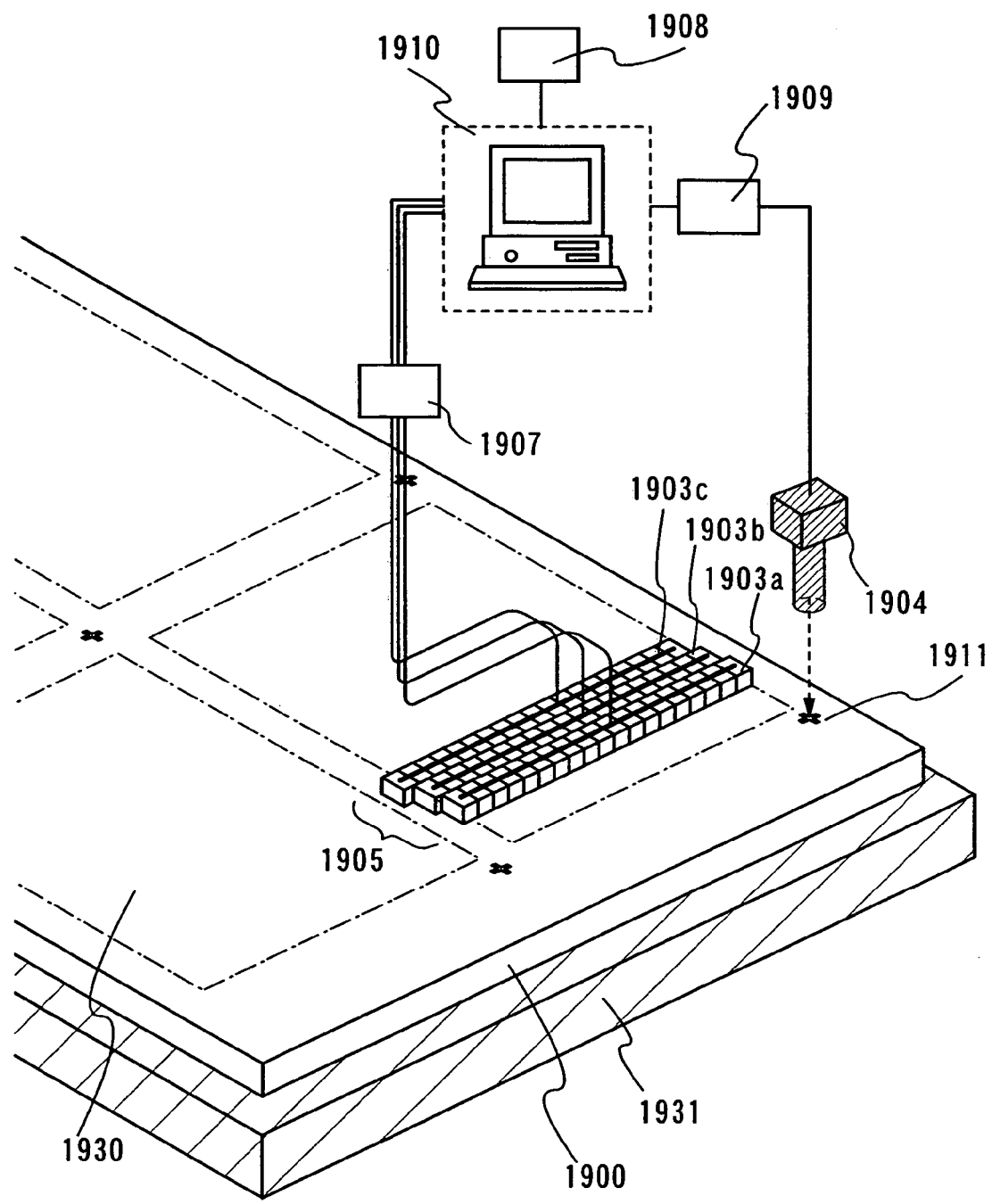
FIG. 8 is an explanatory view for showing a structure of a droplet discharging apparatus that can be applied to the present invention.

A droplet discharging apparatus which can be used for a film pattern formation in the above embodiments is explained in this embodiment. In FIG. 8, a region over a substrate 1900 in which one panel 1930 is formed is denoted by chain line.

FIG. 8 illustrates one mode of a droplet discharging apparatus used to form a pattern such as a wiring. A droplet discharge means 1905 has a head. The head has a plurality of nozzles. This embodiment explains the case that three heads (1903a, 1903b, and 1903c) are respectively provided with ten nozzles. However, the number of nozzles or heads can be set in accordance with an area to be treated, a process, or the like.

The heads are connected to a control means 1907. By controlling the control means by a computer 1910, a preset pattern can be drawn. The timing in drawing may depend on, for example, a marker 1911 that is formed over the substrate 1900 or the like fixed to a stage 1931 as a reference point. Alternatively, an edge of the substrate 1900 may be used as the reference point. The reference point is detected by an imaging means 1904 such as a CCD to be converted into a digital signal by an image processing means 1909. The signal converted into a digital signal is recognized by the computer 1910 to generate a control signal, and the control signal is sent to the control means 1907. When drawing a pattern in such a way, the interval between a pattern formation surface and a nozzle tip is preferably set 0.1 to 5 cm, more preferably 0.1 to 2 cm, further more preferably, approximately 0.1 cm. By setting the interval shortly, landing accuracy of a droplet is improved.

At this time, information of a pattern to be formed over the substrate 1900 is stored in a storage medium 1908, and a control signal is transmitted to the control means 1907 based on the information, then, the heads 1903a, 1903b, and 1903c can be individually controlled. In other words, different materials can be discharged from each nozzle of the heads 1903a, 1903b, and 1903c. For example, the nozzles of the heads 1903a and 1903b can discharge a composite including an insulating film material and the nozzles of the head 1903c can discharge a composite including a conductive film material.

Further, the nozzles of the head can also be individually controlled. Since the nozzles can be individually controlled, different composites can be discharged from a specific nozzle. For example, one head 1903a can be provided with a nozzle which discharges a composite including a conductive film material and a nozzle which discharges a composite including an insulating film material.

Further, the nozzle is connected to a tank filled with a composite.

In the case of performing droplet discharging treatment on a large area like a formation process of an interlayer insulating film, a composite including an interlayer insulating film material is preferably discharged from all nozzles. Further, a composite including an interlayer insulating film material may be discharged from all nozzles of a plurality of heads. Accordingly, throughput can be improved. Needless to say, droplet discharging treatment may be performed on a large area by discharging a composite including an interlayer insulating film material from one nozzle and by scanning at a plurality of times in a formation process of the interlayer insulating film.

A pattern can be formed on a large mother glass by moving a head in zigzag or by shuttling the head. At this time, the head and the substrate may be relatively scanned at a plurality of times. When the head scans the substrate, the head is preferably inclined toward a direction of movement.

In the case of forming a plurality of panels from a large mother glass, the head has preferably the same width as a panel. A pattern can be formed by scanning at once against a region to be provided with a panel 1930, and so high throughput can be expected.

The width of the head may be narrower than that of the panel. At this time, a plurality of heads having a narrow width may be arranged in series to have a width equal to that of one panel. By arranging a plurality of heads having a narrow width in series, deflection of the head that is worried as increasing a width of the head can be prevented. Needless to say, a pattern can be formed by moving a head having a narrow width at a plurality of times.

A process of discharging a droplet of a composite by such droplet discharging is preferably performed under reduced pressure. Hence, solvent of the composite is evaporated during a period between discharging the composite and landing the composite on a subject, and so processes of drying and baking the composite can be omitted. Further, an oxide film or the like is not formed on the surface of a conductor in this instance. In addition, the step of dropping solution may be performed in a nitrogen atmosphere or an organic gas atmosphere.

In addition, a piezo technique can be used as droplet discharging. Since the piezo technique has superior controllability of a droplet and a high degree of freedom for selecting ink, the piezo technique is also used in an inkjet printer. In addition, there are various types of the piezo technique; for example, a bender type (typically, an MLP (Multi Layer Piezo) type), a piston type (typically, an ML Chip (Multi Layer Ceramic Hyper Integrated Piezo segments) type), a side wall type, and a roof wall type. Alternatively, droplet discharging utilizing a thermal technique, which induces a heating element to generate a fever, and which produces bubbles to push out solution may be used depending on solvent of solution.

EXAMPLE 1

Manufacturing methods of an active matrix substrate and a display panel having the active matrix substrate are explained with reference to FIGS. 17A to 23. In this example, the methods are explained by using a liquid crystal display panel as a display panel. FIGS. 17A to 19C illustrates schematically longitudinal sectional structures of a pixel portion and a connecting terminal potion. FIGS. 20 to 23 illustrate planar structures of FIGS. 17A to 19C taken along lines of A–B and C–D. In this example, a first insulating layer is, but not exclusively, formed by using Embodiment 1. Embodiment 2 can also be used for forming the first insulating layer. A first conductive layer explained in Embodiment 3 can be appropriately used as a gate wiring layer, a gate electrode layer, and a connecting conductive layer.

Figure 17A:
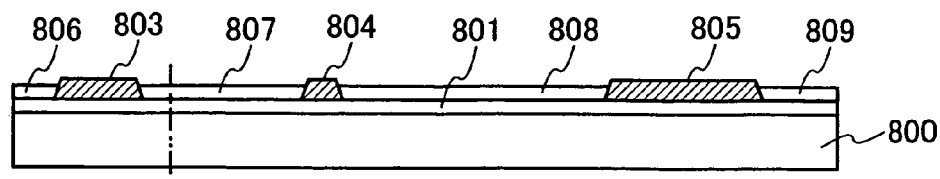
FIGS. 17A to 17E are explanatory cross-sectional views for showing a manufacturing process of a semiconductor device according to the present invention.

As illustrated in FIG. 17A, the surface of a substrate 800 is oxidized at 400° C. to form an insulating film 801 having a thickness of 100 nm. The insulating film 801 serves as an etching stopper film for a conductive layer that is formed afterward. Then, a first conductive film is formed over the insulating film 801, and then, a first mask pattern is formed by droplet discharging over the first conductive film. As the substrate, AN100 glass substrate from Asahi Glass Co., Ltd. is used. As the first conductive film, a tungsten film is formed to have a thickness of 100 nm by sputtering using a tungsten target and an argon gas. As the first mask pattern, polyimide is discharged by droplet discharging to be baked by heating at 200° C. for 30 minutes. The first mask pattern is formed by discharging over a gate wiring layer, a gate electrode layer, and a connecting conductive layer, each of which is formed afterwards.

Figure 20:
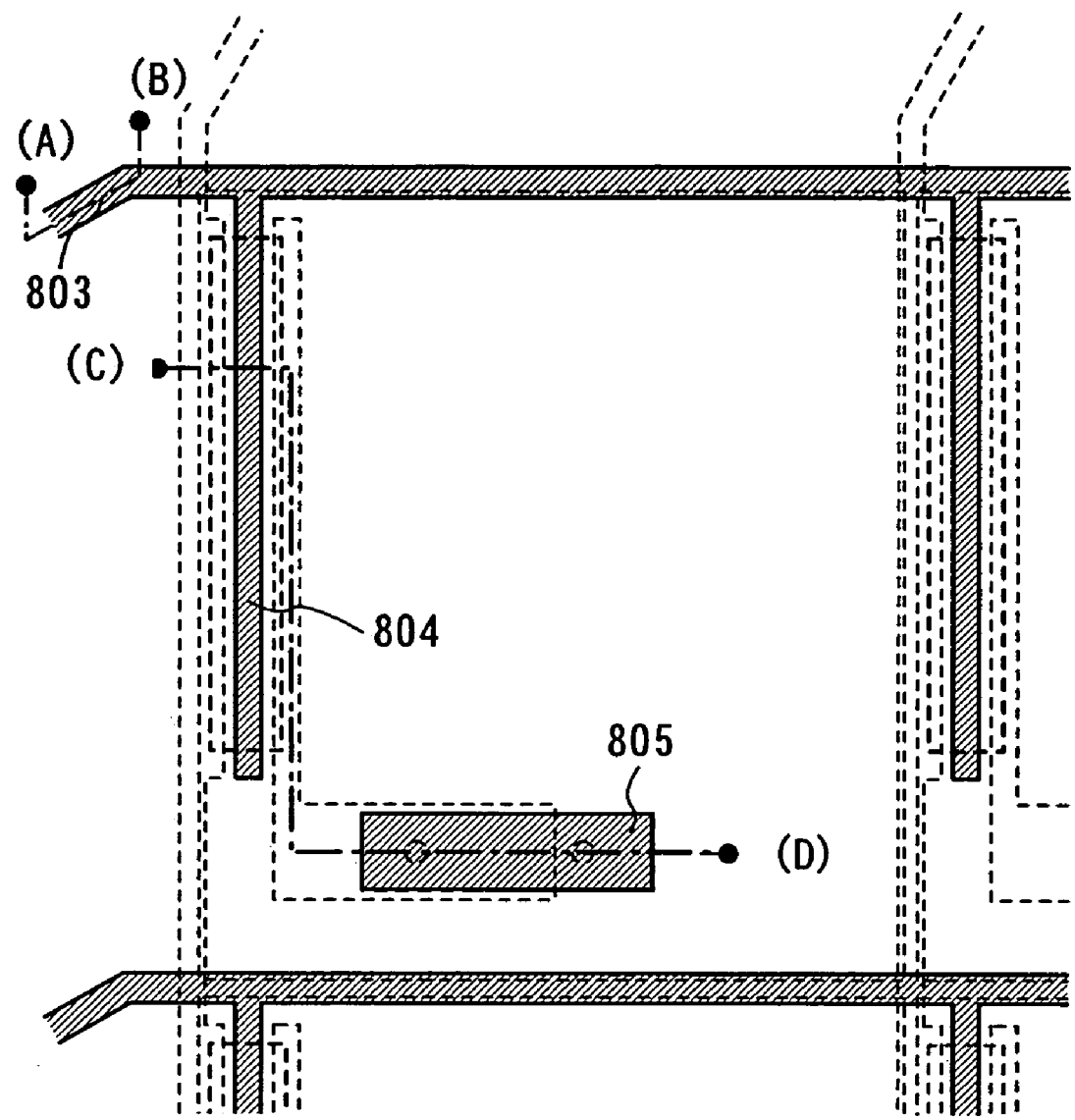
FIG. 20 is an explanatory top view for showing a manufacturing process of a semiconductor device according to the present invention.

Then, a gate wiring layer 803, a gate electrode layer 804, and a connecting conductive layer 805 are formed by etching a part of the first conductive film by using the first mask pattern. Here, a first conductive layer having a taper portion of 70 to 90° is formed. Thereafter, the first mask pattern is exfoliated by stripper. FIG. 17A illustrating a longitudinal sectional structure and FIG. 20 illustrating a planar structure of FIG. 17A after removing the first mask pattern taken along line of A–B and C–D are referred simultaneously.

First insulating layers 806 to 809 are formed to fill between the gate wiring layer 803, the gate electrode layer 804, and the connecting conductive layer 805. Here, a first insulating layer is formed by discharging polyimide by droplet discharging.

Figure 17B:
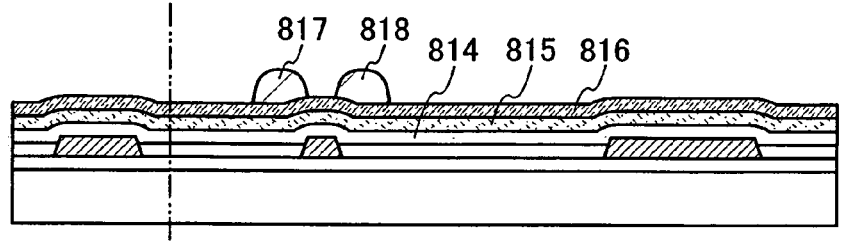

As illustrated in FIG. 17B, a gate insulating film 814 is formed by plasma CVD. As the gate insulating film 814, an oxynitride silicon film (H:1.8%, N:2.6%, O:63.9%, and Si:31.7%) is formed by plasma CVD using $SiH_4$ and $N_2O$ (flow ratio of $SiH_4:N_2O=1:200$) to have a thickness of 110 nm in a chamber heated at 400° C.

According to the process, a gate insulating film having excellent uniformity of a thickness and excellent step coverage property can be formed.

A first semiconductor film 815 and a second semiconductor film 816 imparting n-type conductivity are formed. As the first semiconductor film 815, an amorphous silicon film having a thickness of 150 nm is formed by plasma CVD. Then, an oxide film at the surface of the amorphous silicon film is removed, and then, a semiamorphous silicon film having a thickness of 50 nm is formed by using a silane gas and a phosphine gas as the second semiconductor film 816.

Second mask patterns 817, 818 are formed over the second semiconductor film 816. The second mask patterns are formed by discharging polyimide by droplet discharging over the second semiconductor film 816 to be heated at 200° C. for 30 minutes. The second mask patterns 817, 818 are formed over a region provided with a first semiconductor region afterwards.

Figure 17C:
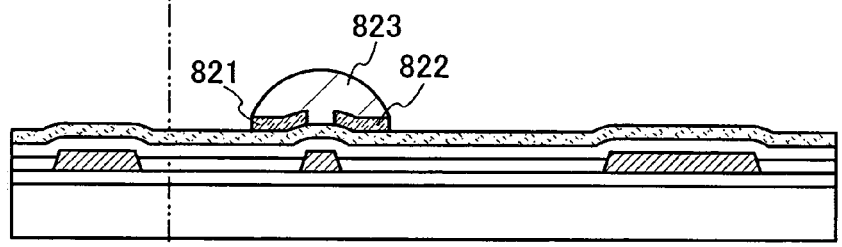

As illustrated in FIG. 17C, first semiconductor regions (source and drain regions, contact layer) 821, 822 are formed by etching the second semiconductor film 816 using the second mask patterns 817, 818. The second semiconductor film 816 is etched by a mixed gas with a flow ratio of $CF_4:O_2=10:9$. Thereafter, the second mask patterns 817, 818 are exfoliated by using stripper.

Figure 17D:
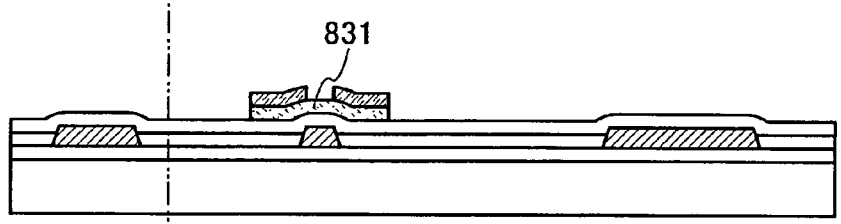
Figure 21:
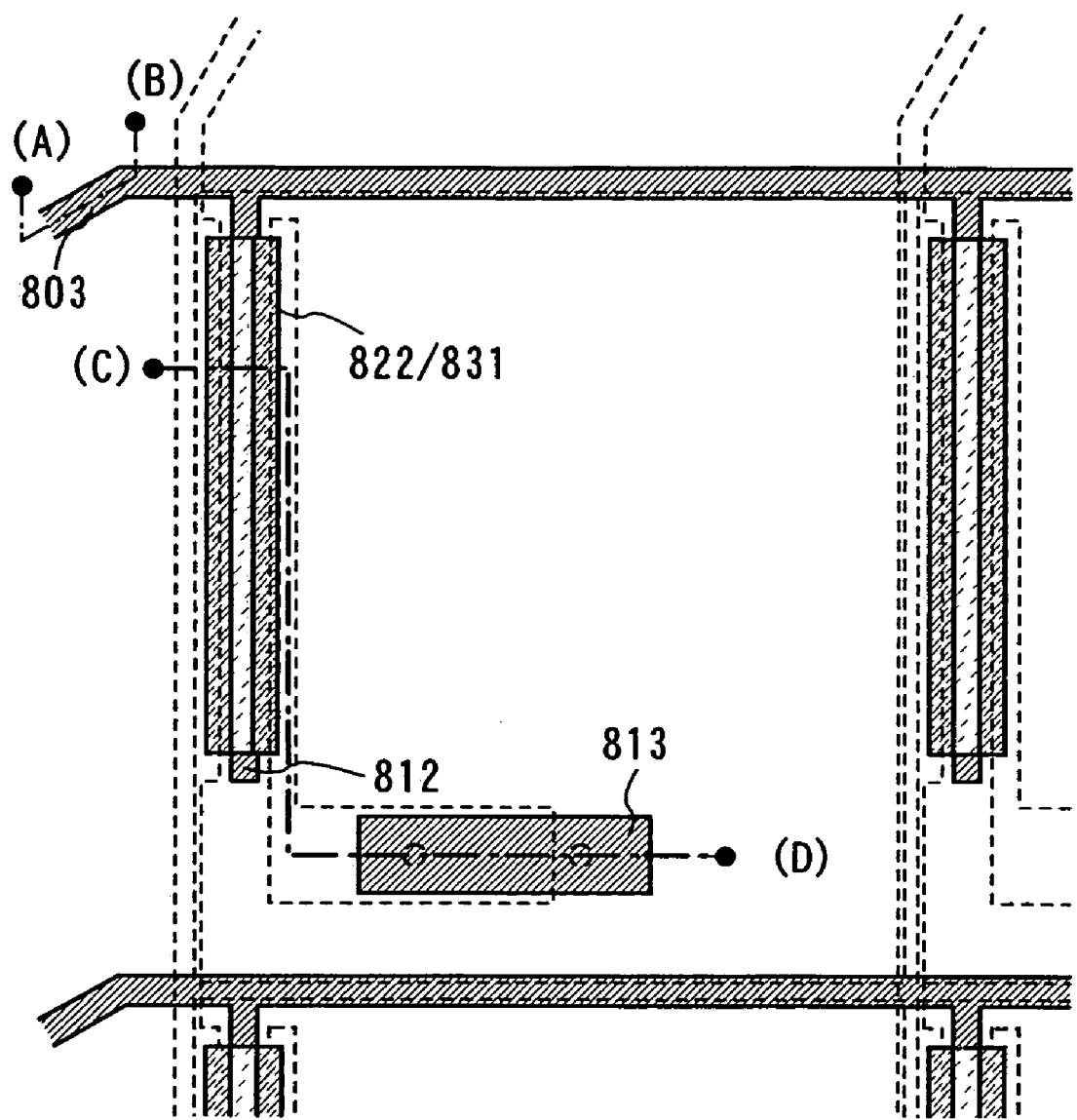
FIG. 21 is an explanatory top view for showing a manufacturing process of a semiconductor device according to the present invention.

A third mask pattern 823 covering the first semiconductor regions 821, 822, and the first semiconductor film 815 formed between the first semiconductor regions 821, 822 is formed. The third mask pattern 823 is formed by the same material and the same method as those used for the second mask pattern. The first semiconductor film 815 is etched by using the third mask pattern to form a second semiconductor region 831 as illustrated in FIG. 17D and to expose the gate insulating film 814. The first semiconductor film is etched by using a mixed gas with a flow ratio of $CF_4:O_2=10:9$. Then, ashing treatment using oxygen is performed. Thereafter, the third mask pattern 823 is exfoliated by stripper. FIG. 17D illustrating a longitudinal sectional structure and FIG. 21 illustrating a planar structure of FIG. 17D taken along lines of A–B and C–D are referred simultaneously.

Figure 17E:
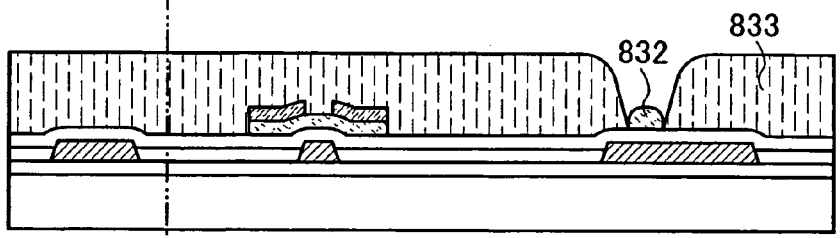

Then, as illustrated in FIG. 17E, a fourth mask pattern 832 is formed. The fourth mask pattern is formed by droplet discharging of solution forming a liquid-shedding surface to a region where the gate insulating film 814 and the connecting conductive layer 805 are overlapped with each other. As the solution forming a liquid-shedding surface, solution prepared by dissolving fluorinated silane coupling agent into alcohol solvent is used. The fourth mask pattern 832 is a protective film for forming a fifth mask pattern for forming a contact hole to a region where a subsequent drain electrode and the connecting conductive film 813 are connected to each other.

The fifth mask pattern 833 is formed. The fifth mask pattern is a mask for forming a first contact hole formed by discharging polyimide by droplet discharging at 200° C. for 30 minutes. Since the fourth mask pattern 832 has a liquid-shedding property whereas the fifth mask pattern 833 has a liquid-attracting property, the fifth mask pattern 833 is not provided to a region provided with the fourth mask pattern.

Then, a part of the gate insulating film 814 is exposed by removing the fourth mask pattern 832 by oxygen ashing. Then, a part of the exposed gate insulating film is etched by using the fifth mask pattern 833. The gate insulating film is etched by using $CHF_3$. Thereafter, the fifth mask pattern is exfoliated by oxygen ashing and etching using stripper.

Figure 18A:
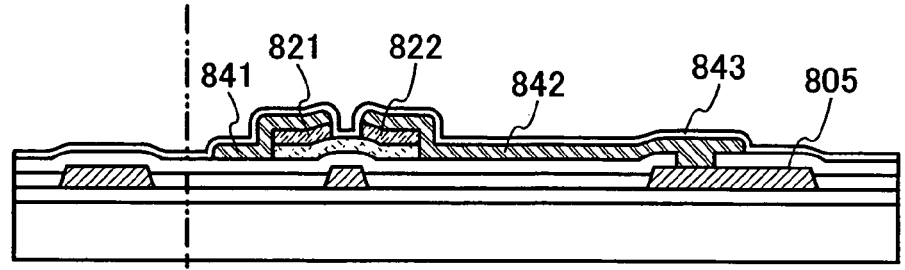
FIGS. 18A to 18D are explanatory cross-sectional views for showing a manufacturing process of a semiconductor device according to the present invention.
Figure 22:
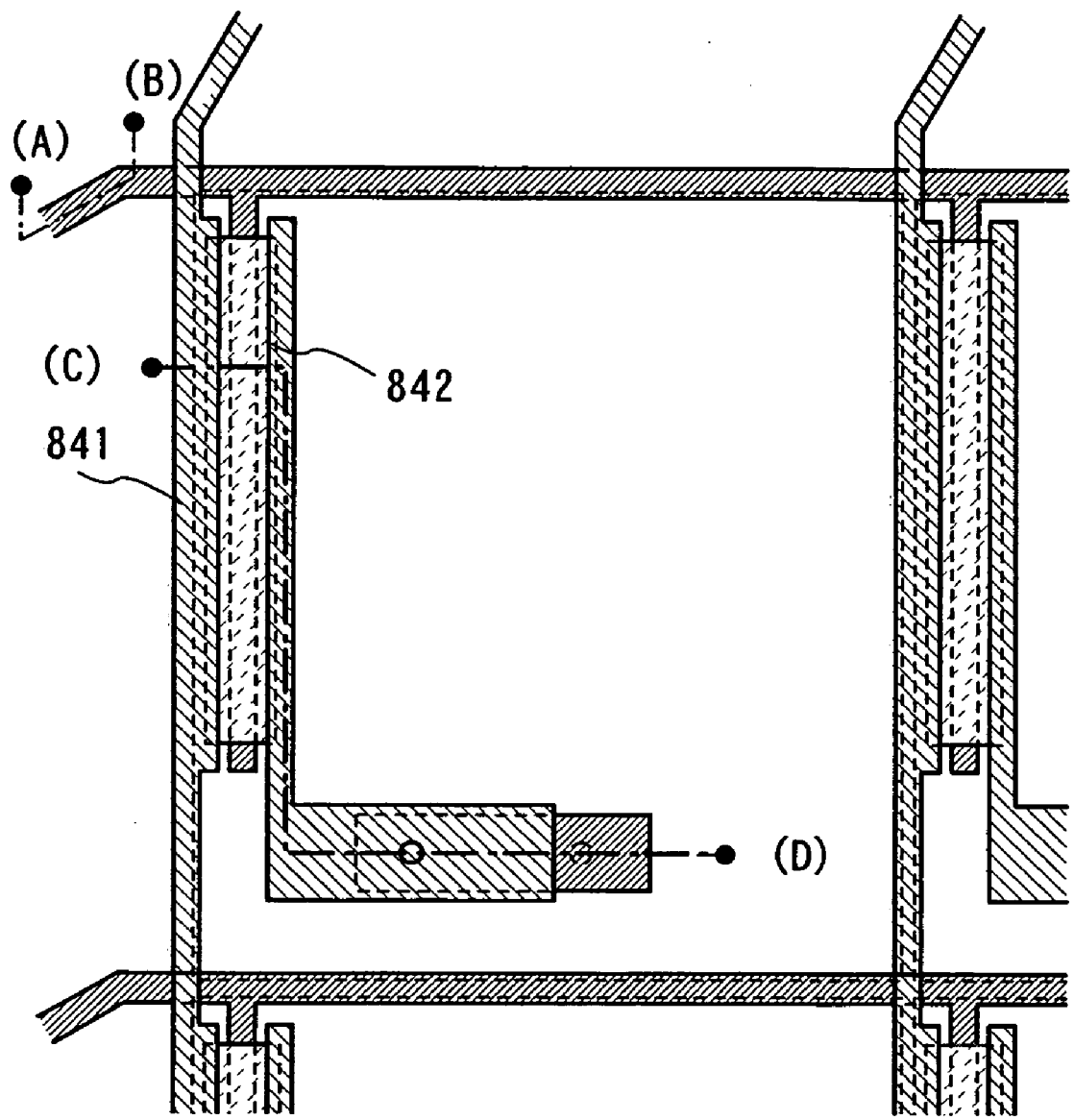
FIG. 22 is an explanatory top view for showing a manufacturing process of a semiconductor device according to the present invention.

As illustrated in FIG. 18A, second conductive layers 841, 842 are formed by droplet discharging. The second conductive layer serves as a source wiring layer and a drain wiring layer afterwards. Here, the second conductive layer 841 is formed to connect to the first semiconductor region 821, whereas the second conductive 842 is formed to connect to the first semiconductor region 822 and the connecting conductive layer 805. The second conductive layers 841, 842 are formed by discharging solution dispersed with Ag (silver) particles, and heating to be dried at 100° C. for 30 minutes, then, heating to be baked at 230° C. for 1 hour in the presence of oxygen having concentration of 10%. FIG. 18A illustrating a longitudinal sectional structure and FIG. 22 illustrating a planar structure of FIG. 18A taken along line A–B and C–D are referred simultaneously.

Then, a protective film 843 is formed. A silicon nitride film is formed by sputtering using a silicon target and a sputtering gas of argon and nitrogen (flow ratio of $Ar:N_2=1:1$) to have a thickness of 100 nm as the protective film.

Figure 18B:
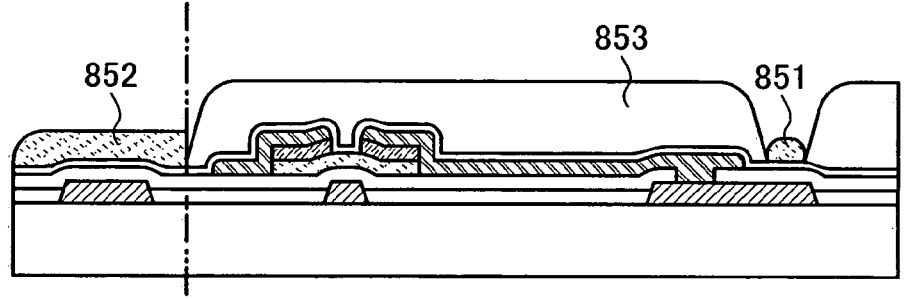

As illustrated in FIG. 18B, sixth mask patterns 851, 852 are formed over a region where the protective film 843 is overlapped with the connecting conductive layer 805, a region where the protective film 843 is overlapped with a region where the gate wiring layer is connected to a connecting terminal, and a region where the protective film 843 is overlapped with a region where the source wiring layer is connected to a connecting terminal (not shown). Then, an interlayer insulating film 853 is formed. The sixth mask pattern is a mask used for forming an interlayer insulating film afterwards. As the sixth mask pattern, solution for forming a liquid-shedding surface (solution prepared by dissolving fluoride silane coupling agent into solvent) is discharged, and polyimide is discharged by droplet discharging as the interlayer insulating film 853, and both of the discharged layers are heated to be baked at 200° C. for 30 minutes and 300° C. for 1 hour.

As a material for the interlayer insulating film 853, heat-resisting organic resin such as polyimide, acrylic, polyamide, or siloxane; inorganic material; low dielectric constant (low-k) material; silicon oxide; silicon nitride; silicon oxynitride; silicon nitride oxide; PSG (phosphorus glass), BPSG (phosphorus boron glass); an alumina film; and the like can be used.

Figure 18C:
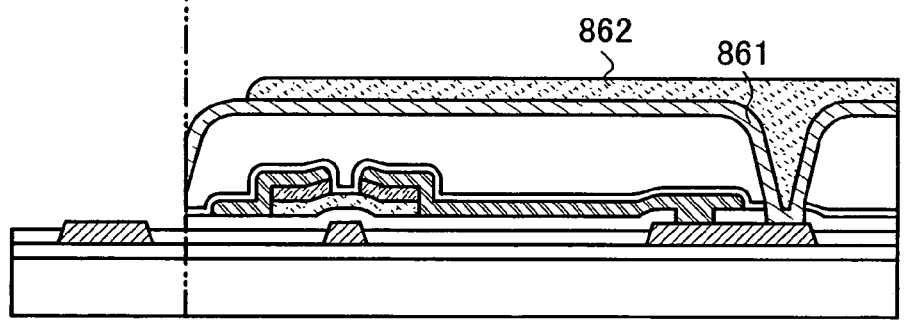

Then, as shown in FIG. 18C, the sixth mask pattern 851, 852 are etched by using a mixed gas of $CF_4$, $O_2$, He (flow ratio of $CF_4:O_2:He=8:12:7$), and a part of the protective film 843 and the gate insulating film 814 is etched to form a second contact hole. By this etching process, the protective film 843 and the gate insulating film 814 in the region where the gate wiring layer is connected to the connecting terminal and the region where the source wiring layer is connected to the connecting terminal are also etched.

After forming the third conductive layer 861, a seventh mask pattern 862 is formed. The third conductive film 861 is formed by using indium tin oxide (ITO) containing silicon oxide to have a thickness of 110 nm by sputtering, and discharging polyimide serving as a eighth mask pattern by dropping into a region provided with a pixel electrode afterwards to be heated at 200° C. for 30 minutes.

In this example, the pixel electrode is formed by ITO containing silicon oxide to manufacture a transparent liquid crystal display panel. Instead, the pixel electrode may be formed by forming a predetermined pattern by solution including indium tin oxide (ITO), zinc oxide (ZnO), indium zinc oxide (IZO), zinc oxide doped with gallium (GZO), or indium tin oxide containing silicon oxide, and baking the pattern. In the case of manufacturing a reflective liquid crystal display panel, solution including metal particles as its main component such as Ag (silver), Au (gold), Cu (copper), W (tungsten), or Al (aluminum) can be used.

Figure 18D:
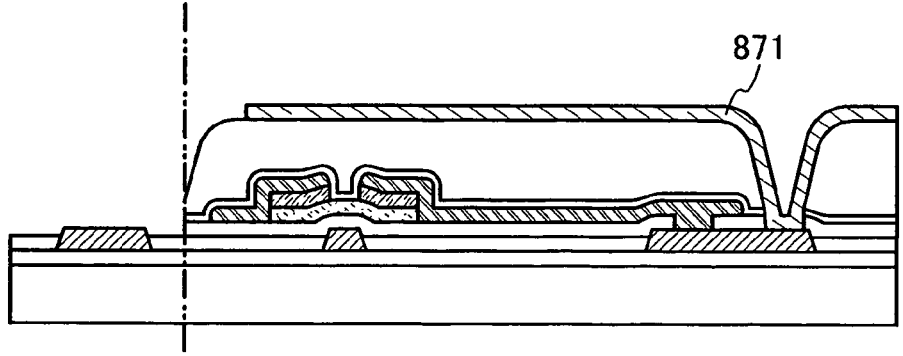
Figure 23:
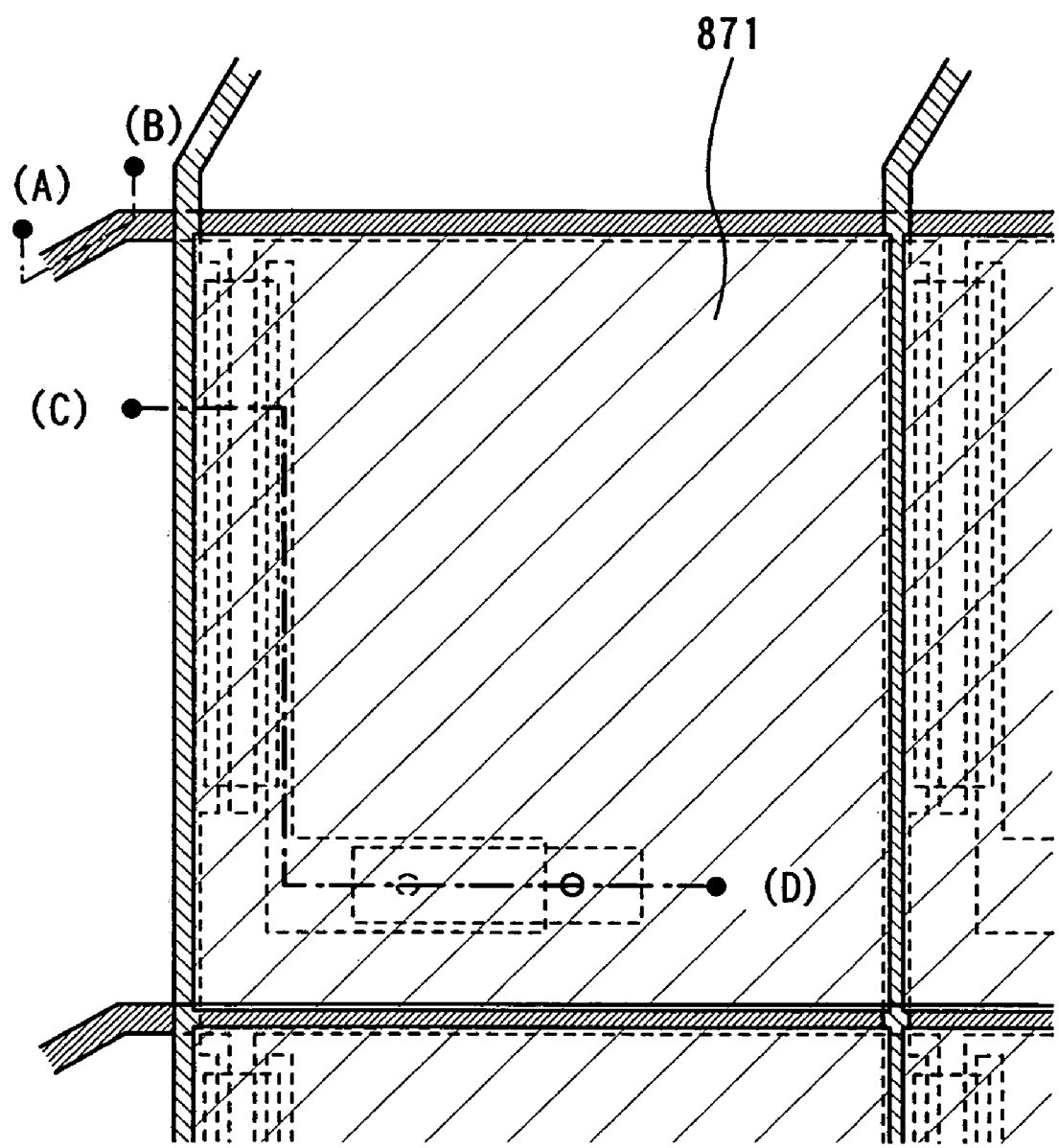
FIG. 23 is an explanatory top view for showing a manufacturing process of a semiconductor device according to the present invention.

As illustrated in FIG. 18D, a first pixel electrode 871 is formed by etching the third conductive layer 861 by using the seventh mask pattern. By this etching process, the third conductive layer 861 provided to the region where the gate wiring layer is connected to the connecting terminal and the region where the source wiring layer is connected to the connecting terminal is also etched. Thereafter, the seventh mask pattern is exfoliated by using stripper. FIG. 23 is a plain view of FIG. 18D taken along lines A–B and C–D.

The first pixel electrode 871 is connected to the connecting conductive layer 805 in the second contact hole. Since the connecting conductive layer 805 is connected to the second conductive layer 842, the first pixel electrode 871 and the second conductive layer 842 are electrically conducted to each other. In this example, the second conductive layer 842 is made from silver (Ag), and the pixel electrode 871 is made from ITO containing silicon oxide. The second conductive layer 842 and pixel electrode 871 are not directly connected with each other, and so silver is not oxidized. Accordingly, the drain wiring and the pixel electrode can be electrically connected without increasing contact resistance.

As another method for forming the first pixel electrode 871, the pixel electrode can be formed by selectively dropping solution containing a conductive material by droplet discharging without an etching process. Moreover, the pixel electrode can be formed by discharging solution having a conducting property after forming solution for forming a liquid-shedding surface as a mask pattern to a region where pixel electrode is not provided afterwards. In this instance, a mask pattern can be removed by ashing using oxygen. Alternatively, the mask pattern may not be removed to be left.

In accordance with the foregoing processes, an active matrix substrate can be formed.

Figure 19A:
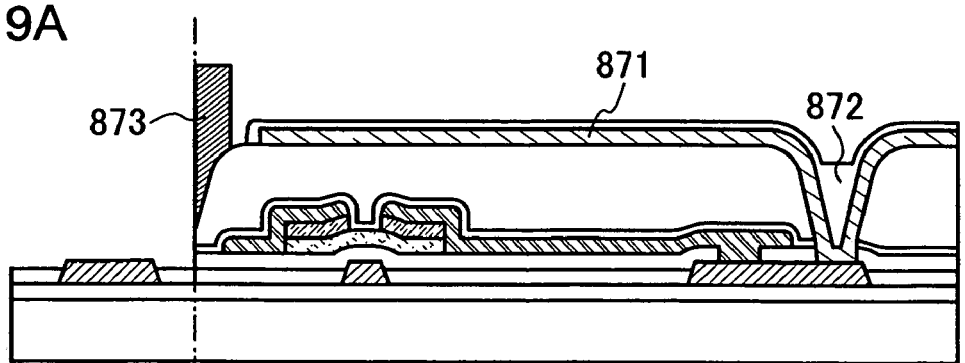
FIGS. 19A to 19C are explanatory cross-sectional views for showing a manufacturing process of a semiconductor device according to the present invention.

As illustrated in FIG. 19A, an insulating film is formed to cover the first pixel electrode 871 by printing or spin coating, and an oriented film 872 is formed by rubbing treatment. In addition, the oriented film 872 can be formed by oblique evaporation.

Sealant 873 in the shape of a closed loop is formed by droplet discharging to the peripheral region of the pixel. A liquid crystal material is dropped inside the closed loop formed by the sealant 873 by dispenser (dropping) technique.

Figure 25A:
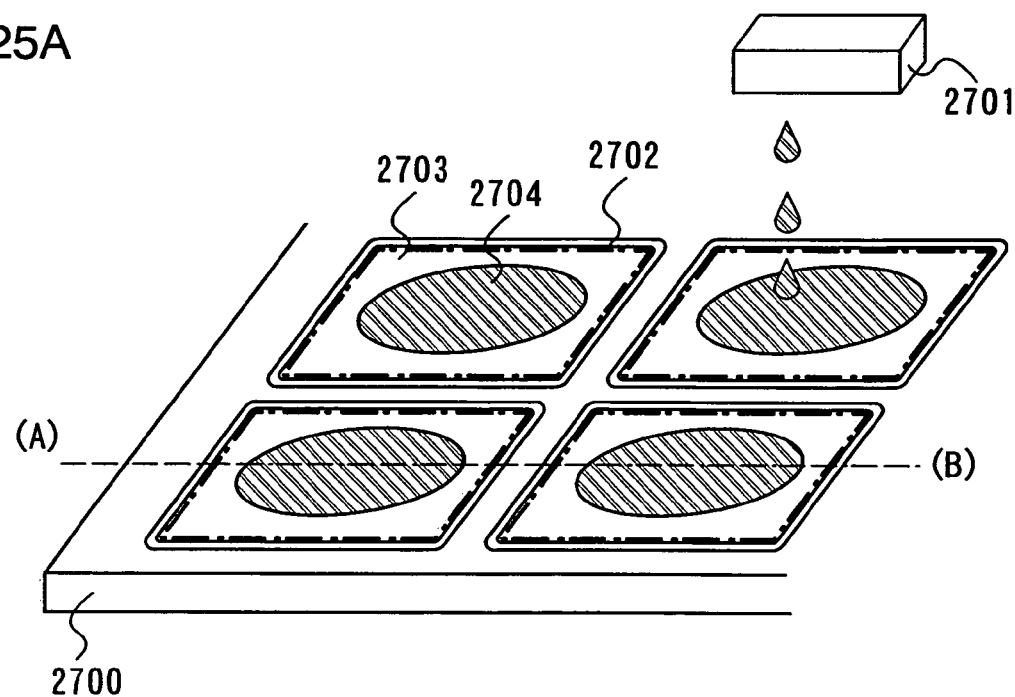
FIGS. 25A and 25B are explanatory views for showing droplet discharging that can be applied to the present invention.
Figure 25B:
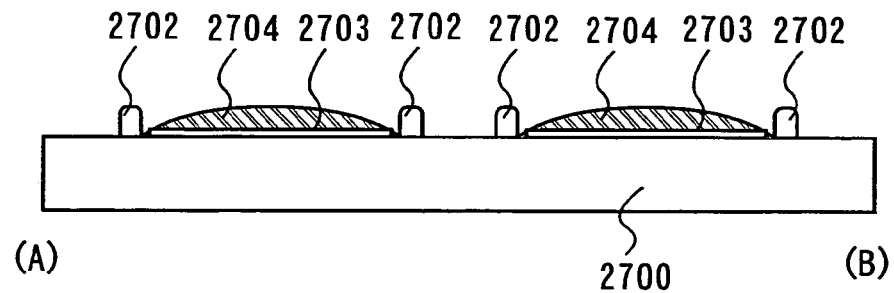

A process of dropping a liquid crystal material is explained with reference to FIGS. 25A and 25B. FIG. 25A is a perspective view of a process for dropping a liquid crystal material by a dispenser 2701. FIG. 25B is a cross-sectional view of FIG. 25A taken along line of A–B.

A liquid crystal material 2704 is dropped or discharged from a liquid crystal dispenser 2701 to cover a pixel portion 2703 surrounded by sealant 2702. A liquid crystal layer can be formed by moving the liquid crystal dispenser 2701, or fixing the liquid crystal dispenser 2701 and moving a substrate 2700. Alternatively, a plurality of liquid crystal dispensers can be installed to drop a liquid crystal material to a plurality of pixel portions simultaneously.

As illustrated in FIG. 25B, the liquid crystal material 2704 can be selectively dropped or discharged only to a region surrounded by the sealant 2702.

Here, the liquid crystal material is dropped to the pixel portion. Alternatively, a substrate having a pixel portion can be pasted onto an opposing substrate after dropping the liquid crystal material at the side of the opposing substrate.

Figure 19B:
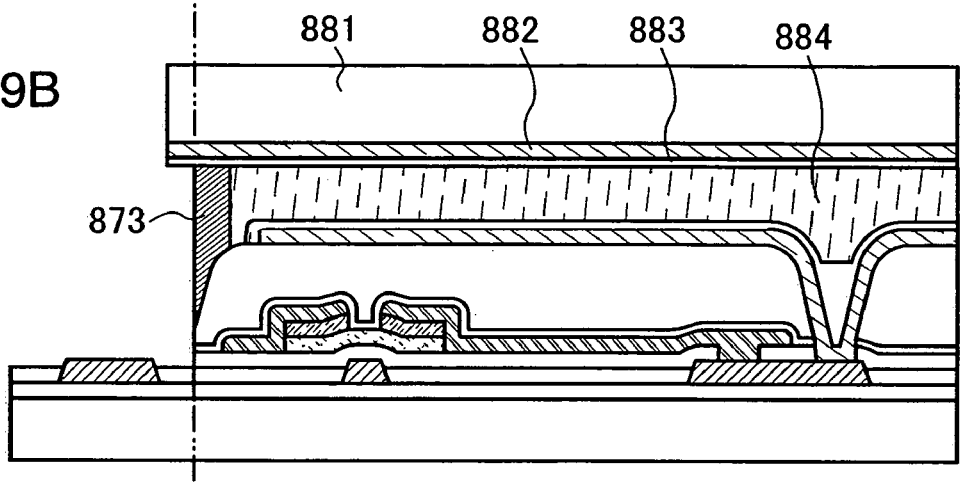

As illustrated in FIG. 19B, an opposing substrate 881 provided with an oriented film 883 and a second pixel electrode (opposing electrode) 882 is pasted to the substrate 800 in vacuo, and a liquid crystal layer 884 filled with a liquid crystal material is formed by ultra violet curing.

The sealant 873 may be mixed with filler, and the opposing substrate 881 may be provided with a color filter, a shielding film (black matrix), and the like. Further, dispenser technique (dropping technique) or dip technique (pumping technique) by which a liquid crystal material is injected by utilizing a capillary phenomenon after pasting the opposing substrate can be used as a method for forming the liquid crystal layer 884.

Figure 19C:
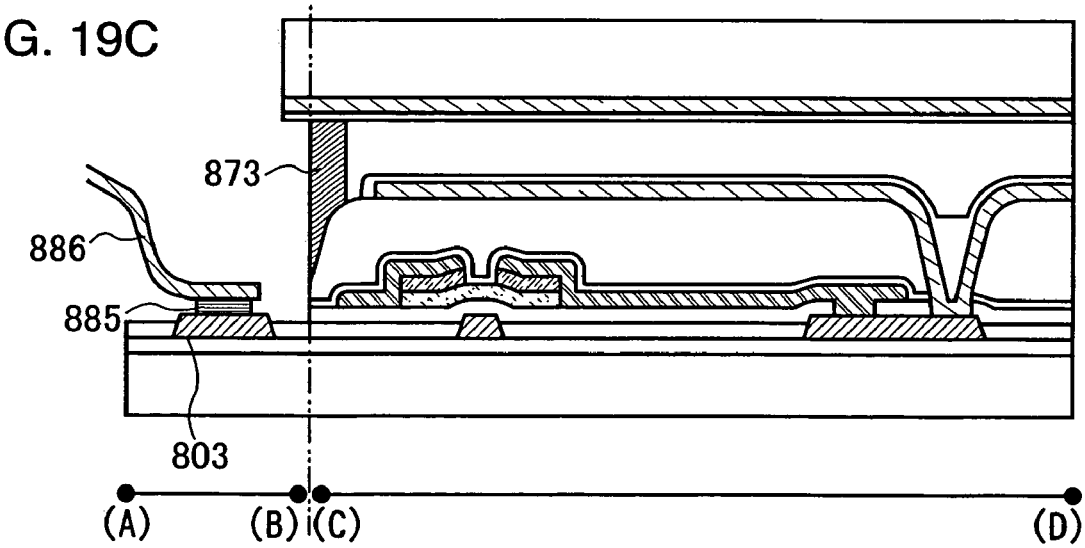

As illustrated in FIG. 19C, in the case that an insulating film is formed over each terminal portion of the gate wiring layer 803 and a source wiring layer (not shown), a connecting terminal is pasted onto the gate wiring layer 803 and the source wiring layer via an anisotropic conductive layer 885 after removing the insulating film (a connecting terminal 886 connected to the gate wiring layer; the connecting terminal connected to the source wiring layer are not shown). Moreover, connecting portions of each of the wiring layers and the connecting terminals are preferably sealed by resin. The structure can prevent moisture from a cross section from penetrating into the pixel portion and prevent deterioration of the panel. In accordance with the foregoing processes, a liquid crystal display panel can be formed.

In accordance with the foregoing processes, a liquid crystal display panel can be formed. A protective circuit for preventing electrostatic destruction as typified by a diode may be provided between the connecting terminal and the source wiring (gate wiring), or in a pixel portion. In this instance, the diode can be operated as a diode by forming in accordance with the same process as that of the foregoing TFT and connecting to the gate wiring layer of the pixel portion and the drain or the source wiring layer of the diode.

Any one of Embodiments 1 to 7 can be applied to this example.

EXAMPLE 2

In this example, a method for manufacturing a light-emitting display panel as a display panel is explained with reference to FIGS. 27A to 34. FIGS. 27A to 34 illustrate schematic longitudinal sectional structures of a pixel portion and a connecting terminal portion. FIGS. 31 to 34 are plane views of FIGS. 27A to 34 taken along lines of C–D, and E–F. Line A–B in FIGS. 27A to 34 indicates connecting terminal portions, and lines C–D and E–F in FIGS. 27A to 34 indicates regions provided with a switching TFT, a driver TFT, and a light-emitting element in each pixel in a pixel portion. In this example, a first insulating layer is, but not exclusively, formed by using Embodiment 1. Embodiment 2 can also be used for forming the first insulating layer. In addition, the first conductive layer explained in Embodiment 3 can be appropriately used as a first conductive layer.

As illustrated in FIG. 27A, the surface of a substrate 2001 is oxidized at 400° C. to form an insulating film 2002 having a thickness of 100 nm as is the case with Example 1. Then, first conductive layers 2003 to 2006 are formed. In this example, Ag paste is discharged by droplet discharging to be dried and baked. Then, the first conductive layers 2003 to 2006 are formed. The first conductive layer 2003 serves as a gate wiring layer, the first conductive layers 2004 and 2006 serve as gate electrode layers, and the first conductive layer 2005 serves as a capacitor electrode layer.

First insulating layers 2007 to 2012 are formed to fill between the gate wiring layer 2003, the gate electrode layers 2004, 2006, and the capacitor electrode layer 2005. The insulating layers are formed by discharging polyimide by droplet discharging.

As illustrated in FIG. 28B, a gate insulating film 2021, a first semiconductor film 2022, and a second semiconductor film 2023 imparting n-type conductivity are formed by plasma CVD as is the case with Example 1. First mask patterns 2024 to 2027 are formed over the second semiconductor film to be formed over a region where the first semiconductor region is formed afterwards. The first mask patterns can be formed similarly to the second mask patterns 817, 818 explained in Example 1.

According to the process, the gate insulating film 2021 having excellent uniformity in a thickness and a excellent step coverage property can be formed.

Then, second semiconductor film 2032 is etched by using the first mask pattern as is the case with Example 1 to form first semiconductor regions 2031 to 2034 as illustrated in FIG. 27C. Thereafter, the first mask pattern is exfoliated by using stripper.

Figure 31:
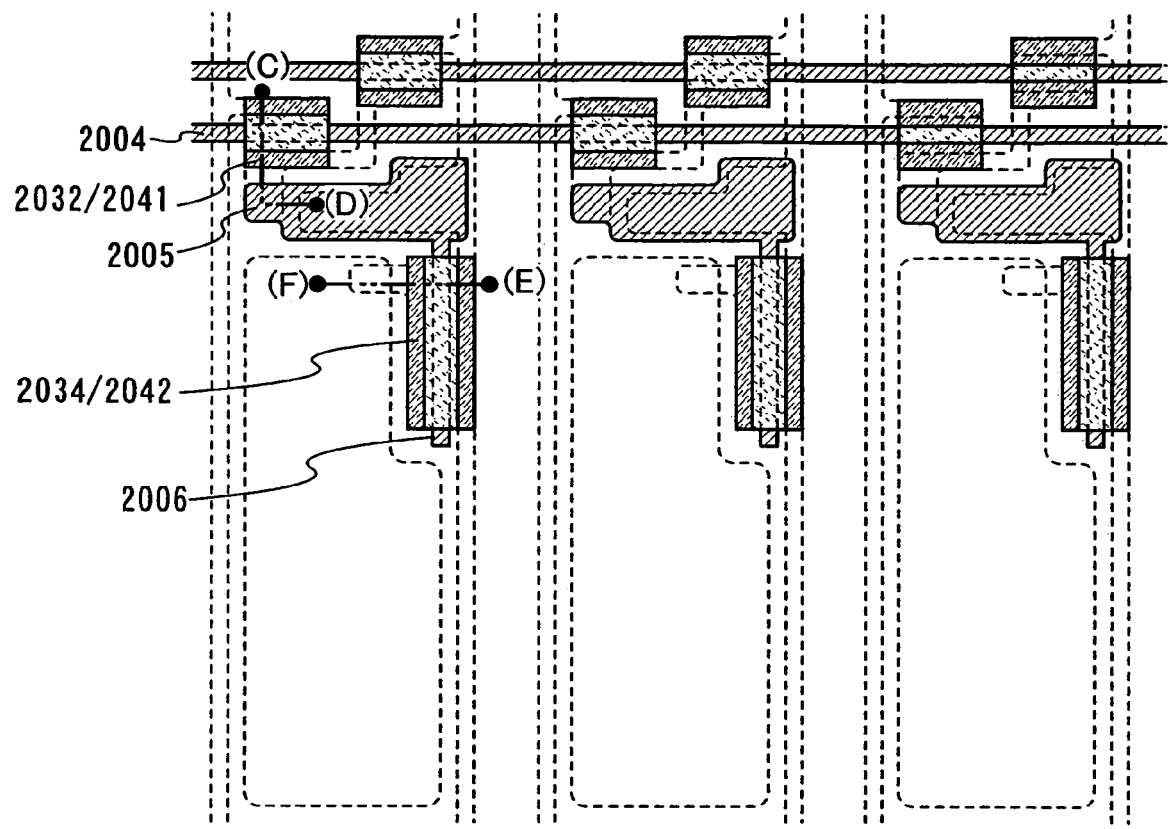
FIG. 31 is an explanatory top view for showing a manufacturing process of a semiconductor device according to the present invention.

Second mask patterns 2035, 2036 are formed to cover the first semiconductor regions 2031 to 2034 and the first semiconductor film 2022 formed between the first semiconductor regions 2031 to 2034. Second semiconductor regions 2041, 2042 as illustrated in FIG. 28A are formed and a part of the gate insulating film 2021 is exposed by etching the first semiconductor film 2022 by using the second mask patterns 2035, 2036. Thereafter, the second mask patterns 2035, 2036 are exfoliated by using stripper. FIG. 31 illustrating the planar structure taken along lines of C–D and E–F is also referred.

Third mask patterns 2043, 2044 are formed as is the case with Example 1. The third mask patterns 2043, 2044 are formed by discharging solution for forming a liquid-shedding surface by droplet discharging to a region where the gate insulating film 2021 and the capacitor electrode layer 2005 are overlapped with each other and a region where the gate insulating film 2021 and the gate wiring layer 2003 are overlapped with each other. Then, fourth mask patterns 2045, 2046 are formed. The fourth mask patterns are masks for forming a first contact hole and formed by droplet discharging of polyimide to be heated at 200° C. for 30 minutes. In this instance, since the third mask patterns 2043, 2044 have a liquid-shedding property and the fourth mask patterns 2045, 2046 have a liquid-attracting property, the fourth mask patterns 2045, 2046 are not formed in a region provided with the third mask patterns 2043, 2044.

A part of the gate insulating film 2021 is exposed by removing the third mask patterns 2043, 2044 by oxygen ashing. Then, the exposed gate insulating film is etched by using the fourth mask patterns 2045, 2046 in accordance with the procedure conducted in Example 1. Thereafter, the fourth mask patterns are exfoliated by oxygen ashing and etching treatment using stripper.

Figure 32:
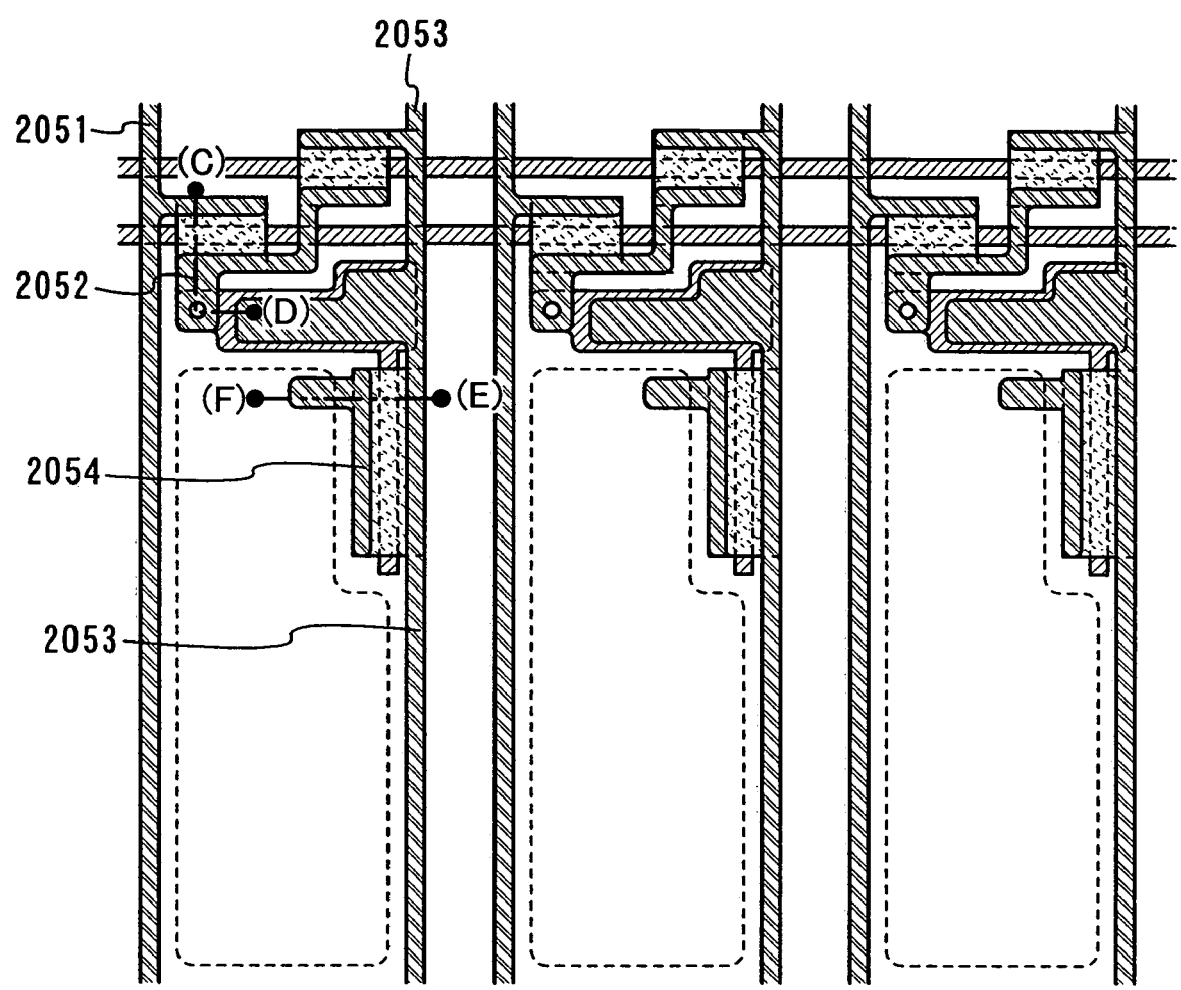
FIG. 32 is an explanatory top view for showing a manufacturing process of a semiconductor device according to the present invention.

As illustrated in FIG. 28C, the second conductive layers 2051 to 2054 are formed by droplet discharging. The second conductive layer serves as source and drain wiring layers afterwards. Here, the second conductive layer 2051 is connected to the first semiconductor region 2031; the second conductive layer 2052 is connected to the first semiconductor region 2032 and the capacitor electrode layer 2005; the second conductive layer 2053 is connected to the first semiconductor region 2033; and the second conductive layer 2054 is connected to the first semiconductor region 2034. Further, FIG. 32 is a planar view of FIG. 28C taken along lines of C–D and E–F. As illustrated in FIG. 32, the second conductive layer 2053 serves as a power source line and a capacitor wiring.

By the foregoing processes, a switching TFT 2060a, a driver TFT 2060c, a capacitor 2060b, and an active matrix substrate comprising the foregoing components can be formed.

As illustrated in FIG. 29A, a third conductive film is formed to be etched into a desired shape by using a fifth mask pattern, and a first pixel electrode 2055 connected to the second conductive layer 2054 of the driver TFT 2060c is formed. The third conductive film is formed by using indium tin oxide (ITO) containing silicon oxide to have a thickness of 110 nm as is the case with Example 1, and etching into a desired shape to form the first pixel electrode 2055. In this etching process, the third conductive layer may be etched, which is provided in a region where the gate wiring layer and the source wiring layer are connected to the connecting terminal.

As another method for forming a pixel electrode, the pixel electrode can be formed by dropping selectively solution containing a conductive material by droplet discharging without etching treatment. Moreover, the pixel electrode can also be formed by forming solution for forming a liquid shedding surface as a mask pattern to a region where the pixel electrode is not provided afterwards, and discharging solution having a conducting property. In this instance, the mask pattern can be removed by ashing using oxygen. Alternatively, the mask pattern may not be removed to be left.

Instead of the foregoing materials for the pixel electrode, indium tin oxide (ITO), zinc oxide (ZnO), indium zinc oxide (IZO), zinc oxide doped with gallium (GZO), or indium tin oxide containing silicon oxide can be used.

In this example, since the panel has the structure in which light is emitted in the direction of the substrate 2001, that is, a transparent light-emitting display panel, the pixel electrode is formed by a conductive film transparent to light. In the case that a panel having the structure in which light is emitted in the opposite direction of the substrate 2001, that is, a reflective light-emitting display panel, solution containing metal particles such as Ag (silver), Au (gold), Cu (copper), W (tungsten), or Al (aluminum) as its main components can be used.

Figure 33:
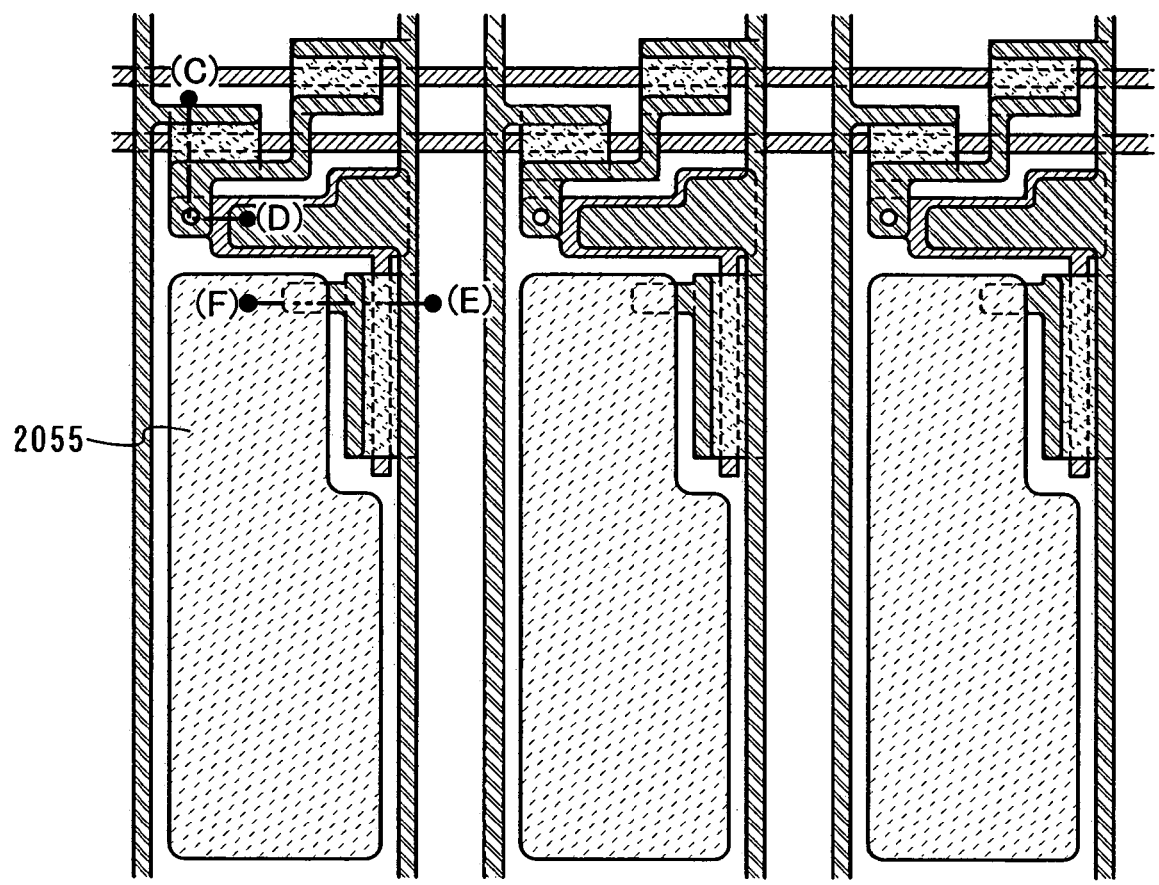
FIG. 33 is an explanatory top view for showing a manufacturing process of a semiconductor device according to the present invention.

Thereafter, a fifth mask pattern is exfoliated by using stripper. FIG. 33 is a planar view of FIG. 29A taken along lines C–D and E–F.

A protective layer 2061 of silicon nitride or silicon nitride oxide and an insulator layer 2062 are formed all over the surface. The insulator layer 2062 is formed by spin coating or dipping all over the surface, and an opening is formed thereto by etching as illustrated in FIG. 29B. By etching the protective layer below the insulator layer, the first pixel electrode 2055 is processed to be exposed. Further, the etching processing is not always required in the case of forming the insulator layer 2062 by droplet discharging.

The insulator layer 2062 is formed around the position that is provided with a pixel corresponding to the first pixel electrode 2055. The insulator layer 2062 can be formed by an inorganic insulating material such as silicon oxide, silicon nitride, silicon oxynitride, aluminum oxide, aluminum nitride, aluminum oxynitride, or another material; acrylic acid; methacrylic acid; derivatives of these materials; heat resistant high molecular material such as polyimide, aromatic polyamide, or polybenzimidazole; an inorganic siloxane insulating material including a Si—O—Si bond, among the compound made from silicon, oxygen, and hydrogen, formed by using a siloxane-based material as a start material; or an organic siloxane insulating material in which hydrogen connected to silicon is substituted by an organic group such as methyl or phenyl can be used.

Figure 34:
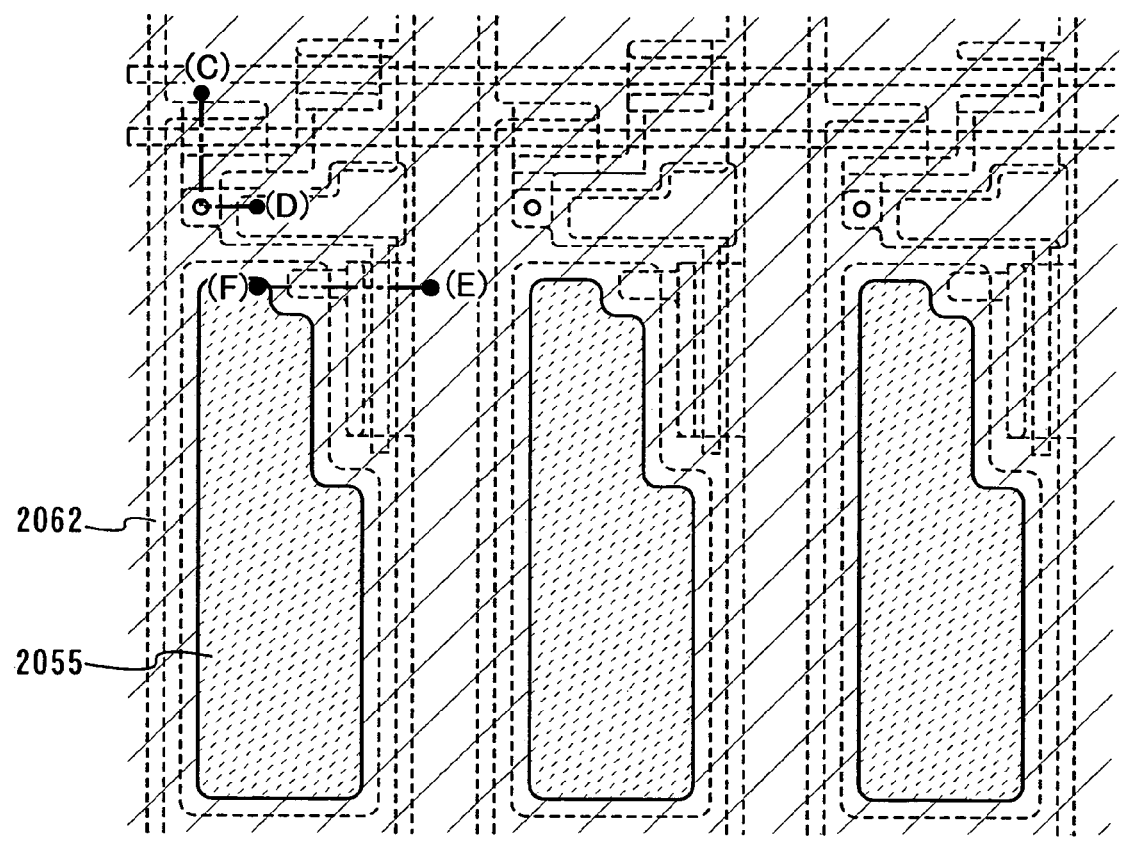
FIG. 34 is an explanatory top view for showing a manufacturing process of a semiconductor device according to the present invention.

A photosensitive or non-photosensitive material such as polyimide and acrylic is preferably used for forming the insulator layer since the insulator layer can be formed to have a radius of curvature varying consistently and a thin upper film formed without stepped cut. Further, an interlayer insulating film can be formed by an insulating film containing coloring pigment, resist, or the like. In this instance, the contrast of a display device manufactured afterwards is improved since the interlayer insulating film serves as a light-shielding film. FIG. 34 is a planar view of FIG. 29B taken along lines of C–D and E–F.

As illustrated in FIG. 30A, a layer 2073 containing a light-emitting substance is formed by vapor deposition, spin coating, or coating such as ink jetting, and a second pixel electrode 2074 is formed, then, a light-emitting element 2075 is formed. The light-emitting element 2075 is connected to the driver TFT 2060c. Thereafter, a protective lamination layer (not shown) is formed to seal the light-emitting element 2075. The protective lamination layer is composed of a first inorganic insulating film, a stress relieving film, and a second inorganic insulating film.

Before forming a layer containing a light-emitting substance 2073, moisture adsorbed into the insulator layer 2062 or to the surface thereof is removed by heat treatment at 200° C. in the atmosphere. The layer 2073 containing a light-emitting substance is preferably formed by heat treatment at a reduced pressure at 200 to 400° C., preferably, 250 to 350° C., and vapor deposition without exposing to the air or droplet discharging under reduced pressure.

The surface treatment of the surface of the first pixel electrode 2055 may be carried out by treating in oxygen plasma or emitting ultraviolet light.

The layer containing a light-emitting substance 2073 can be formed by a light-emitting material and a charge injecting transporting substance containing an organic or inorganic compound to contain one kind or a plurality kinds of layers selected from the group consisting of a low molecular based organic compound, a intermediate molecular based organic compound (an organic compound which does not have a subliming property and has molecularity of 20 or less, or the length of continuous molecule is 10 μm or less, typically, dendrimer, oligomer, or the like), and high molecular based organic compound, and can be combined with an inorganic compound having an electron injecting and transporting property or a hole injecting and transporting property.

Among charge injecting transporting substances, as a material having especially a high electron transporting property, for example, a metal complex or the like having a quinoline skeleton or a benzoquinoline skeleton such as tris(8-quinolinolato)aluminum (abbreviated as $Alq_3$), tris(4-methyl-8-quinolinolato)aluminum (abbreviated as $Almq_3$), bis(10-hydroxybenzo[h]-quinolinato)beryllium (abbreviated as $BeBq_2$), bis(2-methyl-8-quinolinolato)(4-phenylphenolato)aluminum (abbreviated as BAlq).

As a material having a high hole transporting property, for example, aromatic amine (that is, the one having a benzene ring-nitrogen bond) based compounds such as 4,4'-bis[N-(1-naphthyl)-N-phenyl-amino]-biphenyl (abbreviated as α-NPD), 4,4'-bis[N-(3-methylphenyl)-N-phenyl-amino]biphenyl (abbreviated as TPD), 4,4',4"-tris(N,N-diphenyl-amino)-triphenylamine (abbreviated as TDATA), 4,4',4"-tris[N-(3-methylphenyl)-N-phenyl-amino]-triphenylamine (abbreviated as MTDATA).

Among charge injecting transporting substances, as a material having a high electron injecting property, a compound of an alkali metal or an alkali earth metal such as lithium fluoride (LiF), cesium fluoride (CsF), calcium fluoride ($CaF_2$), or the like can be nominated. Besides, a mixture of a material having a high electron transportation property such as $Alq_3$ and an alkali earth metal such as magnesium (Mg).

Among charge injecting transporting substances, as a material having a high hole injecting property, for example, metal oxide such as molybdenum oxide (MoOx), vanadium oxide (VOx), ruthenium oxide (RuOx), tungsten oxide (WOx), manganese oxide (MnOx), or the like can be nominated. Besides, a phthalocyanine compound such as phthalocyanine (abbreviated $H_2Pc$) or copper phthalocyanine (CuPc) can be nominated.

A light-emitting layer may have the structure in which each of light-emitting layers having different emission wavelength bands is respectively provided to each pixel for color display. Typically, light-emitting layers corresponding to color of R (red), G (green), and B (blue) are formed. In this instance, color purity can be improved and a pixel portion can be prevented from being a mirror surface (reflection) by providing a filter (colored layer) transparent to light in each emission wavelength bands at the light emission side of the pixel. By providing the filter (colored layer), a circularly-polarized light plate or the like that is conventionally required becomes not required, further, light can be emitted from the light-emitting layer without loss of light. Moreover, color changes occurred in the case of viewing obliquely the pixel portion (display screen) can be further reduced.

There are various light-emitting materials for forming a light-emitting layer. As a low molecular based organic light-emitting material. 4-dicyanomethylene-2-methyl-6-[2-(1,1,7,7-tetramethyljulolidine-9-yl)ethenyl]-4H-pyran (abbreviated as DCJT), 4-dicyanomethylene-2-t-butyl-6-[2-(1,1,7,7-tetramethyljulolidine-9-yl)ethenyl]-4H-pyran, periflanthen, 2,5-dicyano-1,4-bis[2-(10-methoxy-1,1,7,7-tetramethyljulolidine-9-yl)ethenyl]benzene, N,N'-dimethylquinacridon (abbreviated as DMQd), coumarin6, coumarin545T, tris(8-quinolinolato)aluminum (abbreviated as $Alq_3$), 9,9'bianthryl, 9,10-diphenylanthracene (abbreviated as DPA), 9,10-bis(2-naphthyl)anthracene (abbreviated as DNA), or the like can be used. Another material may be used.

A high molecular based organic light-emitting material has higher physical strength than that of a low molecular based organic light-emitting material, and so a light-emitting element can be manufactured to have high durability. A light-emitting element can be comparatively readily manufactured since a light-emitting layer can be formed by coating. A structure of a light-emitting element using a high molecular based organic light-emitting material is basically same as that of a light-emitting element using a low molecular based organic light-emitting material. The structure is formed by stacking sequentially a cathode, an organic light-emitting layer, and an anode. However, in the case of forming a layer containing a light-emitting substance by using a high molecular based organic light-emitting material, it is difficult to form a layered structure like in the case of using a low molecular based organic light-emitting material. Most light-emitting structures have a two-layered structure. Specifically, a structure formed by stacking sequentially a cathode, a light-emitting layer, a hole transporting layer, and an anode.

Since emission color is dependent on a material for forming a light-emitting layer. By selecting the material, a light-emitting element that exhibits desired light emission can be formed. As a high molecular based light-emitting material, a polyparaphenylene vinylene based material, a polyparaphenylene based material, polythiophene based material, or a polyfluorene based material can be nominated.

As the polyparaphenylene vinylene based material, a derivative of poly(paraphenylene vinylene) [PPV], poly(2,5-dialkoxy-1,4-phenylen vinylene) [RO-PPV], poly(2-(2'-ethyl-hexoxy)-5-methoxy-1,4-phenylene vinylene) [MEH-PPV], poly(2-dialkoxyphenyl)-1,4-phenylenevinylene] [ROPh-PPV], and the like are nominated. As the polyparaphenylene based material, a derivative of polyparaphenylene [PPP], poly(2,5-dialkoxy-1,4-phenylene) [RO-PPP], poly(2,5-dihexoxy-1,4-phenylene), and the like are nominated. As the polythiophene based material, a derivative of polythiophene [PT], poly(3-alkylthiophene) [PAT], poly(3-hexylthiophene) [PHT], poly(3-cyclohexylthiophene) [PCHT], poly(3-cyclohexyl-4-methylthiophene) [PCMHT], poly(3,4-dicyclohexylthiophene) [PDCHT], poly[3-(4-octylphenyl)-thiophene] [POPT], poly[3-(4-octylphenyl)-2,2-bithiophene] [PTOPT], and the like are nominated. As the polyfluorene based material, a derivative of polyfluorene [PF], poly(9,9-dialkylfluorene) [PDAF], poly(9,9-dioctylfluorene) [PDOF], and the like are nominated.

A hole injecting property from the anode can be improved by interposing a high molecular based organic light-emitting material having a hole transporting property between the anode and a high molecular based organic light-emitting material having a light-emitting property. Generally, the high molecular based organic light-emitting material having a hole transporting property and an acceptor material dissolved in water is coated by spin coating. The high molecular based organic light-emitting material having a hole transporting property is not dissolved in organic solvent, accordingly, the material can be stacked over the organic light-emitting material having a light-emitting property. As the high molecular based organic light-emitting material having a hole transporting property, mixture of PEDOT and camphoric sulfonic acid (CSA) as an acceptor material, mixture of polyaniline [PANI] and polystyrene sulfonic acid [PSS] as an acceptor material, and the like can be nominated.

The light-emitting layer can be formed to exhibit mono emission color or white emission color. In the case of using a white emission material, color display can be realized when a color filter that transmits light at a specified wavelength is provided at the side of light emission of a pixel.

To form a light-emitting layer that exhibits white emission, for example, $Alq_3$, $Alq_3$ partly doped with Nile red (Nile red is a red pigment), $Alq_3$, p-EtTAZ, TPD (aromatic diamine) are deposited sequentially by vapor deposition. In the case that the light-emitting layer is formed by coating using spin coating, the material is preferably baked by vacuum heating after being coated. For example, poly (ethylene dioxythiophene)/poly(styrene sulfonate) solution (PEDOT/PSS) may be coated over a whole surface and baked, and polyvinylcarbazole (PVK) doped with emission center pigments (1,1,4,4-tetraphenyl-1,3-butadiene (abbreviated TPB), 4-dicyanomethylene-2-methyl-6-(p-dimethylamino-styryl)-4H-pyran (DCM1), Nile red, coumarin 6, or the like) solution may be coated over a whole surface and baked to form the light-emitting layer.

The light-emitting layer may be formed by a single layer. In this instance, the light-emitting layer may be made from polyvinylcarbazole (PVK) having a hole transport property dispersed with a 1,3,4-oxadiazole derivative (PBD) having an electron transporting property. Further, white emission can be obtained by dispersing PBD of 30 wt % as an electron transporting agent and dispersing an appropriate amount of four kinds of pigments (TPB, coumarin 6, DCM1, and Nile red). In addition to the light-emitting element that exhibits white emission as explained in the foregoing, a light-emitting element that can exhibit red emission, green emission, or blue emission can be manufactured by selecting approximately a material of a light-emitting layer.

Furthermore, a triplet excited light-emitting material including a metal complex or the like may be used for the light-emitting layer in addition to a singlet excited light-emitting material. For example, among a pixel having red light-emitting properties, a pixel having green light-emitting properties, and a pixel having blue light-emitting properties, the pixel having red light-emitting properties with comparatively short half reduced luminescence time is formed from a triplet excited light-emitting material, and other pixels are formed from a singlet excited light-emitting material. Since the triplet excited light-emitting material has superior luminous efficiency, there is a feature that lower power consumption is required to obtain the same luminance. In other words, in the case of applying the triplet excited light-emitting material to a red pixel, a few amount of current flown to a light-emitting element is required; therefore, the reliability can be enhanced. The pixel having red light-emitting properties and the pixel having green light-emitting properties may be formed from a triplet excited light-emitting material and the pixel having blue light-emitting properties may be formed from a singlet excited light-emitting material to reduce the power consumption. Further low power consumption can be realized by also forming the green light-emitting element, which has high human spectral luminous efficacy, from a triplet excited light-emitting material.

A metal complex used as a dopant, and a metal complex in which platinum, which is a third transition series element, serves as a center metal, a metal complex in which iridium serves as a center metal, or the like is known as an example of a triplet excited light-emitting material. The triplet excited light-emitting material is not limited to these compounds, and it is also possible to use a compound having the above structure and having an element belonging to Groups 8 to 10 of a periodic table for a center metal.

The substance mentioned above that forms the layer containing light-emitting substance is just an example, and a light-emitting element can be formed by appropriately laminating each functional layer such as a hole injecting transporting layer, a hole transporting layer, an electron injecting transporting layer, an electron transporting layer, a light-emitting layer, an electron blocking layer, or a hole blocking k layer. In addition, a mixed layer or a mixed junction may be formed with the combination of each layer. The layer structure of the light-emitting layer can be varied. Instead of not equipping a particular electron injection region or light-emitting region, the variation of providing an electrode entirely for this purpose or providing a light-emitting material by dispersing can be permitted under the scope not departing the content of the present invention.

The light-emitting element formed by using the material mentioned above is emitted by having bias in the forward direction. A pixel of a display device formed by using the light-emitting element can be driven by a simple matrix system or an active matrix system. In either system, each pixel is emitted by applying bias in the forward direction at particular timing; however, the pixel is in non-luminescent state within the specified period. The reliability of the light-emitting element can be enhanced by applying bias in the opposite direction during non-luminescent time. The light-emitting element becomes a decline mode when light-emitting intensity is deteriorated under a certain driving condition or when luminance is apparently deteriorated due to the expansion of non-luminescent region in a pixel. However, the deterioration can be delayed and the reliability of a display device can be enhanced by alternating current driving.

As illustrated in FIG. 30B, sealant 2081 is formed to seal the substrate 2001 by using a sealing substrate 2082. Thereafter, a connecting terminal (a connecting terminal 2084 connected to the gate wiring layer, a connecting terminal connected to the source wiring that is not shown) is pasted onto each edge portion of the gate wiring layer 2003 and the source wiring layer (not shown) via an anisotropic conductive layer 2083. A connecting portion of each of the wiring layer and the connecting terminal is preferably sealed by sealing resin 2085. According to the structure, moisture from the cross section can be prevented from being penetrated into the light-emitting element, and so the deterioration of the light-emitting element can be prevented.

In accordance with the foregoing processes, a light-emitting display panel can be formed. A protective circuit for preventing electrostatic destruction as typified by a diode may be provided between the connecting terminal and the source wiring (gate wiring), or in a pixel portion. In this instance, the diode is formed to be operated as a diode in accordance with the same process as that of the foregoing TFT and connected to the gate wiring layer of the pixel portion and the drain or the source wiring layer of the diode.

Any one of Embodiments 2 to 10 can be applied to this example. A liquid crystal display panel and a light-emitting display panel are explained as a display panel in Examples 1 and 2, but the display panel is not limited to theses panels. This example can be appropriately applied to an active display panel such as a DMD (Digital Micromirror Device), a PDP (Plasma Display Panel), an FED (Field Emission Display, and an electrophoretic display device (electronic paper).

EXAMPLE 3

A light-emitting element that is applicable to the foregoing examples is explained with reference to FIGS. 36A to 36D.

Figure 36A:
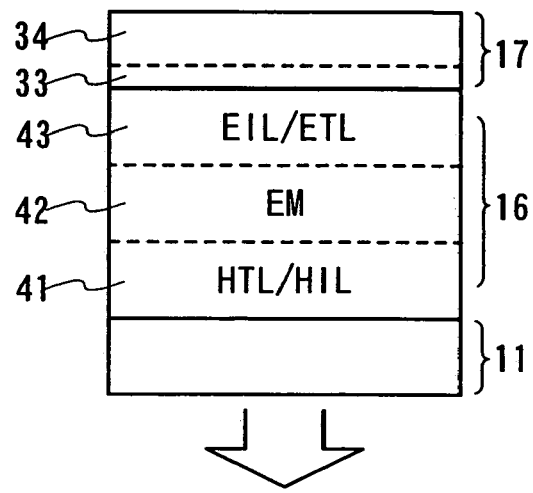
FIGS. 36A to 36D are explanatory views for showing a mode of a light-emitting element that can be applied to the present invention.

FIG. 36A shows an example of forming a first pixel electrode 11 by an oxide conductive material transparent to light, which contains silicon oxide at a concentration of 1 to 15 atom %. A layer 16 containing a light-emitting substance formed by stacking a hole injecting layer or a hole transporting layer 41, a light-emitting layer 42, and electron transporting or injecting layer 43 is provided over the first pixel electrode 11. A second pixel electrode 17 is formed by a third electrode layer 33 containing an alkali metal or an alkali earth metal such as LiF or MgAg, and a second electrode layer 34 formed by a metal material such as aluminum. A pixel in the structure can emit light from the side of the first pixel electrode 11 as indicated by arrows in the FIG. 36A.

Figure 36B:
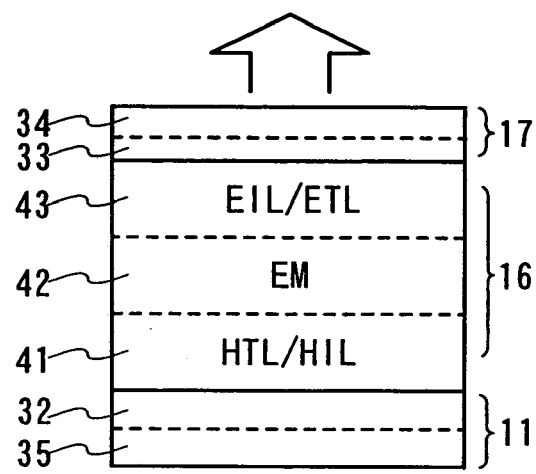

FIG. 36B shows an example of emitting light from the second pixel electrode 17, in which the first pixel electrode 11 is composed of a first electrode layer 35 made from a metal material such as aluminum or titanium, or a metal material containing the metal and the nitrogen at stoichiometric composition ratio or less; and a second electrode layer 32 made from an oxide conductive material containing silicon oxide at a concentration of 1 to 15 atom %. A layer 16 containing a light-emitting substance formed by stacking a hole injecting or hole transporting layer 41, a light-emitting layer 42, and an electron transporting layer or an electron injecting layer 43 is provided over the first pixel electrode 11. The second pixel electrode 17 is formed by a third electrode layer 33 containing an alkali metal or an alkali earth metal such as LiF or CaF, and a fourth electrode layer 34 formed by a metal material such as aluminum. Light can be emitted passing through the second electrode 17 by forming each of the layers to have a thickness of 100 nm or less to be capable of transmitting light.

In the case that light is emitted from the both direction, that is, the first electrode and the second electrode in the light-emitting element having the structure illustrated in FIG. 36A or 36B, the first pixel electrode 11 is formed by a conductive film having transmittance and a large work function, whereas a second pixel electrode 17 is formed by a conductive film having transmittance and a small work function. Typically, the first pixel electrode 11 is formed by an oxide conductive material containing silicon oxide at a concentration of 1 to 15 atom %, and the second electrode 17 is formed by the third electrode layer 33 containing an alkali metal or an alkali earth metal such as LiF or CaF having a thickness of 100 nm or less, and the fourth electrode layer 34 formed by a metal material such as aluminum having a thickness of 100 nm or less.

Figure 36C:
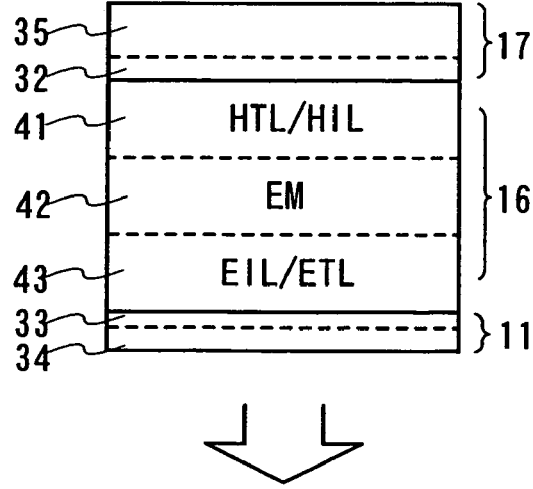

FIG. 36C shows an example of emitting light from a first pixel electrode 11, in which a layer 16 containing a light-emitting substance is formed by stacking sequentially an electron transporting or an electron injecting layer 43, a light-emitting layer 42, and a hole injecting or a hole injecting transporting layer 41. A second pixel electrode 17 is formed by sequentially stacking a second electrode layer 32 made from an oxide conductive material containing silicon oxide at a concentration of 1 to 15 atom %; and a first electrode layer 35 made from a metal material such as aluminum or titanium, or a metal material containing the metal and nitrogen at stoichiometric composition ratio or less over the layer 16 containing a light-emitting substance. The first pixel electrode 11 is formed by a third electrode layer 33 containing an alkali metal or an alkali earth metal such as LiF or CaF, and a fourth electrode layer 34 formed by a metal material such as aluminum. Light can be emitted passing through the first pixel electrode 11 by forming each of the layers to have a thickness of 100 nm or less to be capable of transmitting light.

Figure 35C:
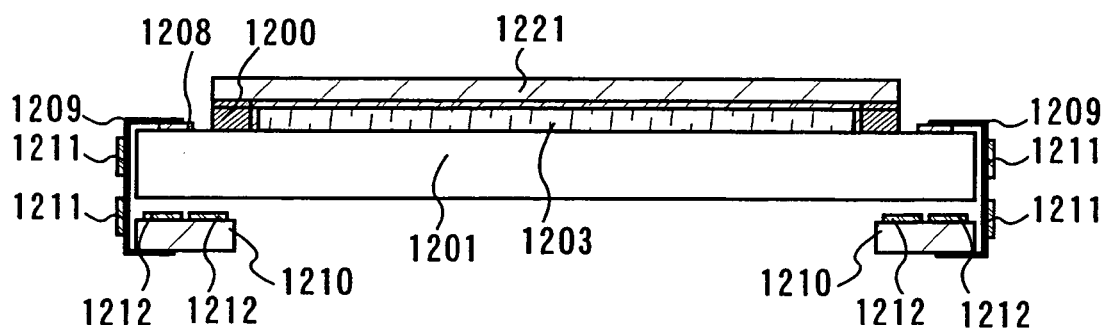
Figure 36D:
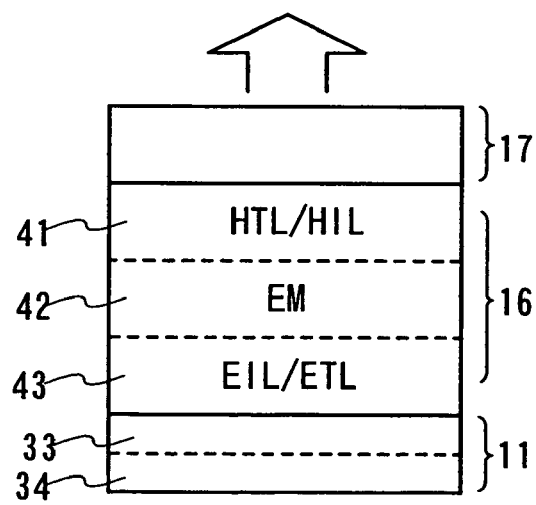

FIG. 36D shows an example of emitting light from the second pixel electrode 17, in which a layer 16 containing a light-emitting substance is formed by stacking sequentially an electron transporting layer or an electron injecting layer 43, a light-emitting layer 42, a hole injecting or a hole transporting layer 41. The first pixel electrode 11 is formed to have the same structure as that illustrated in FIG. 35C to have a thickness that can reflect light emitted from the layer containing a light-emitting substance. A second pixel electrode 17 is made from an oxide conductive material containing silicon oxide at a concentration of 1 to 15 atom %. In this structure, the hole injecting layer 41 is made from a metal oxide that is an inorganic material (typically, molybdenum oxide or vanadium oxide); and so oxygen that is introduced in forming the second pixel electrode 17, a hole injecting property is improved, and driver voltage can be lowered.

In the case that light is emitted from the both direction, that is, the first electrode and the second electrode in the light-emitting element having the structure illustrated in FIG. 36C or 36D, the first pixel electrode 11 is formed by a conductive film having transmittance and a small work function, whereas a second pixel electrode 17 is formed by a conductive film having transmittance and a large work function. Typically, the first pixel electrode 11 may be composed of a third electrode layer 33 containing an alkali metal or an alkali earth metal such as LiF or CaF having a thickness of 100 nm or less, and a fourth electrode layer 34 made from a metal material such as aluminum. The second pixel electrode 17 may be formed by an oxide conductive material containing silicon oxide at a concentration of 1 to 15 atom %.

EXAMPLE 4

A pixel circuit and an operation structure thereof of the light-emitting display panel explained in the foregoing examples are explained with reference to FIGS. 37A to 37F. In a display device using digital video signals, the operation structure of the light-emitting display panel can be divided into operation in which a video signal inputted in a pixel is regulated by voltage and operation in which a video signal inputted in a pixel is regulated by current. As the operation in which a video signal inputted in a pixel is regulated by voltage, operation in which voltage that is applied to a light-emitting element constant is constant (CVCV), and operation in which current that is applied to a light-emitting element is constant (CVCC) can be nominated. As the operation in which a video signal inputted in a pixel is regulated by current, operation in which voltage that is applied to a light-emitting element is constant (CCCV), and operation in which current that is applied to a light-emitting element is constant (CCCC) can be nominated. In this example, pixels of CVCV operation are explained with reference to FIGS. 37A and 37B. Pixels of CVCC operation are explained with reference to FIGS. 37C to 37F.

Figure 37A:
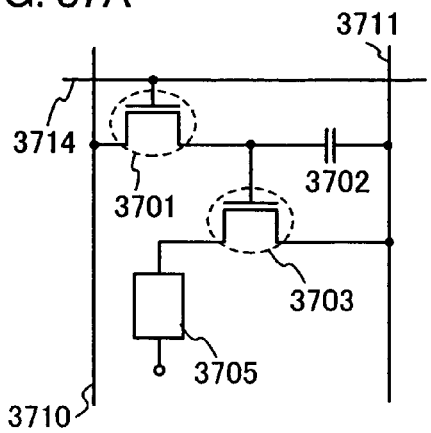
FIGS. 37A to 37F are explanatory cross-sectional views for showing a structure of a pixel that can be applied to a light-emitting display panel according to the present invention.
Figure 37B:
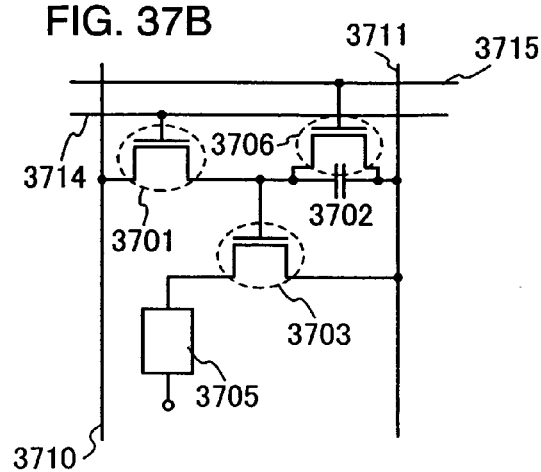

In pixels illustrated in FIGS. 37A and 37B, a signal line 3710 and a power source line 3711 are arranged in column, whereas a signal line 3714 is arranged in rows. The pixels have a switching TFT 3701, a driver TFT 3703, a capacitor 3702, and a light-emitting element 3705.

The switching TFT 3701 and the driver TFT 3703 operate in a linear region when they are ON. The driver TFT 3703 serves to control whether or not applying voltage to the light-emitting element 3705. Both of the TFTs have preferably have the same conductivity type in the light of the manufacturing steps. In this example, both of the TFTs are formed to have n-channel TFTs. As the driver TFT 3703, not only an enhancement type but also a depletion type can be used. The ratio of a channel width W of the driver TFT 3703 and a channel length L of the driver TFT 3703 (W/L) are preferably 1 to 1000 though it depends on TFT mobility. The electric property of the TFT is improved with increasing the W/L.

In the pixels illustrated in FIGS. 37A and 37B, the switching TFT 3701 serves to control the input of a video signal to a pixel. Upon turning the TFT 3701 into ON, a video signal is inputted to the pixel. Then, the voltage of the video signal is retained in a capacitor 3702.

In the case that the power source line 3711 is Vss and an opposing electrode of the light-emitting element 3705 is Vdd in FIG. 37A, that is, in the case of FIGS. 36C and 36D, the opposing electrode of the light-emitting element is an anode, and the electrode connected to the driver TFT 3703 is a cathode. In this instance, it is possible of suppress luminance irregularity due to variable characteristics of the driver TFT 3703.

In the case that the power source line 3711 is Vdd and an opposing electrode of the light-emitting element 3705 is Vss in FIG. 37A, that is, in the case of FIGS. 36A and 36B, the opposing electrode of the light-emitting element is a cathode, and the electrode connected to the driver TFT 3703 is an anode. In this instance, a video signal having higher voltage than that of the Vdd is inputted to the signal line 3710, and so voltage of the video signal is retained in the capacitor 3702 and the driver TFT 3701 operates in a linear region. Accordingly, luminance irregularity due to variable characteristics of the TFT can be improved.

The pixel illustrated in FIG. 37B has the same pixel structure as that illustrated in FIG. 37A except the point of adding a TFT 3706 and a scanning line 3715.

The ON/OFF of the TFT 3706 is controlled by the scanning line 3715 that is newly provided. Upon turning the TFT 3706 into ON, charges retained in the capacitor 3702 are discharged and the TFT 3703 is turned into OFF. That is, the arrangement of the TFT 3706 can make the state in which current is forced to stop flowing in the light-emitting element 3705. Accordingly, the TFT 3706 can be referred to as an erasing TFT. Therefore, the structure illustrated in FIG. 37B can start a lighting period simultaneously with or immediately after the start of a writing period without waiting writing of a signal to all pixels. As a result, duty ratio of light emission can be improved.

In a pixel having the foregoing structure, the current value of the light-emitting element 3705 can be determined by the driver TFT 3703 that operates in a linear region. According to the foregoing structure, variation of TFT characteristics can be suppressed. Accordingly, a display device with improved image quality can be provided by improving luminance irregularity of the light-emitting element due to variable TFT characteristics.

Then, pixels of CVCC operation are explained with reference to FIGS. 37C to 37F. The pixel illustrated in FIG. 37C is formed by providing a power source line 3712 and a current control TFT 3704 to the pixel structure illustrated in FIG. 37A.

Figure 37C:
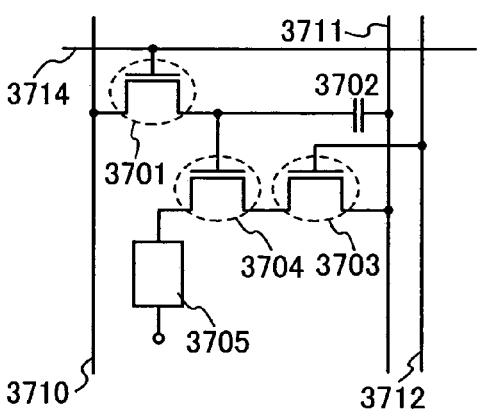
Figure 37D:
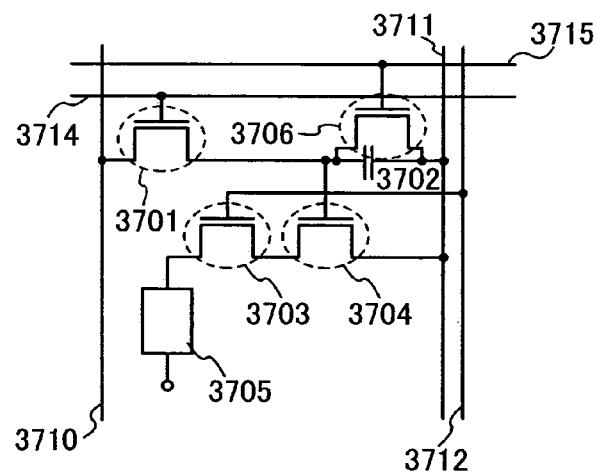
Figure 37E:
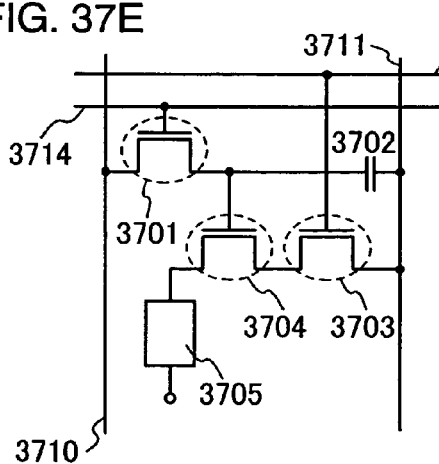

The pixel illustrated in FIG. 37E has the same structure as that illustrated in FIG. 37C except the point that the gate electrode of the driver TFT 3703 is connected to the power source line 3712, which is arranged in rows. That is, both of the pixels illustrated in FIGS. 37C and 37E have the same equivalent circuits. However, each power source line is formed by conductive films of different layers in the case of arranging a power source line 3712 in column (FIG. 37C) and in the case of arranging a power source line 3712 in rows (FIG. 37E). Here, attention is attracted to a wiring connected with the gate electrode of the driver TFT 3703. FIGS. 37C and 37E illustrate that the each power source lines are formed in different layers.

The switching TFT 3701 operates in a linear region, whereas the driver TFT 3703 operates in a saturation region. Further, the driver TFT 3703 serves to control the value of current flowing through the light-emitting element 3705, whereas the TFT 3704 operates in the saturation region and serves to control the supply of current to the light-emitting element 3705.

Figure 37F:
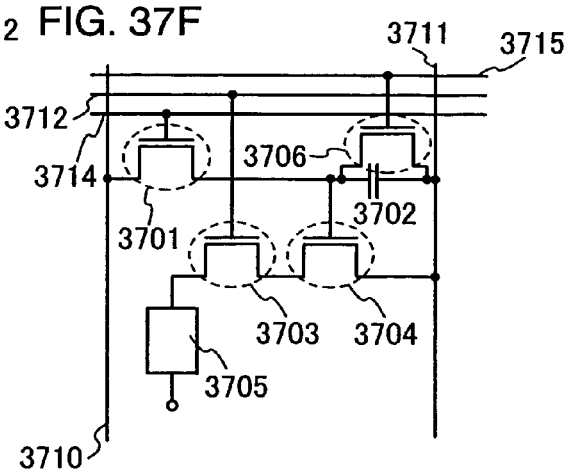

The pixels illustrated in FIGS. 37D and 37F have the same pixel structures as that illustrated in FIGS. 37C and 37E except the point that the erasing TFT 3706 and the scanning line 3715 are added to the pixels illustrated in FIGS. 37C and 37E.

The pixels illustrated in FIGS. 37A and 37B can operate CVCC. The pixels having operation structures illustrated in FIGS. 37C to 37E can appropriately change Vdd and Vss depending on the direction of current flow of the light-emitting element like FIG. 37A and FIG. 37B.

In the pixel having the foregoing structure, a slight change of Vgs of the TFT 3704 does not affect the current value of the light-emitting element 3705 since the TFT 3704 operates in a linear region. That is, the current value of the light-emitting element 3705 can be determined by the driver TFT 3703 operating in a saturation region. According to the foregoing structure, a display device with improved image quality can be provided by improving luminance irregularity of the light-emitting element due to variable TFT characteristics.

Especially in the case of forming a thin film transistor having an amorphous semiconductor or the like, it is preferably to increase the semiconductor film area of the driver TFT since variation of the TFT can be reduced. Therefore, the pixels illustrated in FIGS. 37A and 37B can increase aperture ratio since they have the small number of TFT.

The structure in which the capacitor 3702 is, but not exclusively, provided is explained. The present invention is not limited thereto. The capacitor 3702 is not always provided if gate capacitance can serve as retention volume for a video signal.

A thin film transistor formed by an amorphous semiconductor film preferably provides a circuit for correcting a threshold value in a pixel or the periphery of the pixel since the threshold value tends to shift.

It is considered that such the active matrix light-emitting device has advantage in driving at low voltage since TFTs are provided to each pixel in the case of increasing pixel density. At the same time, a passive matrix light-emitting device in which TFTs are provided to row-by-row can be formed. The passive matrix light-emitting device has high aperture ratio since TFTs are not provided to each pixel.

In the display device according to the present invention, the driving method of screen display is not especially limited, for example, a dot sequential driving method, a line sequential driving method, or a plane sequential driving method may be used. Typically, a line sequential driving method is used and a time-division gradation driving method or an area gradation driving method may be appropriately used. A video signal inputted to the source line of a display device may be an analog signal or a digital signal. A driver circuit and the like may be appropriately designed in accordance with the video signal.

As noted above, various pixel circuits can be adopted.

EXAMPLE 5

In this embodiment, the mounting of driver circuits (a signal line driver circuit 1402 and scanning line driver circuits 1403*a* and 1403*b*) on a display panel described in the above examples is explained with reference to FIGS. 9A to 9C.

Figure 9A:
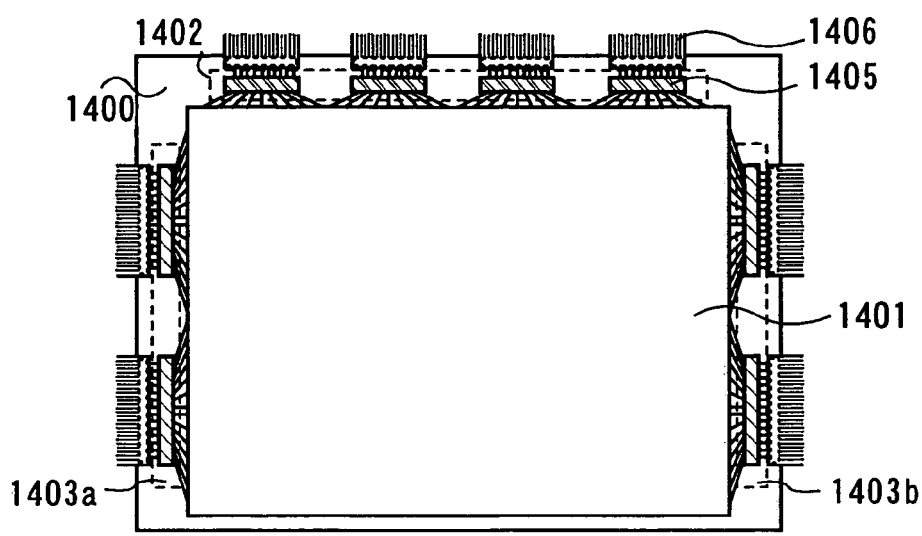
FIGS. 9A to 9C are explanatory top views for showing a mounting method of a driver circuit of a display device according to the present invention.

As illustrated in FIG. 9A, the signal line driver circuit 1402 and the scanning line driver circuits 1403*a* and 1403*b* are mounted on a periphery of a pixel portion 1401. In FIG. 9A, an IC chip 1405 is mounted on a substrate 1400 by a COG method as the signal line driver circuit 1402 and the scanning line driver circuits 1403a, 1403b and the like. Then, the IC chip is connected to an external circuit via an FPC (flexible printed circuit) 1406.

Figure 9B:
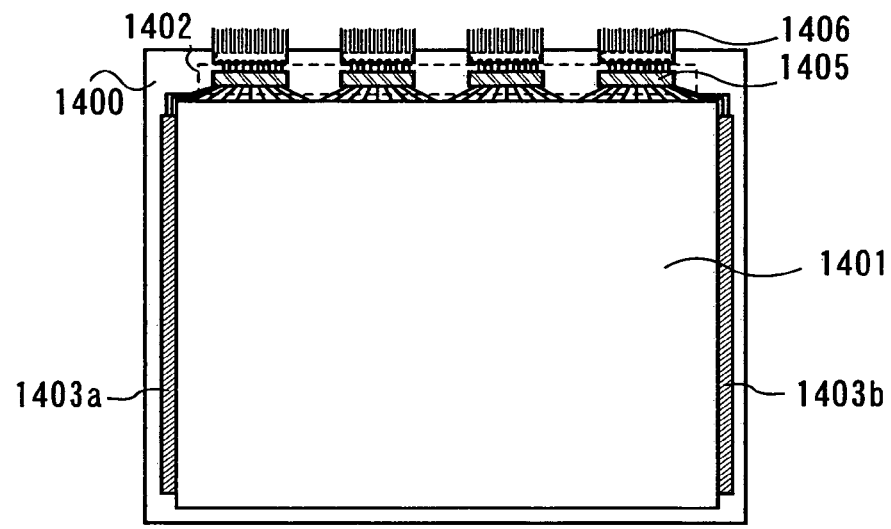

As illustrated in FIG. 9B, in the case of forming a TFT by a semiamorphous semiconductor or a crystalline semiconductor, a pixel portion 1401, scanning line driver circuits 1403a and 1403b and the like may be integrally formed over a substrate 1400, and a signal line driver circuit 1402 or the like may be separately mounted as an IC chip. In FIG. 9B, an IC chip 1405 is mounted on a substrate 1400 by a COG method as the signal line driver circuit 1402. Then, the IC chip is connected to an external circuit through the FPC (flexible printed circuit) 1406.

Figure 9C:
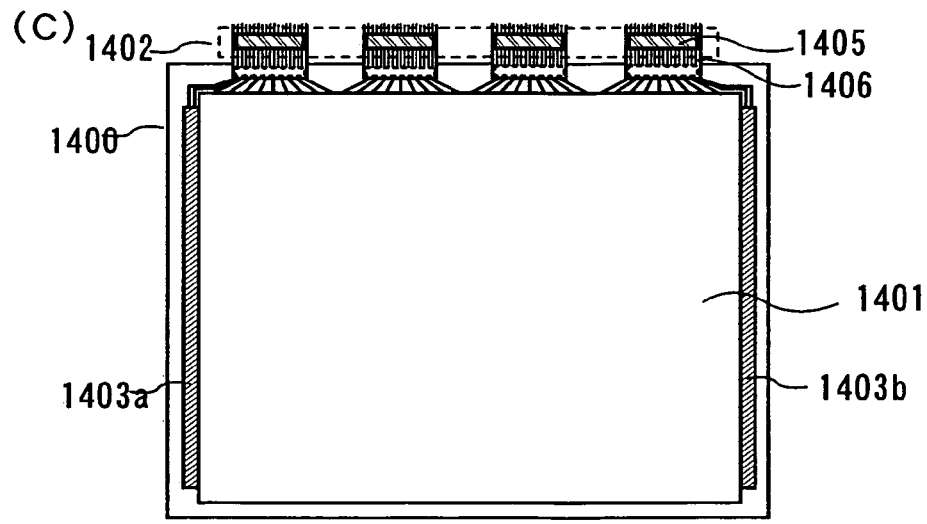

Furthermore, as illustrated in FIG. 9C, a signal line driver circuit 1402 or the like may be mounted by a TAB method instead of the COG method. Then, an IC chip 1405 is connected to an external circuit via an FPC (flexible printed circuit) 1406. In FIG. 9C, the signal line driver circuit is mounted by a TAB method; however, the scanning line driver circuit may be mounted by a TAB method.

When the IC chip is mounted by a TAB method, a large scale of a pixel portion against a substrate can be provided thereto, and thus, a frame can be narrowed.

The IC chip is formed by using a silicon wafer; however, an IC formed over a glass substrate (hereinafter, driver IC) may be provided instead of the IC chip. Since the IC chip is taken out of a circular silicon wafer, there is limitation on a shape of a mother substrate. On the other hand, the driver IC has a glass mother substrate and there is no limitation on the shape; therefore, the productivity can be enhanced. Accordingly, the shape and dimension of the driver IC can be arbitrarily set. For example, when the driver IC is formed to have a long side of from 15 mm to 80 mm, the required number of the driver ICs can be reduced compared with the case of mounting the IC chip. Consequently, the number of connection terminals can be reduced, and manufacturing yields can be improved.

The driver IC can be formed by using a crystalline semiconductor formed over a substrate, and the crystalline semiconductor is preferably formed by continuous-wave laser light irradiation. A semiconductor film obtained by being irradiated with continuous-wave laser light has few crystal defects and has crystal grains with large grain sizes. As a result, a transistor having such the semiconductor film becomes to have satisfactory mobility and response speed; consequently, high-speed driving can be performed. Therefore the transistor is suitable for the driver IC.

EXAMPLE 6

In this example, a method for mounting driver circuits (a signal line driver circuit 1402 and scanning line driver circuits 1403a and 1403b) on a display panel described in the above example is described with reference to FIGS. 10A to 10D. As the mounting method, a connection method using an anisotropic conductive material, a wire bonding method, or the like may be applied. An example thereof is described with reference to FIGS. 10A to 10D. An example using a driver IC for the signal line driver circuit 1402 and the scanning line driver circuits 1403a and 1403b is described in this example. An IC chip can be appropriately used instead of the driver IC.

Figure 10A:
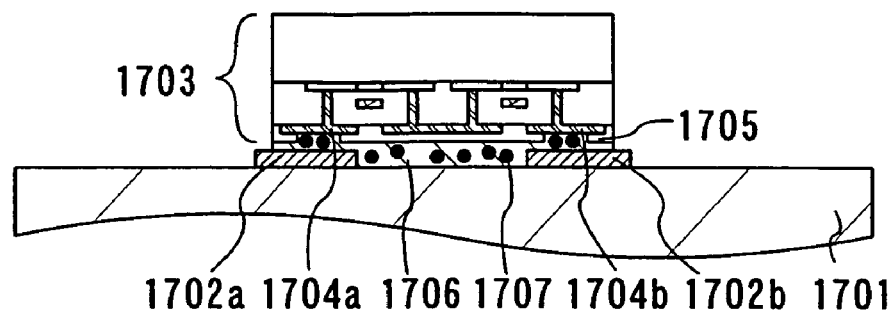
FIGS. 10A to 10D are explanatory cross-sectional views for showing a mounting method of a driver circuit of a display device according to the present invention.

FIG. 10A illustrates an example of a driver IC 1703 mounted on an active matrix substrate 1701 by using an anisotropic conductive material. Each wiring (not shown) such as a source or gate wiring, and electrode pads 1702a and 1702b of the wirings are formed over the active matrix substrate 1701.

Connection terminals 1704a and 1704b are provided on the surface of the driver IC 1703, and a protective insulating film 1705 is formed in the periphery portion.

The driver IC 1703 is fixed to the active matrix substrate 1701 with an anisotropic conductive adhesive 1706. The connection terminal 1704a is electrically connected to the electrode pad 1702a, whereas connection terminal 1704b electrically connected to the electrode pad 1702b, respectively by conductive particles 1707 contained in the anisotropic conductive adhesive. The anisotropic conductive adhesive is adhesive resin dispersed with the conductive particles (with a grain size of approximately from several μm to several hundreds μm) to be contained. Epoxy resin, phenol resin, or the like can be given as an example of the anisotropic conductive adhesive. In addition, the conductive particles (with a grain size of approximately from several μm to several hundreds μm) are formed by an element selected from the group consisting of gold, silver, copper, palladium and platinum; or alloy particles of a plurality of the foregoing elements. Alternatively, the conductive particles may have multilayer structures formed by the foregoing elements. Furthermore, resin particles coated with an element selected from the group consisting of gold, silver, copper, palladium and platinum; or coated with alloy particles of a plurality of the foregoing elements may also be used.

In addition, an anisotropic conductive film formed over a base film in a filmed shape may be transferred to be used instead of the anisotropic conductive adhesive. The conductive particles that are similar to those in the anisotropic conductive adhesive are dispersed in the anisotropic conductive film. By forming the conductive particles 1707 mixed in the anisotropic conductive adhesive 1706 to have proper sizes and concentration, the driver IC in such a mode can be mounted on the active matrix substrate. This mounting method is suitable for mounting the driver ICs in FIGS. 9A and 9B.

Figure 10B:
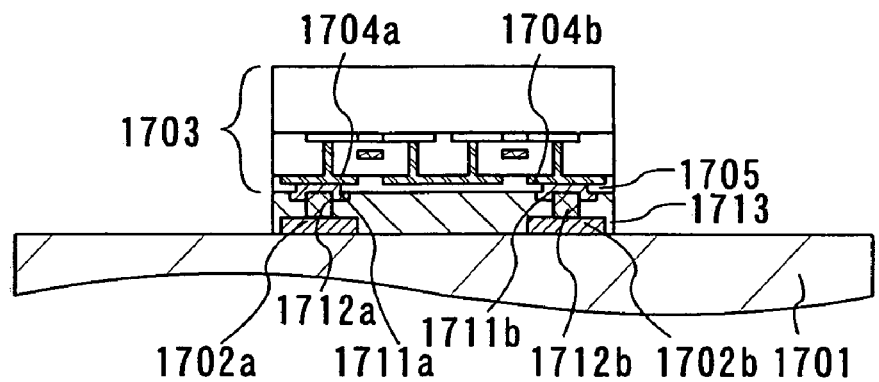

FIG. 10B illustrates an example of a mounting method of utilizing the force of contraction of organic resin. Buffer layers 1711a and 1711b are formed on the surface of the connection terminals of a driver IC by using Ta, Ti or the like, and Au is formed thereover to be approximately 20 μm in thick by an electroless plating method or the like to form bumps 1712a and 1712b. The driver IC can be mounted in accordance with the procedure, that is, photocuring insulating resin 1713 is interposed between the driver IC and the active matrix substrate, and electrodes are welded with pressure by photocuring. This mounting method is suitable for mounting the driver IC in FIGS. 9A and 9B.

Figure 10C:
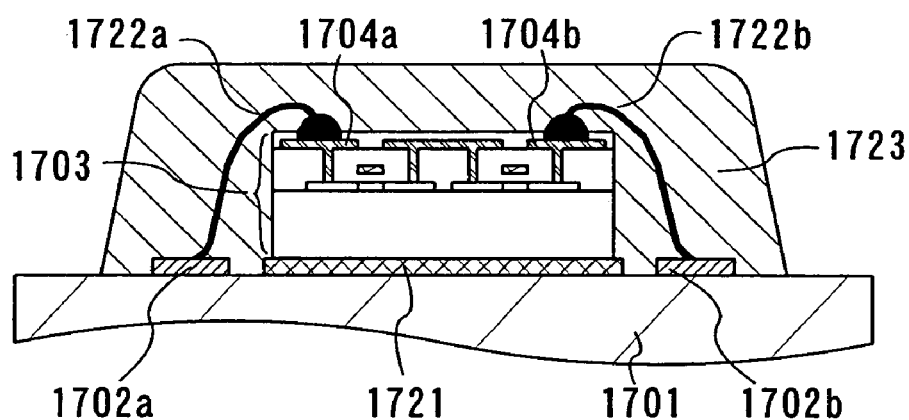

As illustrated in FIG. 10C, a driver IC 1703 may be fixed to an active matrix substrate 1701 by using an adhesive 1721, and the connection terminals 1704a and 1704b of a CPU may be connected to electrode pads 1702a and 1702b over the active matrix substrate by wirings 1722a and 1722b. Then, panel is sealed by an organic resin 1723. This mounting method is suitable for mounting the driver IC in FIGS. 9A and 9B.

Figure 10D:
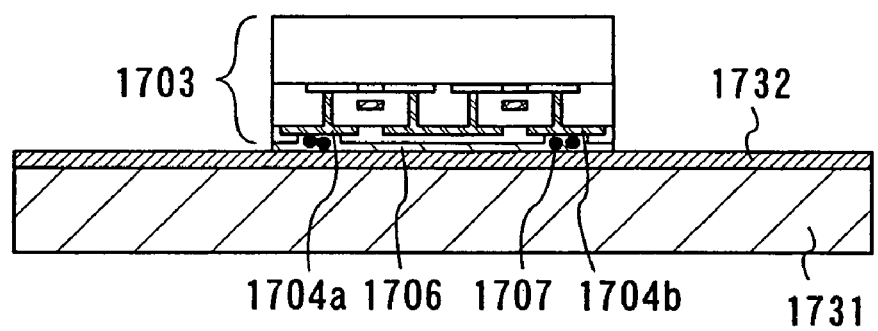

In addition, as illustrated in FIG. 10D, a driver IC 1703 may be provided via a wiring 1732 over an FPC (Flexible printed circuit) 1731 and an anisotropic conductive adhesive 1706 containing conductive particles 1707. This structure is extremely useful in an electronic device that is limited in the housing size such as a portable terminal. This mounting method is suitable for mounting the driver IC in FIG. 9C.

A method for mounting the driver IC is not especially limited. A known COG method, a wire bonding method, a TAB method, or reflow treatment using a solder bump can be used. In the case of performing reflow treatment, plastic that has great heat resistance, typically, a polyimide substrate, an HT substrate (manufactured by Nippon Steel Chemical Co., Ltd.), ARTON made from norbornene resin with a polar group (manufactured by JSR Corp.), or the like is preferably used for a substrate used for a driver IC or an active matrix substrate

EXAMPLE 7

A driver circuit in the case that the driver circuit at the side of a scanning line is formed over a substrate 1400 as illustrated in FIGS. 9B and 9C by forming a semiconductor layer by a semiamorphous semiconductor (SAS) in a light-emitting display panel described in Example 6 is explained.

Figure 14:
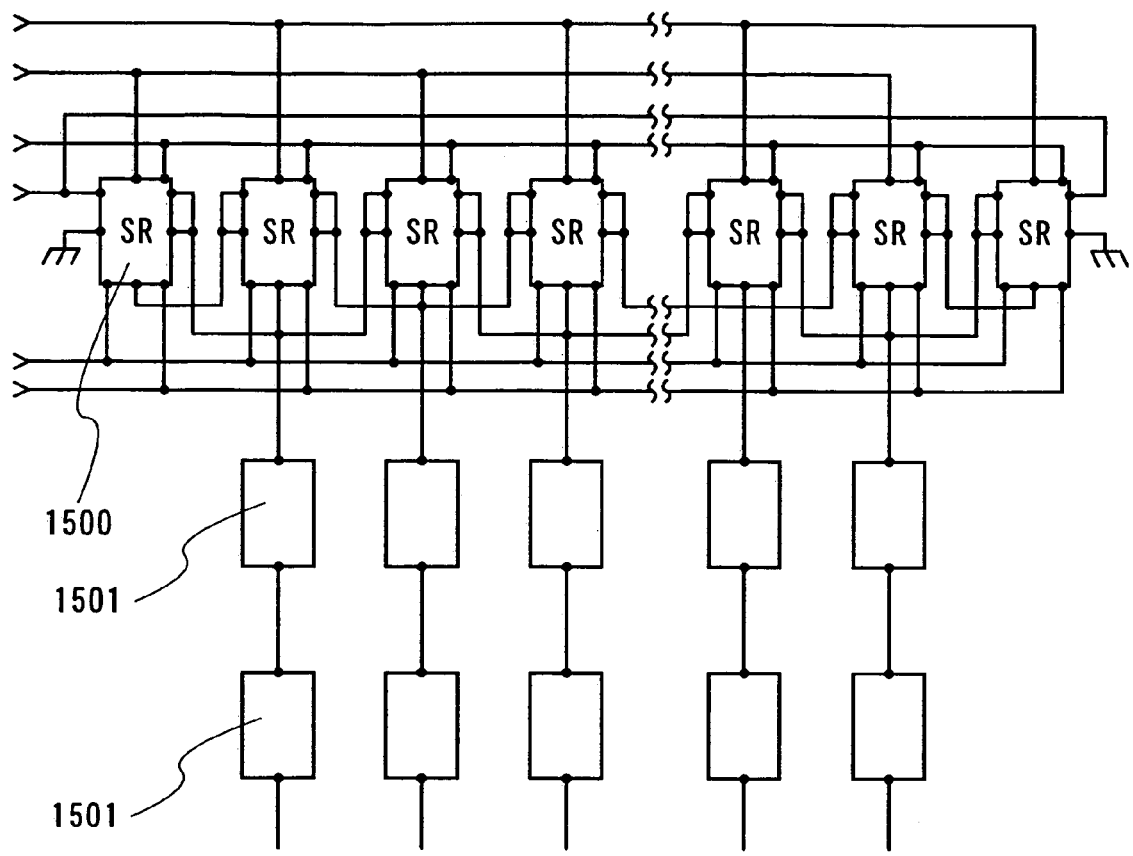
FIG. 14 is a view for showing a circuit structure in the case of forming a scanning line driver circuit by a TFT in a liquid crystal display panel according to the present invention.

FIG. 14 shows a block diagram of the scanning line driver circuit composed of n-channel type TFTs using a SAS that can obtain field effect mobility of from 1 to 15 cm$^2$/V·sec.

In FIG. 14, a block denoted by reference numeral 1500 corresponds to a pulse output circuit for outputting a sampling pulse for one stage, and a shift register is composed of n number of pulse output circuits. A pixel is connected at the end of a buffer circuit 1501.

Figure 15:
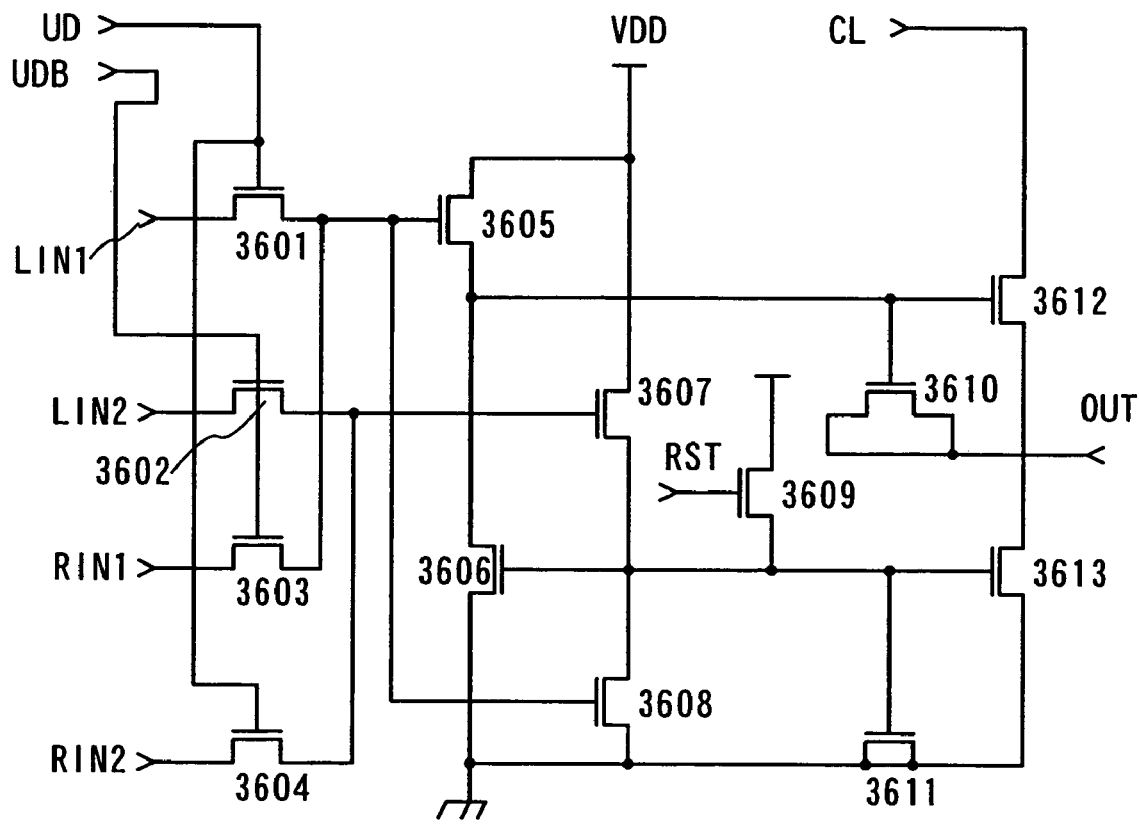
FIG. 15 is a view for showing a circuit structure in the case of forming a scanning line driver circuit by a TFT in a liquid crystal display panel according to the present invention (shift resistor circuit)

FIG. 15 illustrates a specific structure of the pulse output circuit 1500 that is composed of n-channel type TFTs 3601 to 3613. The size of the TFTs may be decided in consideration of an operating characteristic of the n-channel type TFTs using a SAS. For example, when a channel length is set to be 8 μm, a channel width can be set ranging from 10 to 80 μm.

Figure 16:
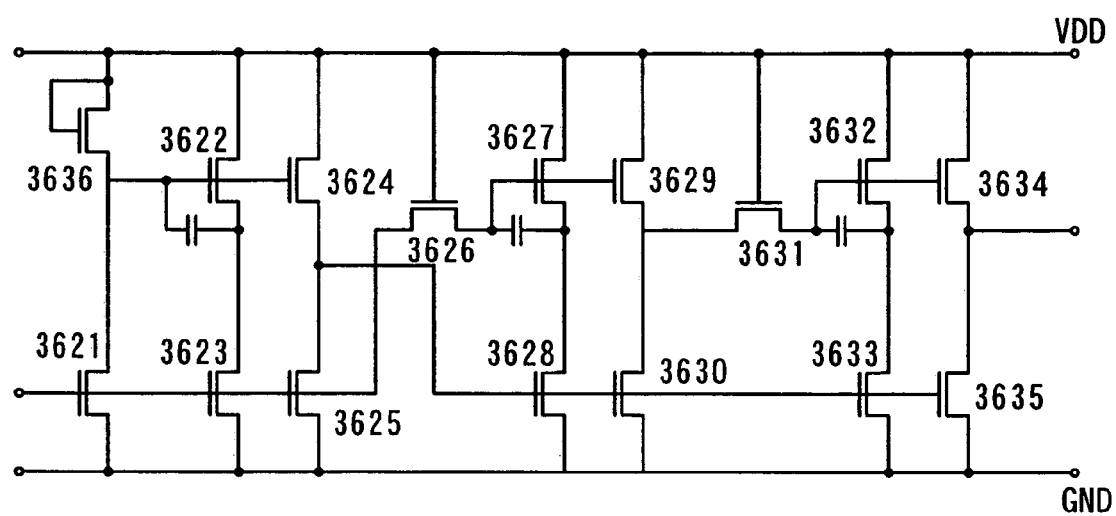
FIG. 16 is a view for showing a circuit structure in the case of forming a scanning line driver circuit by a TFT in a liquid crystal display panel according to the present invention (buffer circuit)

In addition, FIG. 16 shows a specific structure of the buffer circuit 1501. The buffer circuit includes n-channel type TFTs 3621 to 3636 in the same manner. The size of the TFTs may be decided at this time in consideration of an operating characteristic of the n-channel type TFTs using a SAS. For example, when a channel length is set to be 10 μm, a channel width can be set ranging from 10 to 1800 μm.

EXAMPLE 8

Figure 26:
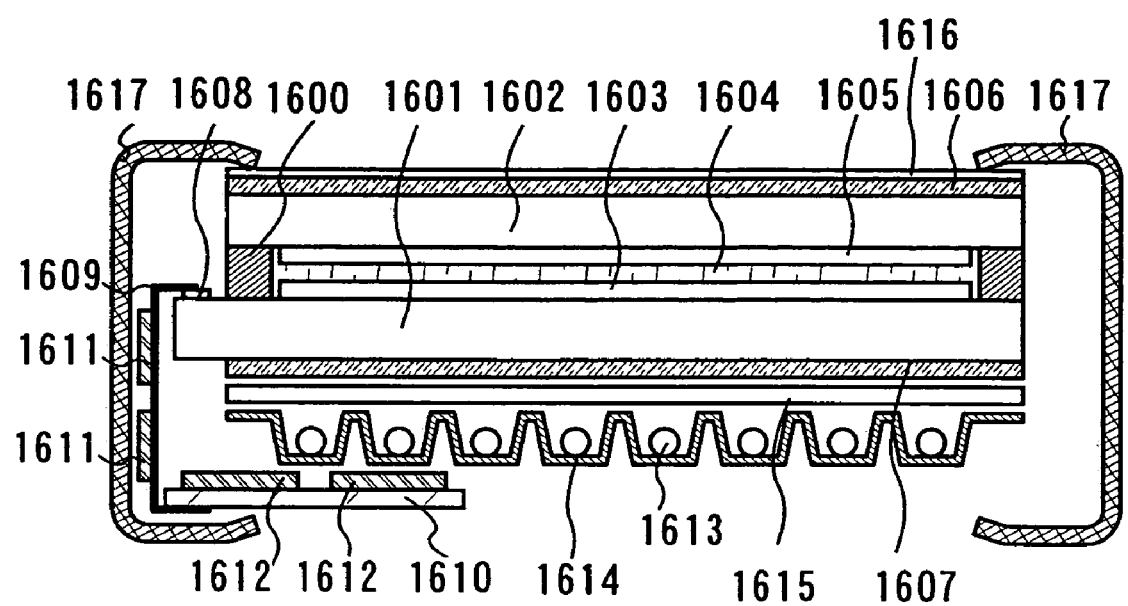
FIG. 26 is an explanatory view for showing a structure of a liquid crystal display module according to the present invention.
Figure 27:
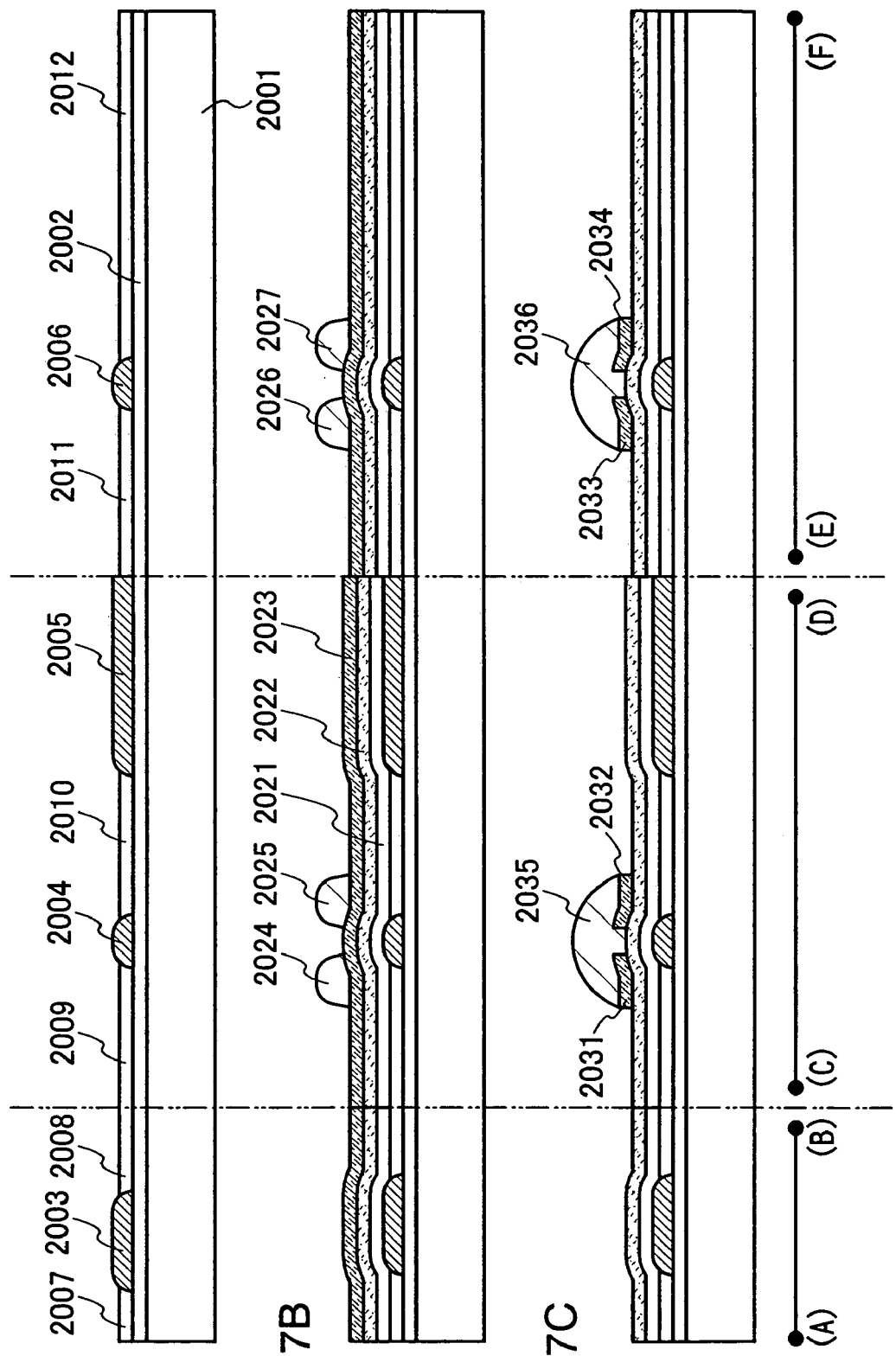
FIGS. 27A to 27C are explanatory cross-sectional views for showing a manufacturing process of a semiconductor device according to the present invention.
Figure 28:
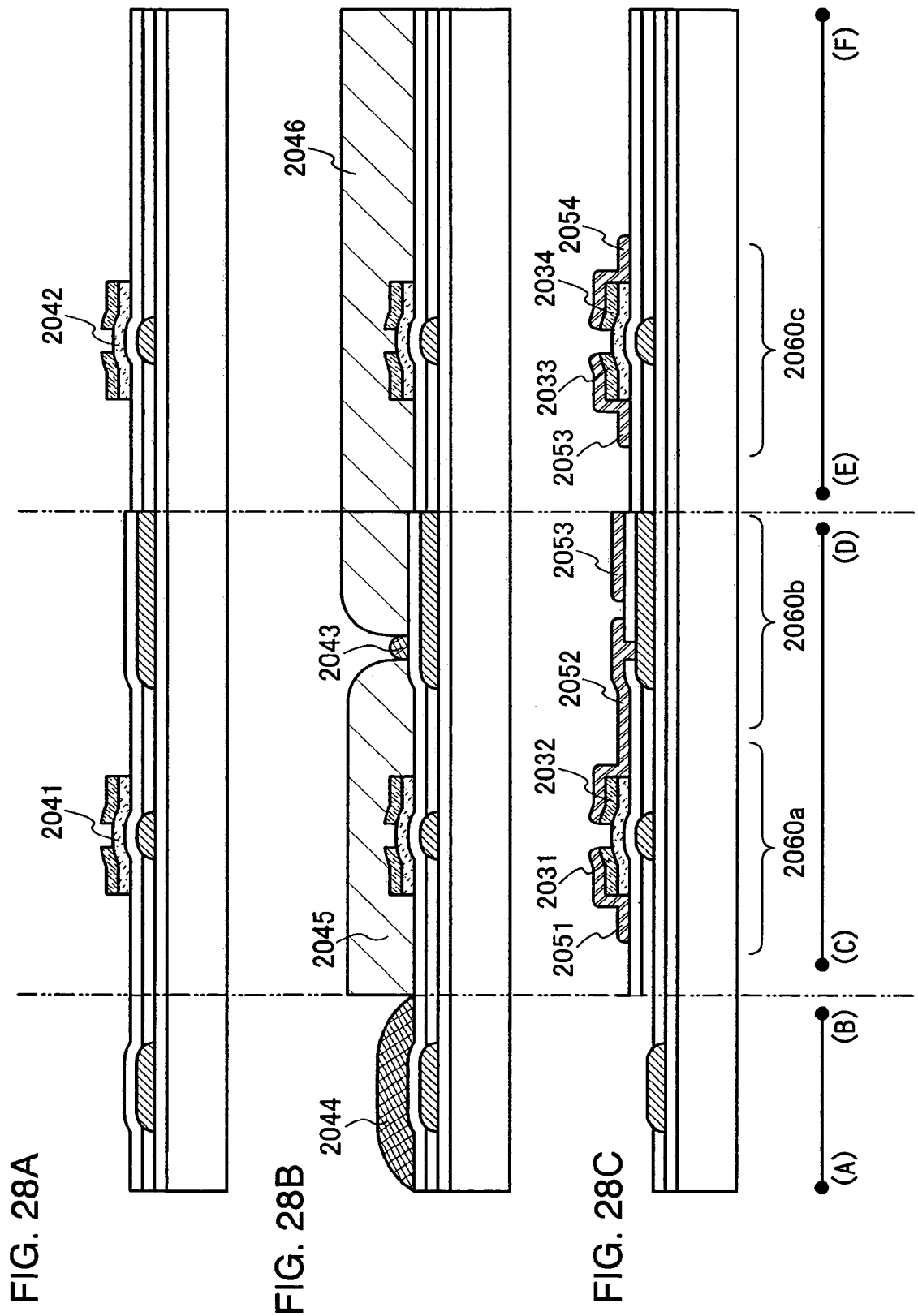
FIGS. 28A to 28C are explanatory cross-sectional views for showing a manufacturing process of a semiconductor device according to the present invention.
Figure 29:
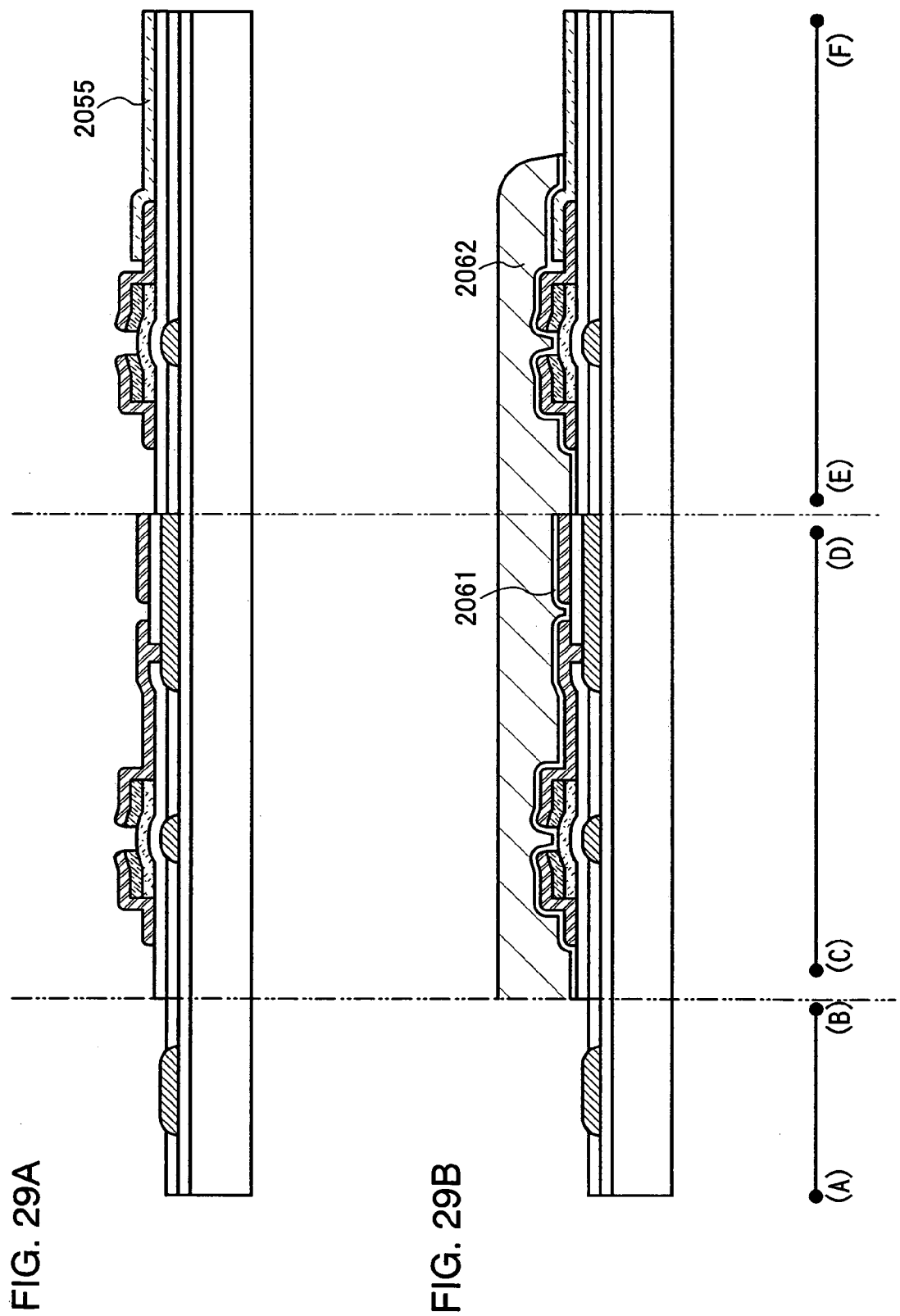
FIGS. 29A and 29B are explanatory cross-sectional views for showing a manufacturing process of a semiconductor device according to the present invention.
Figure 30:
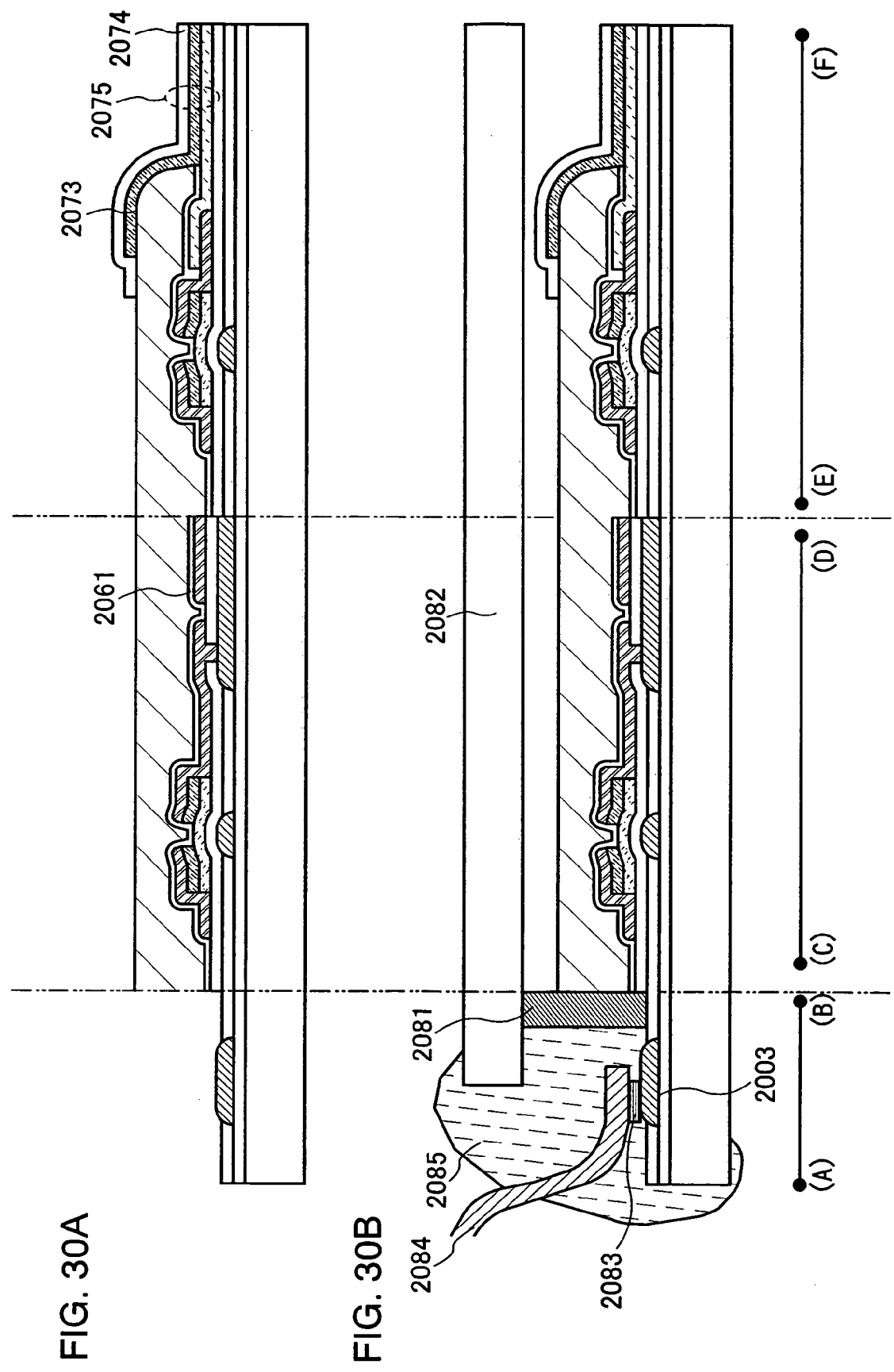
FIGS. 30A and 30B are explanatory cross-sectional views for showing a manufacturing process of a semiconductor device according to the present invention.

A display module is described in this example. A liquid crystal module is described as an example of the display module with reference to FIG. 26.

An active matrix substrate 1601 and an opposing substrate 1602 are fixed with a sealant 1600, and a pixel portion 1603 and a liquid crystal layer 1604 are provided therebetween to form a display region.

A colored layer 1605 is required to realize a color display. Each of colored layers corresponding to each color of red, green, and blue is provided to each pixel in the case of RGB system. Polarizing plates 1606 and 1607 are arranged outside the active matrix substrate 1601 and the opposing substrate 1602. In addition, a protective film 1616 is formed over the surface of the polarizing plate 1606 to relieve impact from outside.

A connection terminal 1608 provided to the active matrix substrate 1601 is connected to a wiring board 1610 via an FPC 1609. The FPC is provided with a pixel driver circuit (an IC chip, a driver IC, or the like) 1611, and an external circuit 1612 such as a control circuit or a power supply circuit is incorporated in the wiring substrate 1610.

A cold cathode tube 1613, a reflection board 1614, and an optical film 1615, which are a backlight unit, serve as a light source to project light on a liquid crystal display panel. The liquid crystal display panel, the light source, the wiring board, the FPC, and the like are held and protected by a bezel 1617.

This example can be applied to any one of Embodiments 1 to 9.

EXAMPLE 9

Figure 35A:
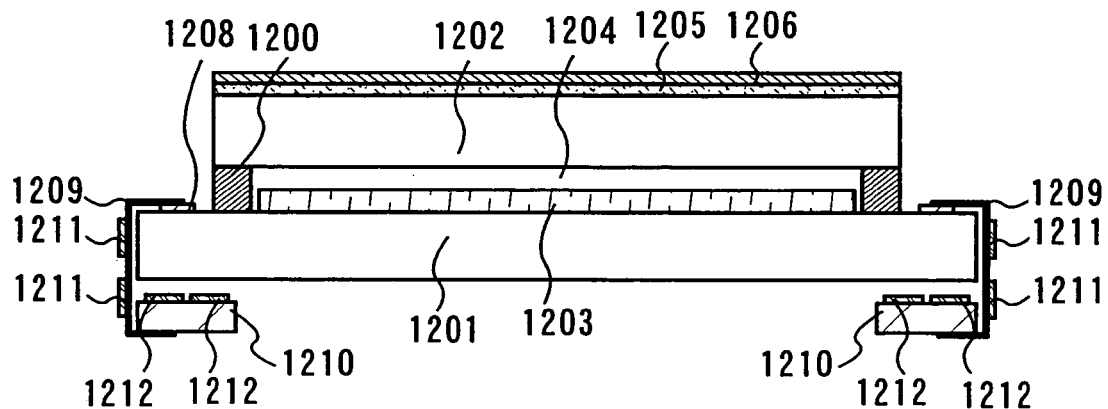
FIGS. 35A to 35C are explanatory views for showing a structure of a light-emitting display module according to the present invention.
Figure 35B:
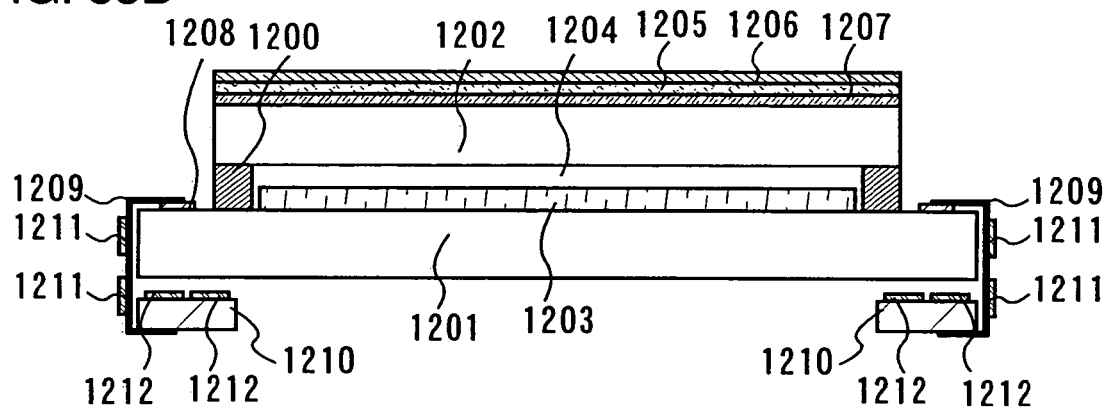

A cross-sectional view of a light-emitting display module is explained as an example of a display module with reference to FIGS. 35A to 35C in this example.

FIG. 35A illustrates a cross-sectional view of a light-emitting display module in which an active matrix substrate 1201 and an opposing substrate 1202 are fixed to each other with a sealant 1200, and a pixel portion 1203 is interposed therebetween to form a display region.

A space 1204 is formed between the opposing substrate 1202 and the pixel portion 1203. The space may be filled with an inert gas, for example, a nitrogen gas or provided with a highly water absorbing light-transmitting resin to prevent further the penetration of moisture or oxygen. In addition, light-transmitting resin having a high water-absorbing property may be formed. By providing the light-transmitting resin, the display module can be formed without decreasing the transmittance even in the case that light from a light-emitting element is emitted to the opposing substrate.

In order to enhance the contrast, a polarizing plate or a circularly polarizing plate (a polarizing plate, ¼λ plate and ½λ plate) is preferably provided at least in a pixel portion of a module. When display is recognized from the side of the opposing substrate 1202, a ¼λ plate and ½λ plate 1205, and a polarizing plate 1206 may be sequentially provided over the opposing substrate 1202. Furthermore, an antireflection film may be provided over the polarizing plate.

In addition, when display is recognized from both sides of the opposing substrate 1202 and the active matrix substrate 1201, the surface of the active matrix substrate is preferably provided with the ¼λ plate and ½λ plate 1205, and the polarizing plate in the same manner.

A connection terminal 1208 provided to the active matrix substrate 1201 is connected to a wiring board 1210 via an FPC 1209. The FPC is provided with a pixel driver circuit 1211 (an IC chip, a driver IC or the like), and the wiring board 1210 is incorporated with an external circuit 1212 such as a control circuit or a power supply circuit.

As illustrated in FIG. 35B, a colored layer 1207 can be provided between a pixel portion 1203 and the polarizing plate or between the pixel portion and the circularly polarizing plate. In this instance, full color display can be realized by providing a light-emitting element that is capable of emitting white light to the pixel portion and providing separately a colored layer that exhibits RGB. In addition, full color display can be realized by providing a light-emitting element capable of emitting blue light to the pixel portion and providing separately a color conversion layer or the like. Furthermore, light-emitting elements capable of emitting red, green, and blue light can be provided to each of the pixel portion; moreover, a colored layer can be used in the pixel portions. Such a display module can exhibits RGB with high color purity and display high-definition images.

Unlike in the case of FIG. 35A, FIG. 35C illustrates the case of sealing an active matrix substrate and a light-emitting element by using a protective film 1221 in a film or resin without using an opposing substrate. The protective film 1221 is provided to cover a second pixel electrode in a pixel portion 1203. As the protective film 1221, an organic material such as epoxy resin, urethane resin or silicone resin can be used. In addition, the protective film 1221 may be formed by dropping a polymer material by a droplet discharging. In this example, epoxy resin is discharged by using a dispenser and dried. Furthermore, an opposing substrate may be provided over the protective film. The other structures are the same as in FIG. 35A.

A display device can be reduced in weight, size and thickness by sealing without using an opposing substrate in such a manner.

The wiring board 1210 is, but not exclusively, mounted by using the FPC 1209 in the module described in this example. The pixel driver circuit 1211 and the external circuit 1212 may be directly mounted on the substrate by using a COG (Chip on Glass) method.

Any one of Embodiments 1 to 9 can be applied to this example. A liquid crystal display module and a light-emitting display module are, but not exclusively, described as an example of a display module. For example, the present invention can be appropriately applied to a display module such as a DMD (Digital Micromirror Device), a PDP (Plasma Display Panel), an FED (Field Emission Display) or an electrophoretic display device (electronic paper).

EXAMPLE 10

Figure 24A:
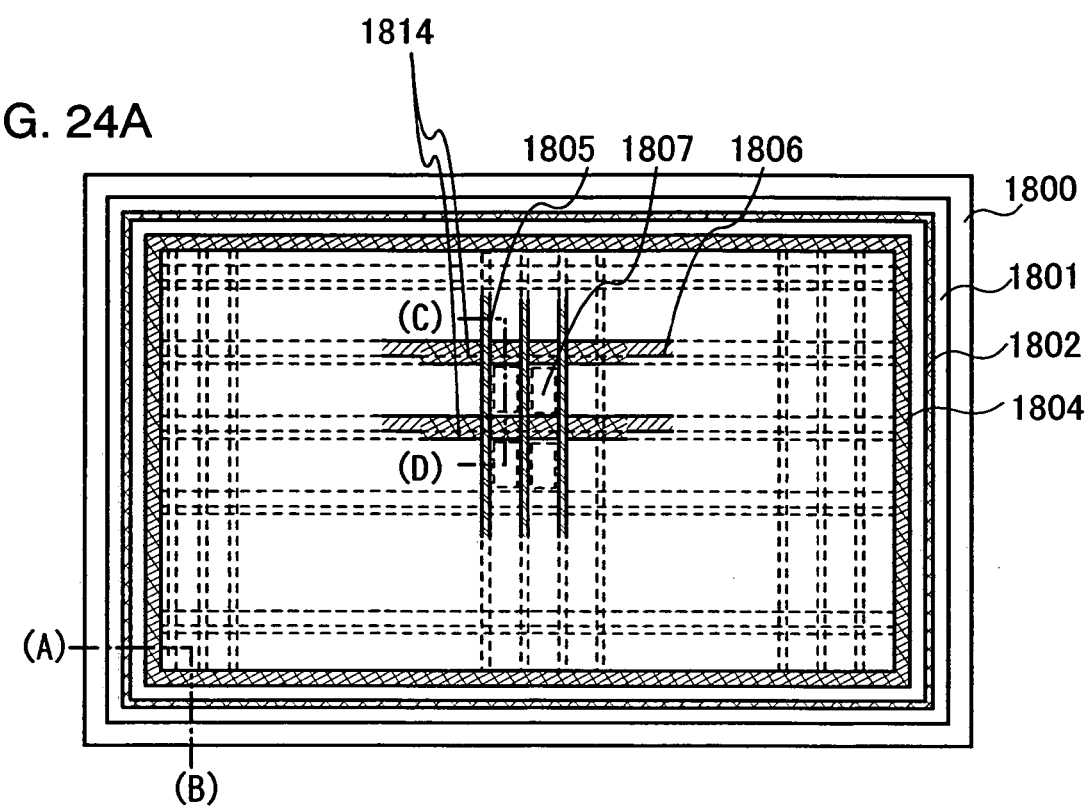
FIGS. 24A and 24C are explanatory top and cross-sectional views for showing a structure of a light-emitting display panel according to the present invention.
Figure 24B:
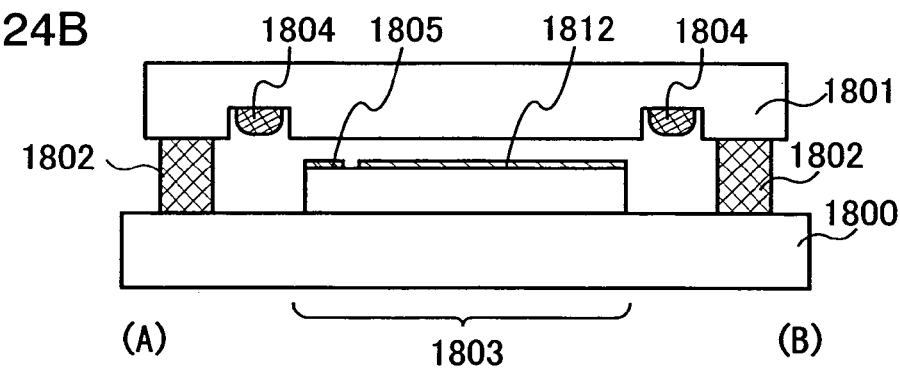
Figure 24C:
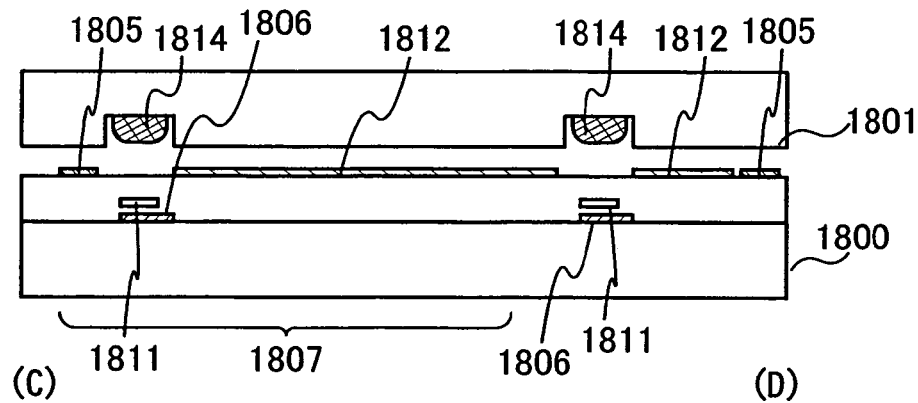

This embodiment describes a drying agent of a display panel described in the above embodiment with reference to FIGS. 24A to 24C.

FIG. 24A is a surface view of the display panel. FIG. 24B is a cross-sectional view of FIG. 24A taken along a line A–B. FIG. 24C is a cross-sectional View taken along a line C–D in FIG. 24A.

As illustrated in FIG. 24A, an active matrix substrate 1800 and an opposing substrate 1801 are sealed with a sealant 1802. A pixel region is provided between the active matrix substrate and the opposing substrate. A pixel 1807 is provided to the pixel region 1803 in a region where a source wiring 1805 and a gate wiring 1806 cross each other. A drying agent 1804 is provided between the pixel region 1803 and the sealant 1802. In the pixel region, drying agents 1814 are provided above the gate or source wiring. Here, the drying agents 1814 are provided above the gate wiring; however, it can also be provided over the gate and source wirings.

As the drying agent 1804, a substance that adsorbs water ($H_2O$) by chemical adsorption, for example, oxides of an alkaline earth metal such as calcium oxide (CaO) or barium oxide (BaO) is preferably used. Alternatively, a substance that adsorbs water by physical adsorption such as zeolite or silica gel can also be used.

The drying agent can be fixed to the substrate in the state of being contained as a granular substance in resin having high moisture permeability. The following can be given as an example of the resin having high moisture permeability: acrylic resin such as ester acrylate, ether acrylate, ester urethane acrylate, ether urethane acrylate, butadiene urethane acrylate, special urethane acrylate, epoxy acrylate, amino resin acrylate or acrylic resin acrylate. In addition, epoxy resin such as bisphenol A type liquid resin, bisphenol A type solid resin, resin containing bromo-epoxy, bisphenol F type resin, bisphenol AD type resin, phenol type resin, cresol type resin, novolac type resin, cyclic aliphatic epoxy resin, epi-bis type epoxy resin, glycidyl ester resin, glycidyl amine resin, heterocyclic epoxy resin, or modified epoxy resin can be used. Alternatively, the other substances may be used. For example, an inorganic substance such as siloxane may be used.

As a water-absorbing substance, for example, solution that is prepared by mixing a molecule that can absorb water by chemical absorption into organic solvent and become solidified can be used.

As the resin or the inorganic substance having high moisture permeability, a substance having higher moisture permeability than that of a substance used as the sealant is preferably selected to be used.

In the light-emitting device according to the present invention as described above, moisture penetrated into the light-emitting device from outside can be absorbed before the moisture reaches to a region provided with a light-emitting element. Accordingly, the deterioration due to moisture of an element provided to a pixel, typically, a light-emitting element can be suppressed.

As illustrated in FIG. 24B, a drying agent 1804 is provided between a sealant 1802 and a pixel region 1803 in the periphery of a display panel. In addition, the display panel can be reduced its thickness by providing a depression to an opposing substrate or an active matrix substrate to provide the drying agent 1804 to the depression.

As illustrated in FIG. 24C, a pixel 1807 is provided with a semiconductor region 1811 that is part of a semiconductor element for driving a display element, a gate wiring 1806, a source wiring 1805, and a pixel electrode 1812. In the pixel portion of a display panel, a drying agent 1814 is provided to the opposing substrate to overlap with the gate wiring 1806. The gate wiring has a width of two to four times as that of the source wiring. Therefore, an aperture ratio is not lowered, moisture can be prevented from penetrating into a display element, and deterioration of the display element due to moisture can be suppressed by providing the drying agent 1814 over the gate wiring 1806 that is a nondisplay region. In addition, a display panel can be reduced its thickness by providing a depressed portion to the opposing substrate to provide the drying agent to the depressed portion.

EXAMPLE 11

According to the present invention, a semiconductor device with a circuit composed of highly integrated semiconductor elements with high reliability that can reduce OFF current, typically, a signal line driver circuit, a controller, a CPU, a converter of an audio processing circuit, a power supply circuit, a transmit and receive circuit, a memory, an amplifier of an audio processing circuit, or the like can be manufactured. Further, a system-on-chip capable of high-speed driving with high reliability and low power consumption can be provided, where circuits constituting one system (functional circuit) such as an MPU (micro processor unit), a memory, and an I/O interface are mounted to be monolithic.

EXAMPLE 12

Figure 12:
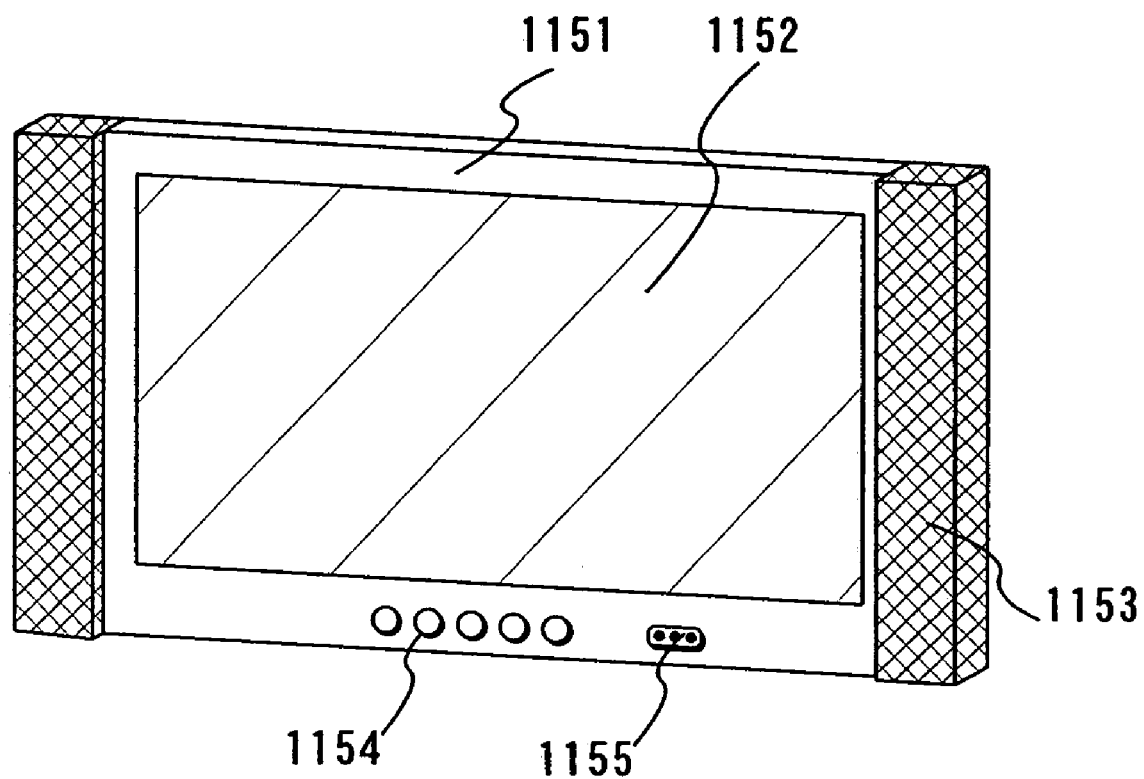
FIG. 12 is an explanatory diagram of an example of an electronic device.
Figure 13A:
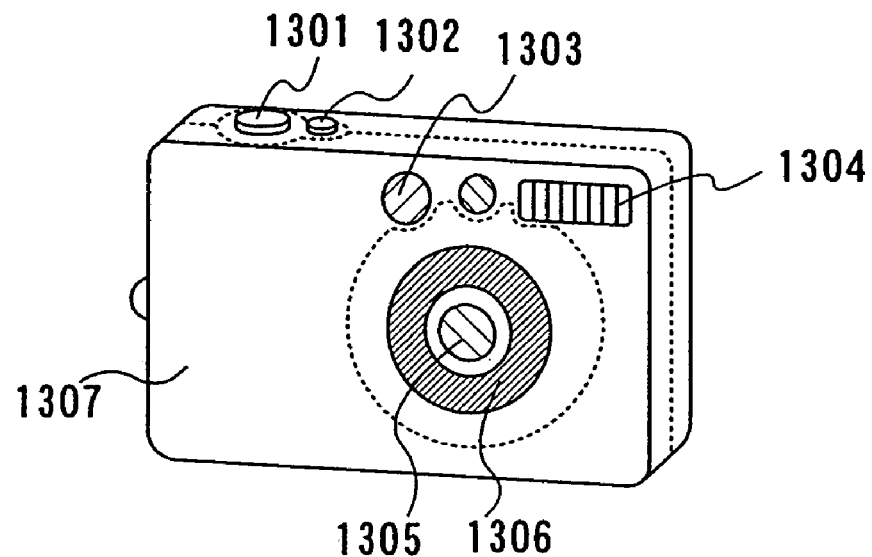
FIGS. 13A and 13B are explanatory diagrams of an example of an electronic device.
Figure 13B:
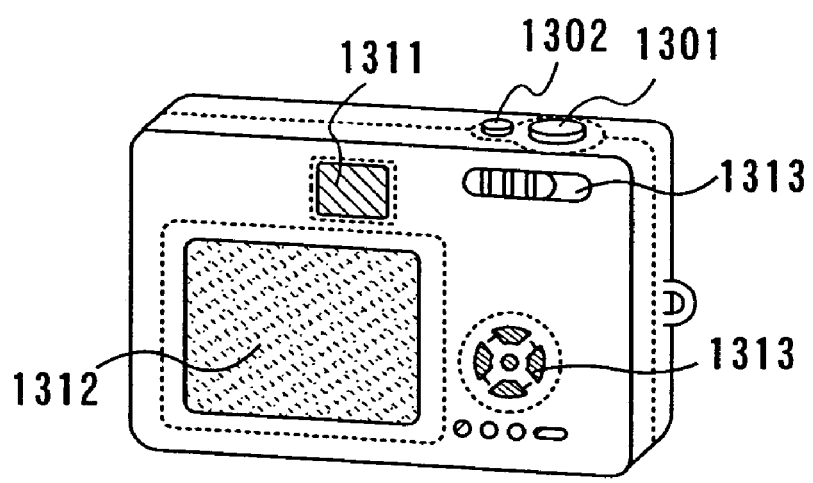

Various electronic devices can be manufactured by incorporating the semiconductor device described in the above examples into housing. Examples of electronic devices can be given as follows: a television set, a camera such as a video camera or a digital camera, a goggle type display (head mount display), a navigation system, an audio reproducing device (a car audio, an audio component, or the like), a personal computer, a game machine, a personal digital assistant (a mobile computer, a cellular phone, a portable game machine, an electronic book, or the like), an image reproducing device including a recording medium (specifically, a device capable of processing data in a recording medium such as a Digital Versatile Disc (DVD) and having a display that can display the image of the data), or the like. As typical examples of the electronic devices, FIG. 11 and FIG. 12 illustrate the television set and a block diagram thereof, respectively; and FIGS. 13A and 13B illustrate a digital camera.

Figure 11:
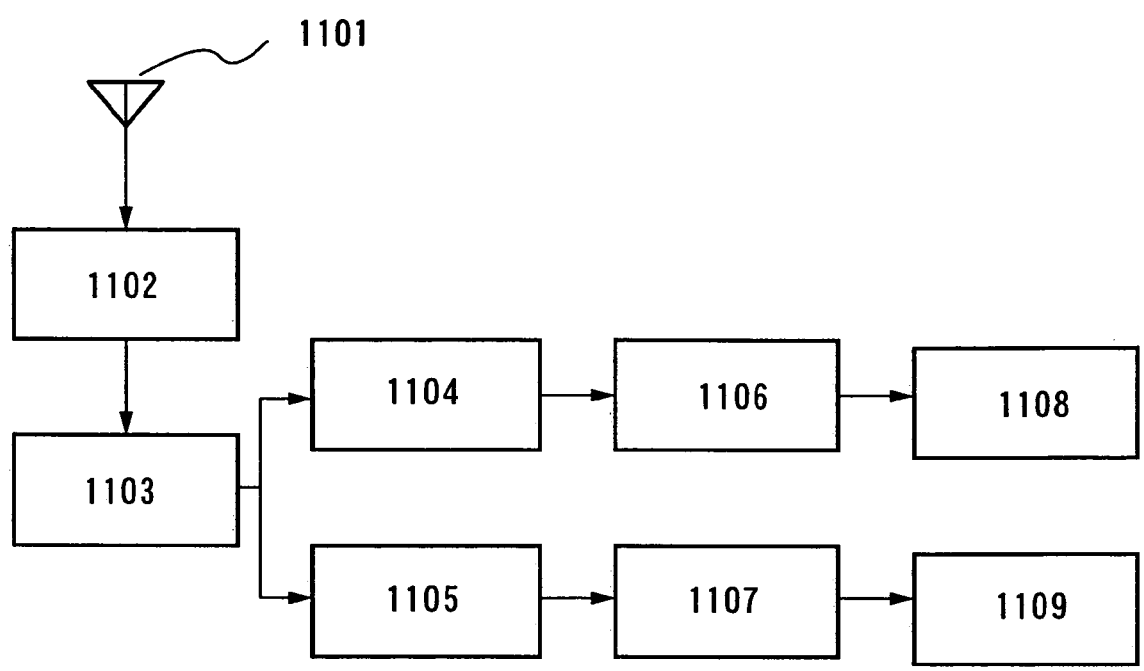
FIG. 11 is an explanatory block diagram for showing a structure of an electronic device.

FIG. 11 is a diagram showing a general structure of a television set that receives analog television broadcasting. In FIG. 11, the airwaves for television broadcasting received by an antenna 1101 are inputted into a tuner 1102. The tuner 1102 generates and outputs intermediate frequency (IF) signals by mixing the high frequency television signals inputted from the antenna 1101 with locally-oscillating frequency signals that are controlled in accordance with the desired reception frequency.

The IF signals taken out by the tuner 1102 are amplified to the required voltage by an intermediate frequency amplifier (IF amplifier) 1103. Thereafter, the amplified IF signals are detected by an image detection circuit 1104 and an audio detection circuit 1105. The image signals outputted from the image detection circuit 1104 are divided into luminance signals and chrominance signals by an image processing circuit 1106. Further, the luminance signals and the chrominance signals are subjected to the predetermined image signal processing to be image signals, so that the image signals are outputted to an image output portion 1108 of a display device that is a semiconductor device of the present invention, typically, a liquid crystal display device, a light-emitting display device, a DMD (Digital Micromirror Device), a PDP (Plasma Display Panel), an FED (Field Emission Display), an electrophoretic display device (an electronic paper) or the like. Note that a liquid crystal television uses the liquid crystal display device for the display device, and an EL television uses the light-emitting display device for the display device. The same is true in using another display device.

The signals outputted from the audio detection circuit 1105 are subjected to processing such as FM demodulation in an audio processing circuit 1107 to be audio signals. The audio signals are then amplified appropriately to be outputted to an audio output portion 1109 such as a speaker or the like.

The television set according to the invention may be a television that is compatible with not only analog broadcastings such as terrestrial broadcasting in a VHF band or a UHF band, cable broadcasting, and BS broadcasting, but also digital broadcastings such as terrestrial digital broadcasting, cable digital broadcasting, and BS digital broadcasting.

FIG. 12 is a front perspective view of the television set, which includes a housing 1151, a display portion 1152, a speaker portion 1153, an operational portion 1154, a video input terminal 1155, and the like. The television set has a structure illustrated in FIG. 11.

The display portion 1152 is an example of the image output portion 1108 illustrated in FIG. 11. The display portion displays images thereon.

The speaker portion 1153 is an example of the audio output portion illustrated in FIG. 11. The speaker portion outputs audio therefrom.

The operational portion 1154 is provided with a power source switch, a volume switch, a channel select switch, a tuning switch, a selection switch, and the like to turn ON and/or OFF the television set, select images, control sound, select a tuner and the like, respectively by holding the switches down. Note that the selections mentioned above can be performed also by a remote-control operation unit, though not shown in the drawing.

The video input terminal 1155 inputs image signals into the television set from an external device such as a VTR, a DVD or a game machine.

In the case of a wall-mounted television set, a portion for hanging on walls is provided on the rear of the television set described in this embodiment.

A television set with high contrast and high-definition can be manufactured at low cost with high throughput and high manufacturing yields by applying the display device that is an example of a semiconductor device according to the invention to the display portion of the television set. In addition, a television set can be manufactured at low cost with high throughput and yield by applying a semiconductor device according to the invention to a CPU for controlling an image detection circuit, an image processing circuit, an audio detection circuit, and an audio processing circuit of a television set. Consequently, such the television can be used for various purposes particularly as a large area display medium such as wall-mounted television set; information display boards in railway stations, airports, or the like; or advertisement display boards on the streets.

FIGS. 13A and 13B show an example of a digital camera. FIG. 13A is a front perspective view of the digital camera, and FIG. 13B is a rear perspective view thereof. In FIG. 13A, a digital camera is provided with a release button 1301, a main switch 1302, a viewfinder window 1303, a flash 1304, a lens 1305, a camera cone 1306, and a housing 1307.

In FIG. 13B, the digital camera is provided with a viewfinder eyepiece 1311, a monitor 1312, and an operational button 1313.

When holding down half the release button 1301, a focus adjustment mechanism and an exposure adjustment mechanism are operated. When holding down the release button completely, a shutter is released.

The digital camera is turned ON and/or OFF by holding down or rotating the main switch 1302.

The viewfinder window 1303 is disposed above the lens 1305 on the front face of the digital camera, and is used to check a shooting range and a focusing point through the viewfinder eyepiece 1311 that is illustrated in FIG. 13B.

The flash 1304 is disposed at the upper portion of the front face of the digital camera body. When an object of shooting has low luminance, the release button is held down and auxiliary light is emitted simultaneously with releasing the shutter.

The lens 1305 is disposed on the front of the digital camera. The lens is composed of a focusing lens, a zoom lens, and the like. Together with a shutter and an aperture, each of which is not shown, the lens constitutes an optical shooting system. An image sensing device such as a CCD (charge coupled device) is located in the region posterior to the lens.

The camera cone 1306 is used to moving the position of the lens in order to bring the focusing lens, the zoom lens, or the like into focus. When taking a picture, the lens 1305 is moved forward by sending out the camera cone forward. When carrying the camera, the lens 1305 is stored inside the main body to be reduced in size. The camera according to this example can take a picture in zooming by sending out the camera cone to the fore. However, it is not limited to this structure. The camera may be a digital camera that can take a picture in zooming without sending out the camera cone to the fore owing to an optical shooting system inside the casing 1307.

The viewfinder eyepiece 1311 is provided at the upper portion of the rear of the digital camera whereby the shooting range and the focusing point are checked by sight.

The operational button 1313 is provided on the rear of the digital camera and composed of various kinds of operational functions such as a setup button, a menu button, a display button, a functional button, and a selection button.

A digital camera with high contrast and high-definition can be manufactured at low cost with high throughput and high manufacturing yields by applying the display device that is an example of a semiconductor device according to the invention to a monitor A digital camera can be manufactured at low cost with high throughput and high manufacturing yields by applying the semiconductor device according to the invention to a CPU for processing in response to input operation of various functional buttons, a main switch, a release button and the like, a CPU for controlling various circuits such as a circuit for auto-focusing and auto-focusing adjustment, a timing control circuit for controlling electric flash drive and CCD drive, an imaging circuit for generating an image signal from a signal that is photo-electrically converted by an imaging device such as a CCD, an A/D converter circuit for converting an image signal generated in an imaging circuit into a digital signal or a memory interface for writing and reading image data in a memory.

Although the present invention has been fully described by way of examples with reference to the accompanying drawings, it is to be understood that various changes and modifications will be apparent to those skilled in the art. Therefore, unless otherwise such changes and modifications depart from the scope of the present invention hereinafter described, they should be construed as being included therein.

The present application is based on Japanese Priority Application No. 2004-091223 filed on Mar. 26, 2004 with the Japanese Patent Office, the entire contents of which are hereby incorporated by reference.

What is claimed is:

1. A method for manufacturing a semiconductor device comprising the steps of:
    forming at least two first conductive layers over a substrate;
    forming a first insulating layer to fill the gaps of the first conductive layers;
    forming a second insulating layer over the first insulating layer and in contact with the first conductive layers; and
    forming a semiconductor region over the second insulating layer and
    forming a second conductive layer over the semiconductor region.

2. The method for manufacturing a semiconductor device according to claim 1, wherein the first conductive layers serve as gate electrodes, the second insulating layer serves as a gate insulating film, and the second conductive layer serves as a source electrode and a drain electrode.

3. The method for manufacturing a semiconductor device according to claim 1, wherein the first conductive layers serve as a source electrode and a drain electrode, the second insulating layer serves as a gate insulating film, and the second conductive layer serves as a gate electrode.

4. A method for manufacturing a semiconductor device comprising the steps of:
    forming at least two first conductive layers over a substrate;
    forming a first insulating layer to cover a side of the first conductive layers;
    forming a second insulating layer over the first insulating layer and in contact with the first conductive layers; and
    forming a semiconductor region over the second insulating layer and
    forming a second conductive layer over the semiconductor region.

5. The method for manufacturing a semiconductor device according to claim 4, wherein the first conductive layers serve as gate electrodes, the second insulating layer serves as a gate insulating film, and the second conductive layer serves as a source electrode and a drain electrode.

6. The method for manufacturing a semiconductor device according to claim 4, wherein the first conductive layers serve as a source electrode and a drain electrode, the second insulating layer serves as a gate insulating film, and the second conductive layer serves as a gate electrode.

7. A method for manufacturing a semiconductor device comprising the steps of:
    forming at least two first conductive layers over a substrate;
    forming a first insulating layer by discharging an insulating material between the first conductive layers;
    forming a second insulating layer over the first insulating layer and in contact with the first conductive layers; and
    forming a semiconductor region over the second insulating layer and
    forming a second conductive layer over the semiconductor region.

8. The method for manufacturing a semiconductor device according to claim 7, wherein the first conductive layers serve as gate electrodes, the second insulating layer serves as a gate insulating film, and the second conductive layer serves as a source electrode and a drain electrode.

9. The method for manufacturing a semiconductor device according to claim 7, wherein the first conductive layers serve as a source electrode and a drain electrode, the second insulating layer serves as a gate insulating film, and the second conductive layer serves as a gate electrode.

10. A method for manufacturing a semiconductor device comprising the steps of:
    forming at least two first conductive layers over a substrate;
    forming a first insulating layer between the first conductive layers;
    forming a second insulating layer over the first insulating layer and the first conductive layers; and
    forming a semiconductor region over the second insulating layer and
    forming a second conductive layer over the semiconductor region,
    wherein the first insulating layer does not cross any of the two first conductive layers.

11. The method for manufacturing a semiconductor device according to claim 10, wherein the first conductive layers serve as gate electrodes, the second insulating layer serves as a gate insulating film, and the second conductive layer serves as a source electrode and a drain electrode.

12. The method for manufacturing a semiconductor device according to claim 10, wherein the first conductive layers serve as a source electrode and a drain electrode, the second insulating layer serves as a gate insulating film, and the second conductive layer serves as a gate electrode.

* * * * *